(12) United States Patent
Wang et al.

(10) Patent No.: US 12,119,404 B2
(45) Date of Patent: Oct. 15, 2024

(54) GATE ALL AROUND STRUCTURE WITH ADDITIONAL SILICON LAYER AND METHOD FOR FORMING THE SAME

(71) Applicant: Taiwan Semiconductor Manufacturing Company, Ltd., Hsinchu (TW)

(72) Inventors: Chen-Han Wang, Zhubei (TW); Pei-Hsun Wang, Kaohsiung (TW); Chun-Hsiung Lin, Zhubei (TW); Chih-Hao Wang, Baoshan Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/344,057

(22) Filed: Jun. 29, 2023

(65) Prior Publication Data

US 2023/0343873 A1 Oct. 26, 2023

Related U.S. Application Data

(63) Continuation of application No. 17/814,881, filed on Jul. 26, 2022, now Pat. No. 11,735,666, which is a (Continued)

(51) Int. Cl.
*H01L 29/78* (2006.01)
*H01L 21/02* (2006.01)
(Continued)

(52) U.S. Cl.
CPC ...... *H01L 29/785* (2013.01); *H01L 21/02532* (2013.01); *H01L 21/02554* (2013.01);
(Continued)

(58) Field of Classification Search
CPC ............. H01L 29/785; H01L 21/02532; H01L 21/02554; H01L 21/02603; H01L 29/0669;
(Continued)

(56) References Cited

U.S. PATENT DOCUMENTS 9,209,247 B2 12/2015 Colinge et al.
9,236,267 B2 1/2016 De et al.
(Continued)

*Primary Examiner* — John P. Dulka
(74) *Attorney, Agent, or Firm* — McClure, Qualey & Rodack, LLP

(57) ABSTRACT

Methods for manufacturing a semiconductor structure are provided. The method includes alternately stacking first semiconductor material layers and second semiconductor layers over a substrate and patterning the first semiconductor material layers and the second semiconductor layers to form a first fin structure and a second fin structure. The method also includes forming an insulating layer around the first fin structure and the second fin structure and forming a dielectric fin structure over the insulating layer and spaced apart from the first fin structure and the second fin structure. The method also includes forming a first source/drain structure attached to the first fin structure and forming a semiconductor layer covering the first source/drain structure. The method also includes oxidizing the semiconductor layer to form an oxide layer and forming a second source/drain structure attached to the second fin structure after the oxide layer is formed.

20 Claims, 56 Drawing Sheets

Related U.S. Application Data continuation of application No. 16/571,817, filed on Sep. 16, 2019, now Pat. No. 11,430,891.

(51) Int. Cl.
*H01L 29/06* (2006.01)
*H01L 29/08* (2006.01)
*H01L 29/66* (2006.01)

(52) U.S. Cl.
CPC .... *H01L 21/02603* (2013.01); *H01L 29/0669* (2013.01); *H01L 29/0847* (2013.01); *H01L 29/66795* (2013.01)

(58) Field of Classification Search
CPC ........... H01L 29/0847; H01L 29/66795; H01L 21/823425; H01L 21/823418; H01L 21/823814; H01L 27/088; H01L 27/092; H01L 29/0673; H01L 29/1079; H01L 29/42392; H01L 29/66439; H01L 29/66553; H01L 29/775; H01L 29/78696; H01L 29/165; H01L 29/6656; H01L 29/7848; H01L 29/66545; B82Y 10/00
See application file for complete search history.

(56) References Cited

U.S. PATENT DOCUMENTS

| | | | |
|---|---|---|---|
| 9,257,428 B2 | 2/2016 | Ching et al. | |
| 9,257,450 B2 | 2/2016 | Loubet et al. | |
| 9,318,552 B2 | 4/2016 | Xie et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,570,551 B1 | 2/2017 | Balakrishnan et al. | |
| 9,576,814 B2 | 2/2017 | Wu et al. | |
| 9,608,116 B2 | 3/2017 | Ching et al. | |
| 10,586,738 B2 | 3/2020 | Wang et al. | |
| 10,978,356 B2 | 4/2021 | Lee et al. | |
| 2014/0151639 A1* | 6/2014 | Chang | H01L 29/0673 257/27 |
| 2017/0154958 A1 | 6/2017 | Fung et al. | |
| 2018/0294331 A1 | 10/2018 | Cho et al. | |
| 2019/0074362 A1* | 3/2019 | Lee | H01L 29/775 |
| 2020/0105535 A1 | 4/2020 | Lin et al. | |

* cited by examiner

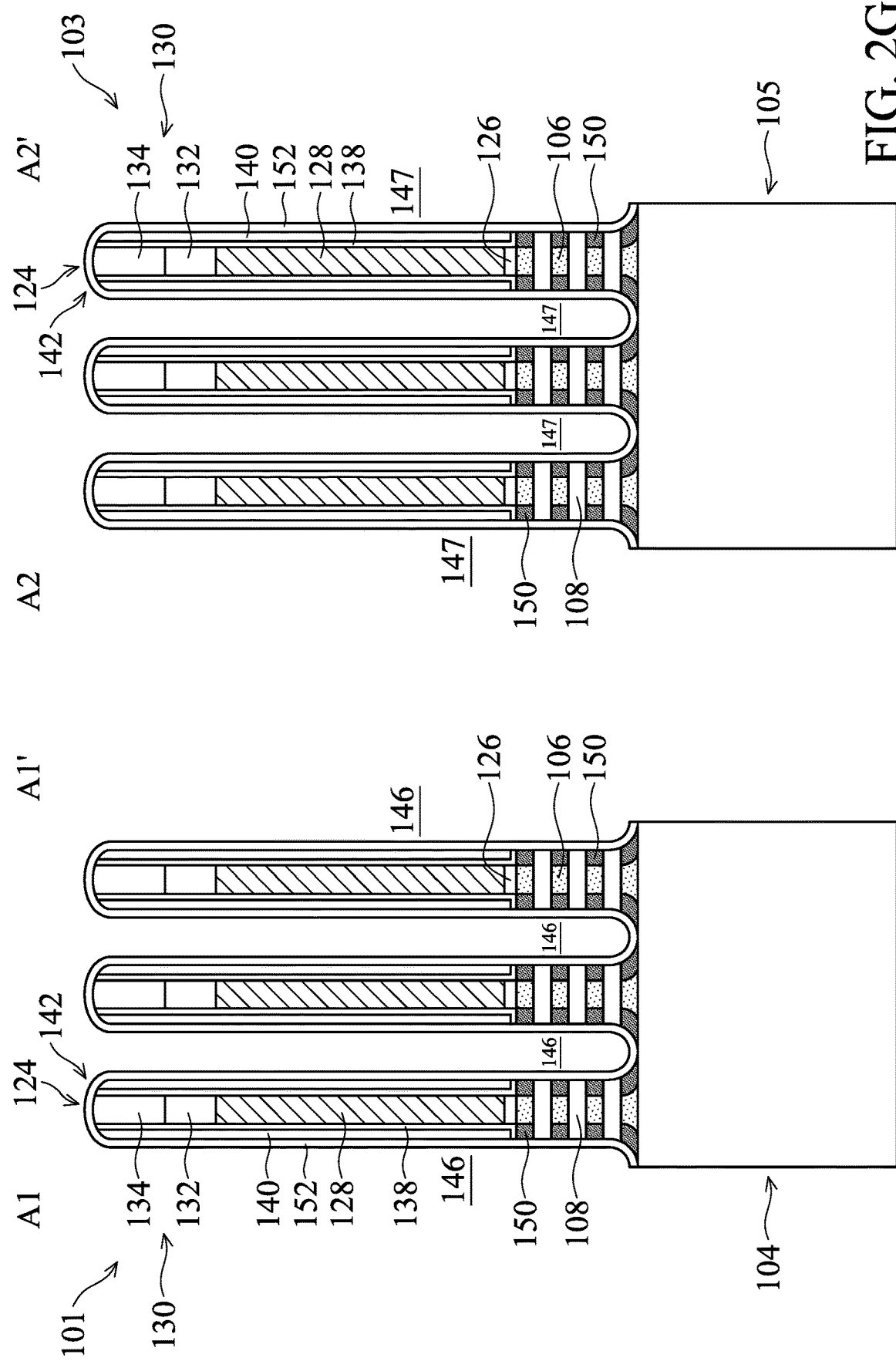

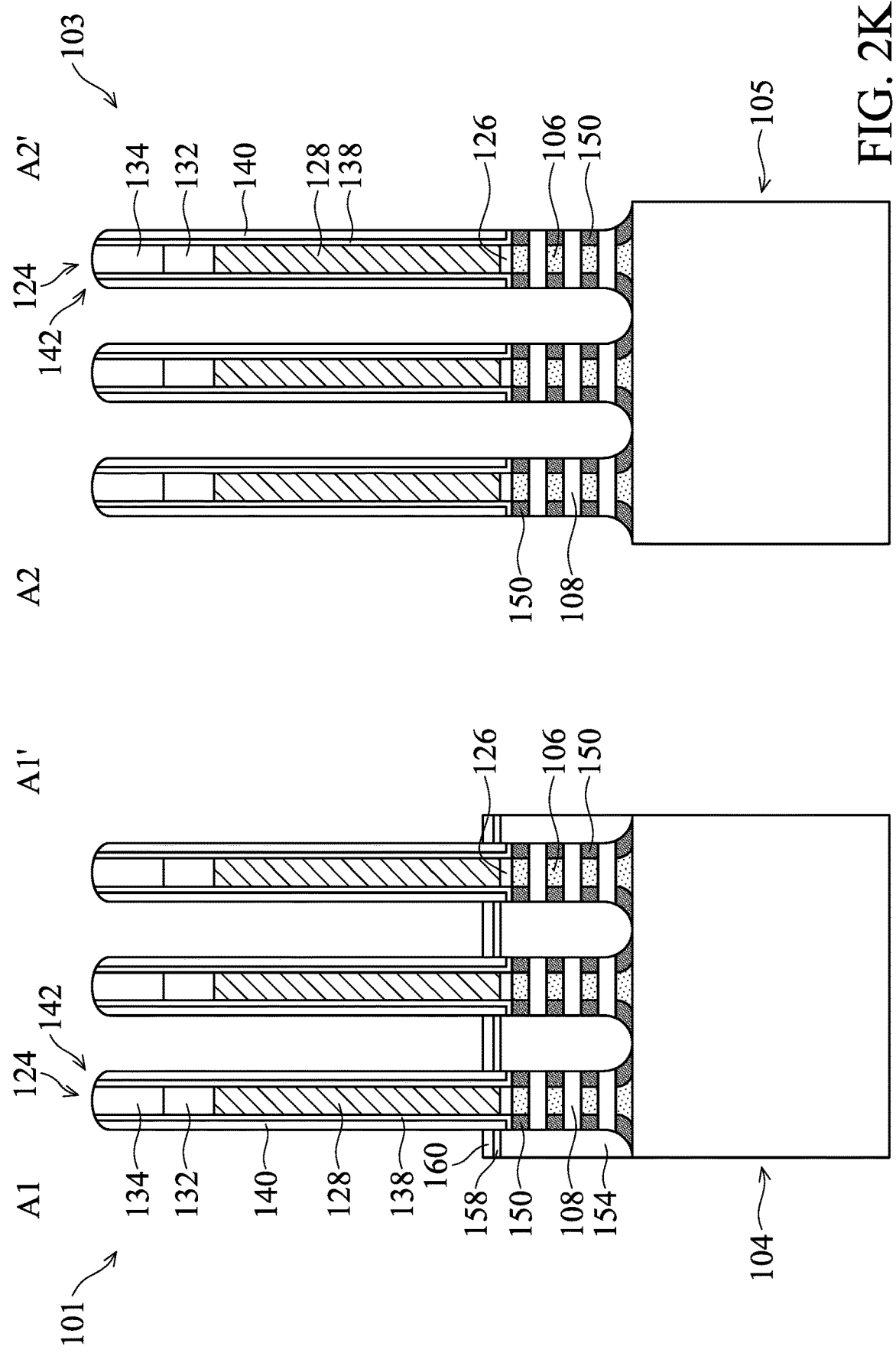

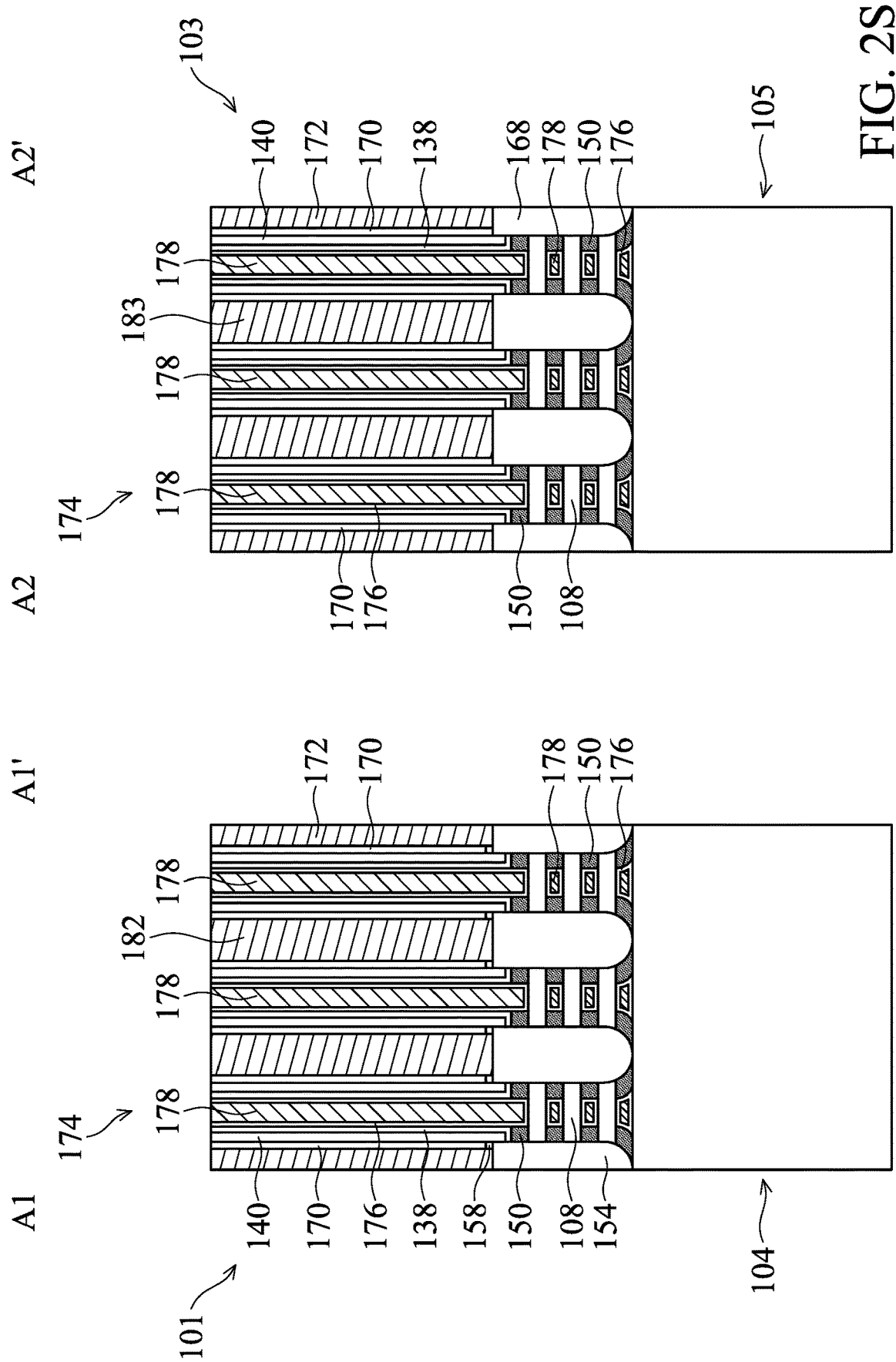

GATE ALL AROUND STRUCTURE WITH ADDITIONAL SILICON LAYER AND METHOD FOR FORMING THE SAME

PRIORITY CLAIM AND CROSS-REFERENCE

This application is a Continuation Application of U.S. patent application Ser. No. 17/814,881, filed on Jul. 26, 2022, which is a Continuation application of U.S. patent application Ser. No. 16/571,817, filed on Sep. 16, 2019 (now U.S. Pat. No. 11,430,891), the entirety of which is incorporated by reference herein.

BACKGROUND

The electronics industry is experiencing an ever-increasing demand for smaller and faster electronic devices which are able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes and their structure allows them to be aggressively scaled-down while maintaining gate control and mitigating SCEs. However, integration of fabrication of the GAA features can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
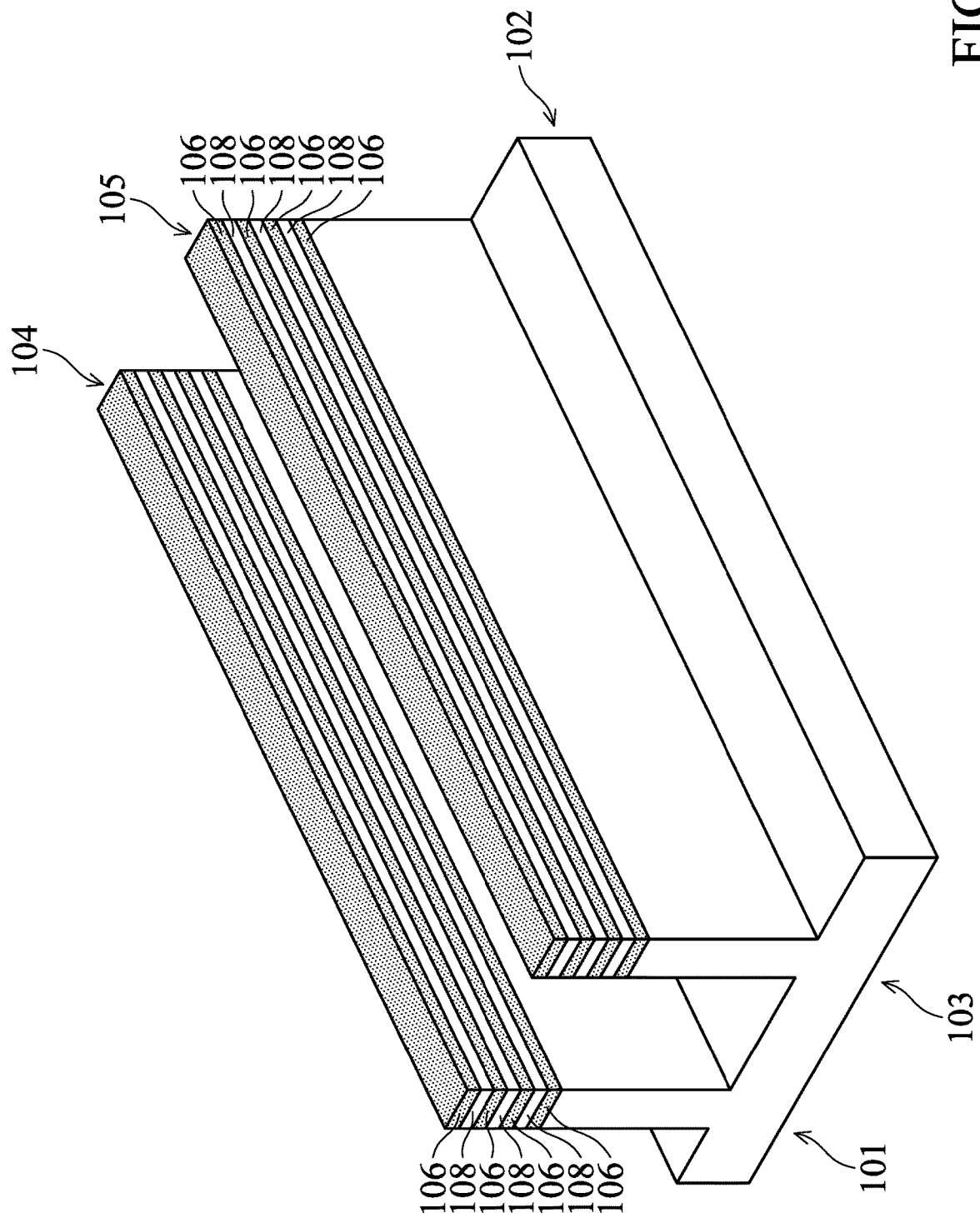
FIGS. 1A to 1C illustrate perspective views of intermediate stages of manufacturing a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments for manufacturing semiconductor structures are provided. The semiconductor structure may include a first region and a second region in a substrate. First nanowire structures may be formed in the first region and second nanowire structures may be formed in the second region, and a gate structure may be formed around the first nanowire structures and the second nanowire structures. During the formation of the semiconductor structure, a mask layer may be used to cover the second region and expose the first region, so that a first source/drain structure may be formed in the first region. After the first source/drain structure is formed, a Si layer and a SiGe layer may be grown over the first source/drain structure, and the SiGe layer may be oxidized to form an oxide layer, which may be used as a mask layer for forming a second source/drain structure in the second region in subsequent processes. Since the oxide layer is formed by oxidizing the SiGe layer, no complicated alignment process is required. Therefore, the manufacturing processes may be simplified and the risk of miss-alignment may be reduced.

Figure 1B:
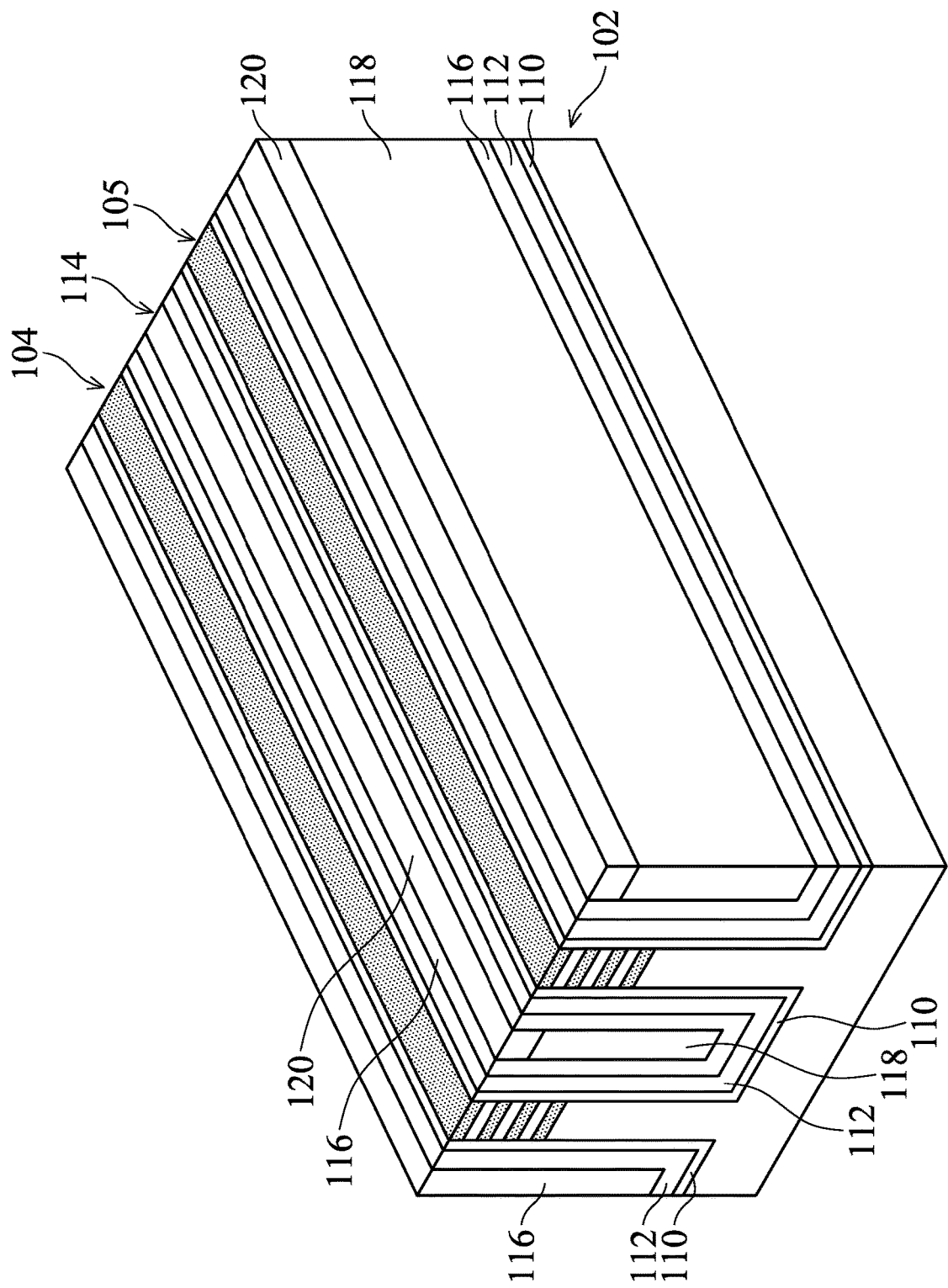
Figure 1C:
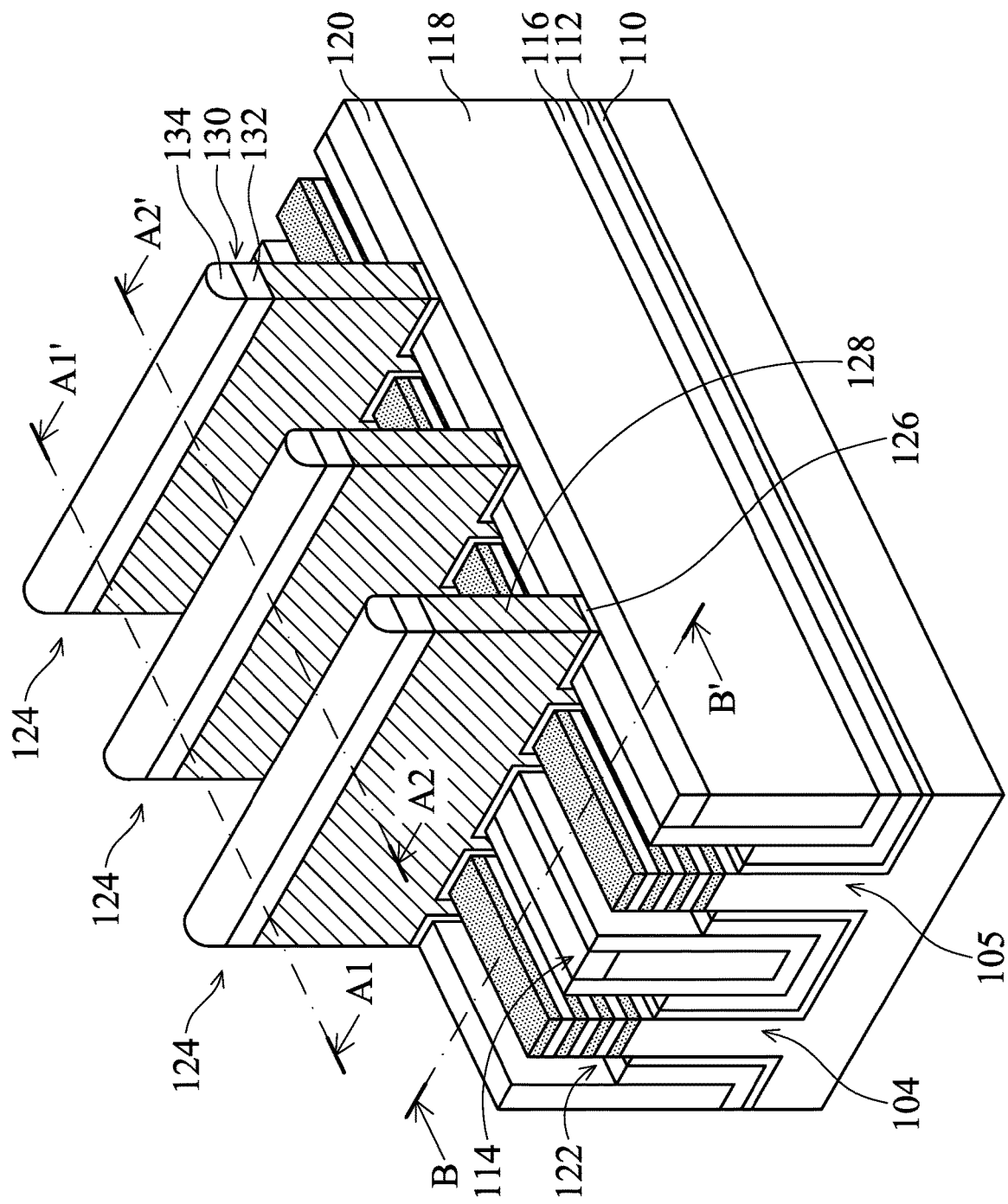

FIGS. 1A to 1C illustrate perspective views of intermediate stages of manufacturing a semiconductor structure 100 in accordance with some embodiments. As show in FIG. 1A, a first fin structure 104 and a second fin structure 105 are formed over of a substrate 102 in accordance with some embodiments. More specifically, the first fin structure 104 is formed over a first region 101 of the substrate, and the second fin structure 105 is formed in the second region 103 of the substrate 102 in accordance with some embodiments.

The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP. In some embodiments, the fin structure 104 is made of SiGe.

In some embodiments, first semiconductor layers 106 and second semiconductor layers 108 are alternately stacked over the substrate 102. In some embodiment, the first semiconductor layers 106 and the second semiconductor layers 108 are made of different semiconductor materials. In some embodiments, the first semiconductor layers 106 are made of SiGe, and the second semiconductor layers 108 are made of silicon.

The first semiconductor layers 106 and the second semiconductor layers 108 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

After the first semiconductor layers 106 and the second semiconductor layers 108 are stacked over the substrate 102, the stacked semiconductor structure is patterned to form the first fin structure 104 and the second fin structure 105, as shown in FIG. 1A in accordance with some embodiments.

After the first fin structure 104 and the second fin structure 105 are formed, an liner layer 110 and an insulating layer 112 are conformally formed along the first fin structure 104 and the second fin structure 105, as shown in FIG. 1B in accordance with some embodiments. The liner layer 110 and the insulating layer 112 may be used as isolation structure in the semiconductor structure and they may be made of different dielectric materials.

In some embodiments, the liner layer 110 is made of silicon oxide, silicon nitride, silicon oxynitride (SiON), another suitable insulating material, or a combination thereof. In some embodiments, the insulating layer 112 is made of silicon oxide, silicon nitride, silicon oxynitride (SiON), another suitable insulating material, or a combination thereof. In some embodiments, the liner layer 110 is made of silicon nitride and the insulating layer 112 is made of silicon oxide. The liner layer 110 and the insulating layer 112 may be formed by using LPCVD, PECVD, high density plasma CVD (HDP-CVD), high aspect ratio process (HARP), flowable CVD (FCVD), ALD, another suitable method, or a combination thereof.

Dielectric fin structures 114 are formed over the insulating layer 112 and in the trenches (e.g. between the first fin structure 104 and the second fin structure 105), as shown in FIG. 1B in accordance with some embodiments. In some embodiments, the dielectric fin structure 114 includes a spacer layer 116, an isolation layer 118, and a high-k dielectric layer 120. The dielectric fin structure 114 may be formed by conformally forming the spacer layer 116 over the insulating layer 112 and the isolation layer 118 and filling the trenches between the vertical portions of the spacer layer 116 by the isolation layer 118 and the high-k dielectric layer 120. In addition, the high-k dielectric layer 120 may be formed after etching back the top portion of the isolation layer 118.

In some embodiments, the spacer layer 116 is made of oxide (e.g., silicon oxide), nitride (e.g., silicon nitride, silicon carbon nitride, silicon oxycarbon nitride, titanium nitride, or tantalum nitride), carbide (e.g., silicon oxycarbide), or other applicable materials. In some embodiments, the isolation layer 118 is made of silicon oxide, silicon nitride, silicon oxynitride (SiON), another suitable insulating material, or other applicable materials. In some embodiments, the high-k dielectric layer 120 is made of high-k dielectric material such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials.

After the liner layer 110, the insulating layer 112, and the dielectric fin structures 114 are formed, a polishing process may be performed to expose the top surface of the first fin structure 104 and the second fin structure 105, as shown in FIG. 1B in accordance with some embodiments.

Next, the liner layer 110 and the insulating layer 112 are recessed to form an isolation structure 122, as shown in FIG. 1C in accordance with some embodiments. The isolation structure 122 may be used to isolate the first fin structure 104, the second fin structure 105, and the dielectric fin structures 114. In some embodiments, the isolation structure 122 is formed by etching back the liner layer 110 and the insulating layer 112. The etch-back process may be an isotropic etching process such a dry chemical etching or wet etching, or an anisotropic etching process such as dry plasma etching.

Dummy gate structures 124 are formed across the first fin structure 104, the second fin structure 105, and the dielectric fin structures 114, as shown in FIG. 1C in accordance with some embodiments. The dummy gate structures 124 may be used to define the source/drain regions and the channel regions of the semiconductor device. As shown in FIG. 1C, the dummy gate structures 124 cover the top surfaces and the sidewalls of the first fin structure 104, the second fin structure 105, and the dielectric fin structures 114 and the top surfaces of the isolation structures 122 in accordance with some embodiments.

In some embodiments, the dummy gate structures 124 include dummy gate dielectric layers 126 and dummy gate electrode layers 128. In some embodiments, bi-layered hard mask layers 130 are formed over the dummy gate structure.

In some embodiments, the dummy gate dielectric layers 126 are made of one or more dielectric materials, such as silicon oxide, silicon nitride, silicon oxynitride (SiON), $HfO_2$, HfZrO, HfSiO, HfTiO, HfAlO, or a combination thereof. In some embodiments, the dielectric material is formed using thermal oxidation, CVD, ALD, physical vapor deposition (PVD), another suitable method, or a combination thereof.

In some embodiments, the dummy gate electrode layers 128 are made of a conductive material. In some embodiments, the conductive material includes polycrystalline-silicon (poly-Si), poly-crystalline silicon-germanium (poly-SiGe), metallic nitrides, metallic silicides, metals, or a combination thereof. In some embodiments, the conductive material is formed using CVD, PVD, or a combination thereof.

In some embodiments, the bi-layered hard mask layers 130 include an oxide layer 132 and a nitride layer 134. In some embodiments, the oxide layer 132 is silicon oxide, and the nitride layer 134 is silicon nitride.

The formation of the dummy gate structures 124 may include conformally forming a dielectric material as the dummy gate dielectric layers 126 along the substrate 102, the first fin structures 104, the second fin structure 105, the dielectric fin structures 114, and the isolation structure 122. After the dielectric material is formed, a conductive material may be formed over the dielectric material as the dummy gate electrode layers 128 and bi-layered hard mask layers 130 may be formed over the conductive material. After the bi-layered hard mask layers 130 are formed, the dielectric material and the conductive material may be patterned through the bi-layered hard mask layers 130 to form the dummy gate structure 124.

Figure 2A:
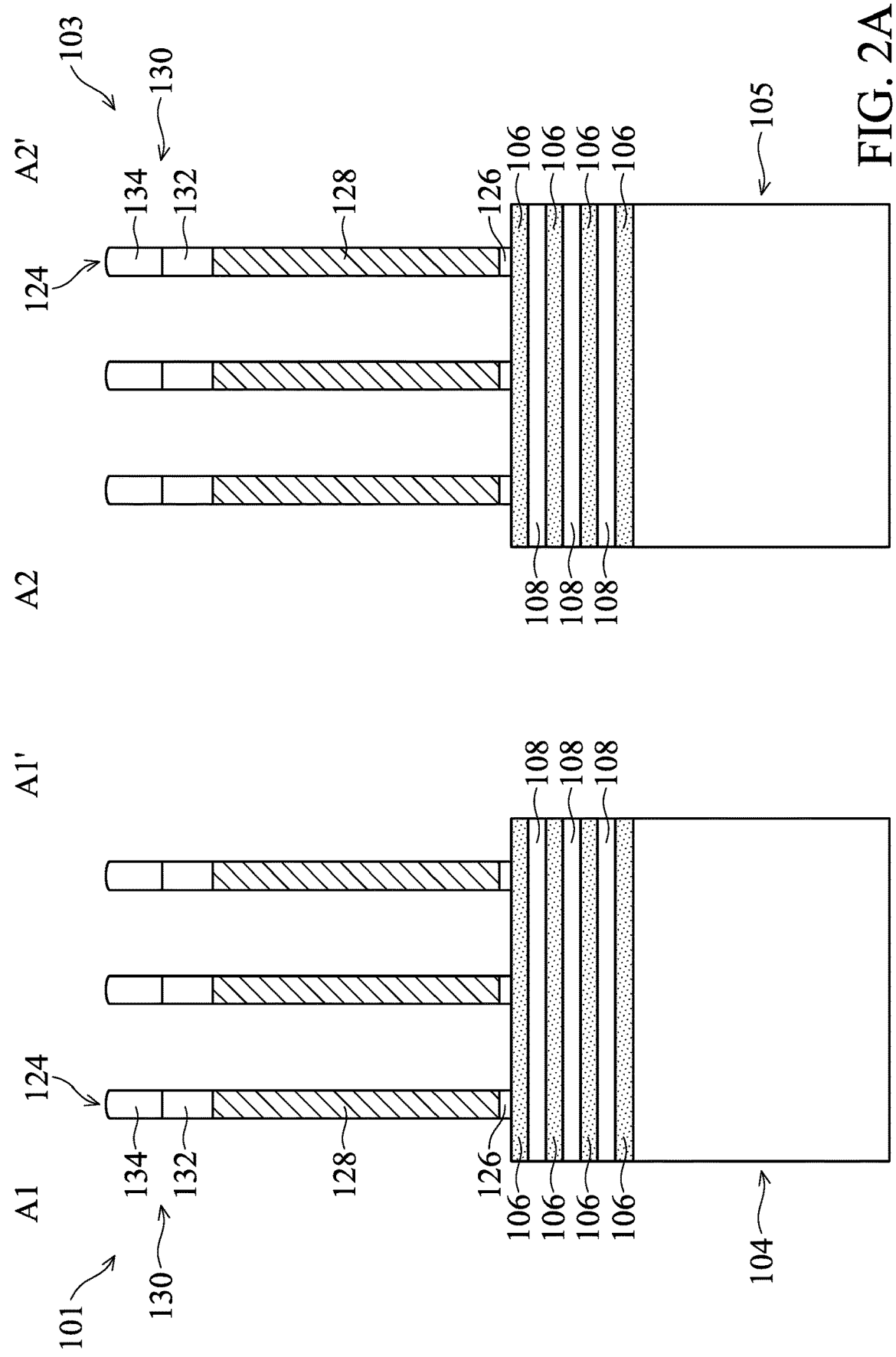
FIGS. 2A to 2S illustrate cross-sectional representations of various stages of manufacturing the semiconductor structure shown along line $A_1$-$A_1'$ in the first region and along line $A_2$-$A_2'$ in the second region in FIG. 1C in accordance with some embodiments.
Figure 3A:
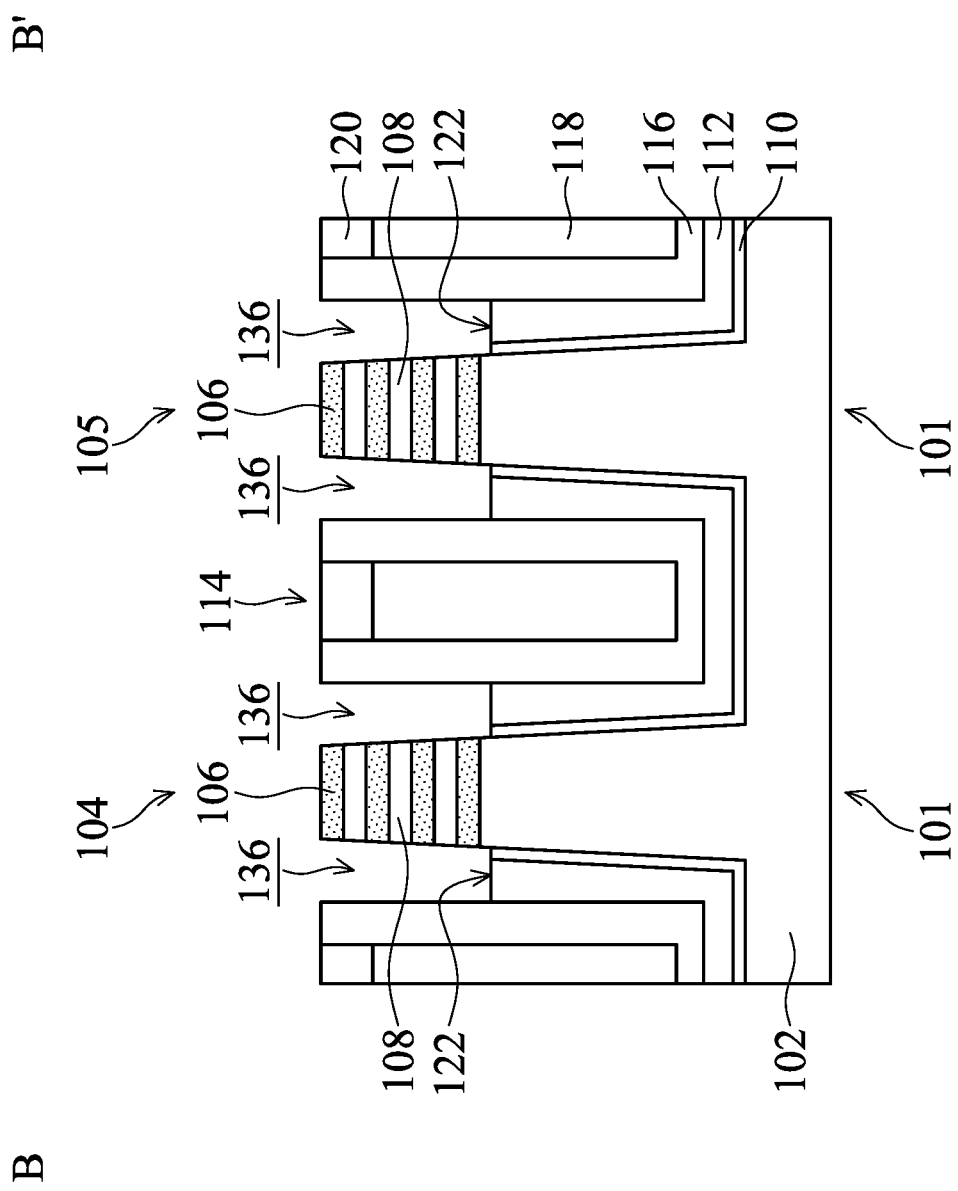
FIGS. 3A to 3S illustrate cross-sectional representations of various stages of manufacturing the semiconductor structure shown along line B-B' in FIG. 1C in accordance with some embodiments.

FIGS. 2A to 2S illustrate cross-sectional representations of various stages of manufacturing the semiconductor structure 100 shown along line $A_1$-$A_1'$ in the first region 101 and along line $A_2$-$A_2'$ in the second region 103 in FIG. 1C in accordance with some embodiments. FIGS. 3A to 3S illustrate cross-sectional representations of various stages of manufacturing the semiconductor structure 100 shown along line B-B' in FIG. 1C in accordance with some embodiments.

As shown in FIG. 2A, the dummy gate structures 124 are formed over the first fin structure 104 and the second fin structure in accordance with some embodiments. As shown in FIG. 3A, the isolation structures 122 are formed to isolate the first fin structure 104, the second fin structure 105, and the dielectric fin structure 114 in accordance with some embodiments. In addition, gaps 136 are formed over the isolation structures 122 and between the dielectric fin structure 114 and the first and second fin structure 104 and 105, as shown in FIG. 3A in accordance with some embodiments.

Figure 2B:
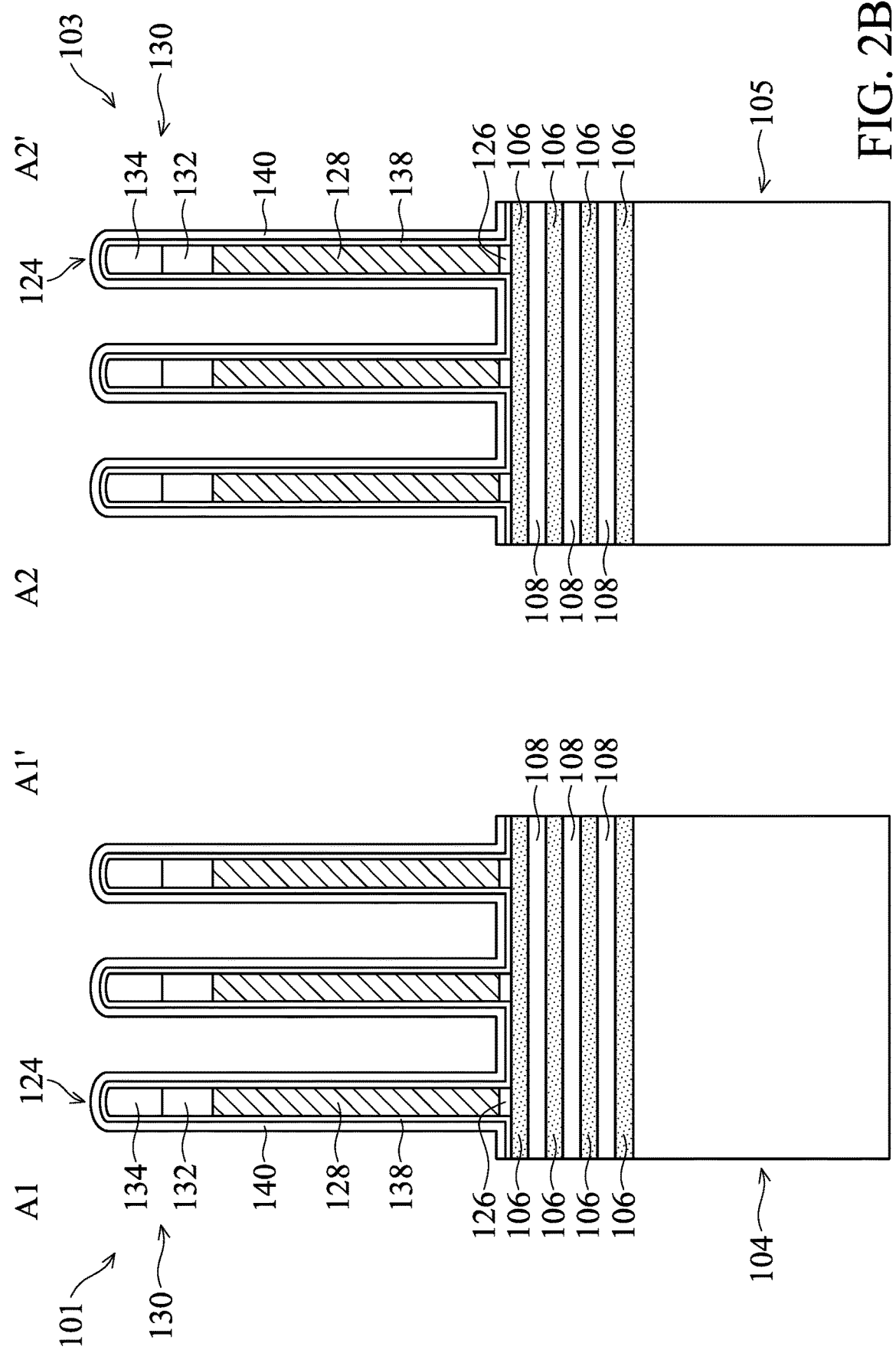
Figure 3B:
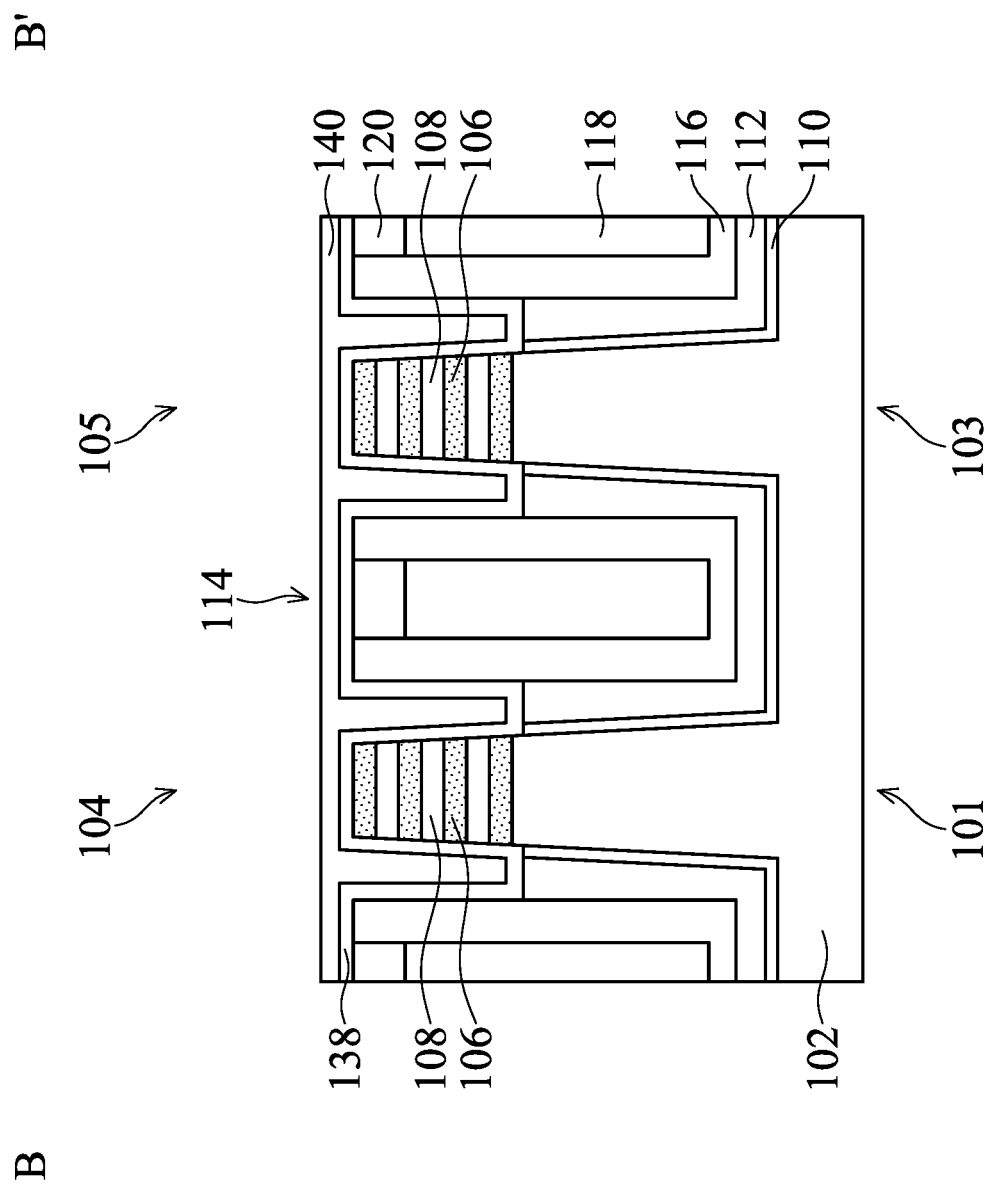

Next, a first spacer layer 138 and a second spacer layer 140 are conformally formed over the semiconductor structure shown in FIGS. 1C, 2A, and 3A, as shown in FIGS. 2B and 3B in accordance with some embodiments. In addition, the gaps 136 are filled with the first spacer layer 138 and the second spacer layer 140 in accordance with some embodiments.

In some embodiments, the first spacer layer 138 and the second spacer layer 140 are made of different low-k dielectric materials. In some embodiments, the dielectric constant of the first spacer layer 138 and the second spacer layer 140 is lower than 5. In some embodiments, the first spacer layer 138 is made of oxide (e.g., silicon oxide), nitride (e.g., silicon nitride, silicon carbon nitride, silicon oxycarbon nitride, titanium nitride, or tantalum nitride), carbide (e.g., silicon oxycarbide), or other applicable materials. In some embodiments, the second spacer layer 140 is made of oxide (e.g., silicon oxide), nitride (e.g., silicon nitride, silicon carbon nitride, silicon oxycarbon nitride, titanium nitride, or tantalum nitride), carbide (e.g., silicon oxycarbide), or other applicable materials. In some embodiments, the thickness of the sum of the first spacer layer 138 and the second spacer layer 140 is in a range from about 4 nm to about 10 nm.

Figure 2C:
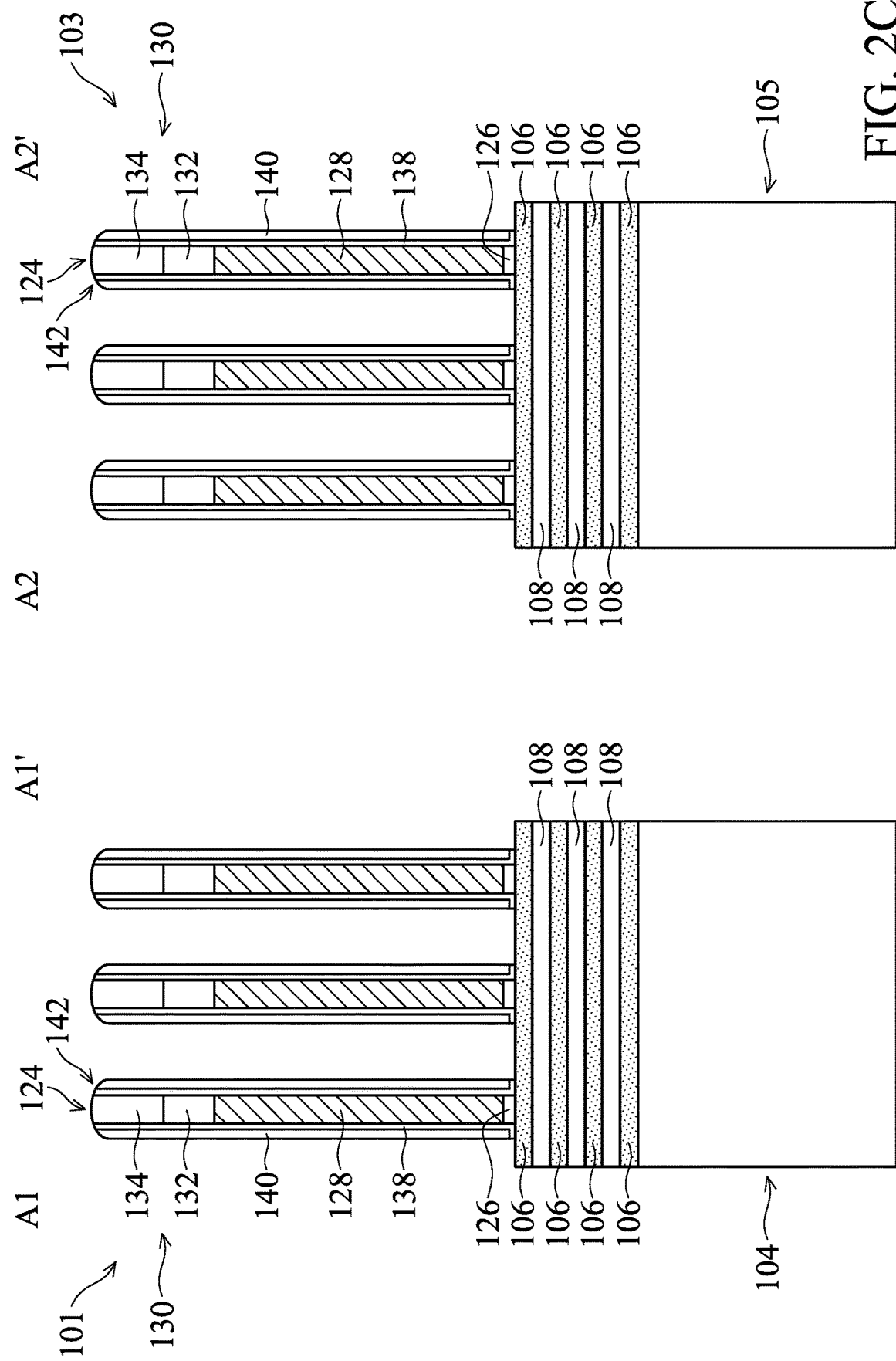
Figure 3C:
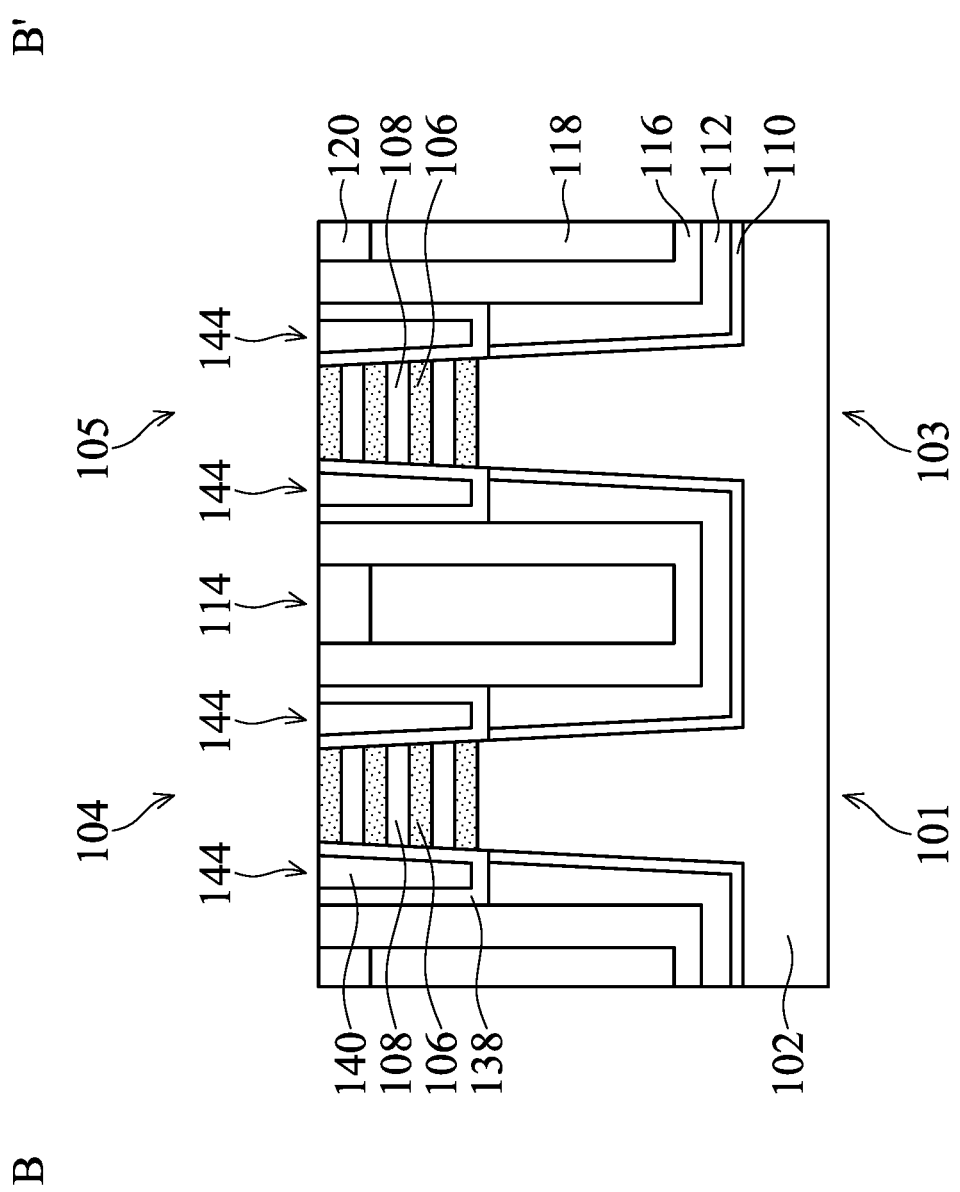

After the first spacer layer 138 and the second spacer layer 140 are formed, an etching process is performed to form the gate spacers 142 on the sidewalls of the dummy gate structures 124 and the fin spacers 144 on the sidewalls of the first fin structure 104 and the second fin structure 105, as shown in FIGS. 2C and 3C in accordance with some embodiments. It should be noted that although the gate spacers 142 and the fin spacers 144 are both formed from the first spacer layer 138 and the second spacer layer 140 in the present embodiments, they may be formed separately in some other embodiments.

Figure 2D:
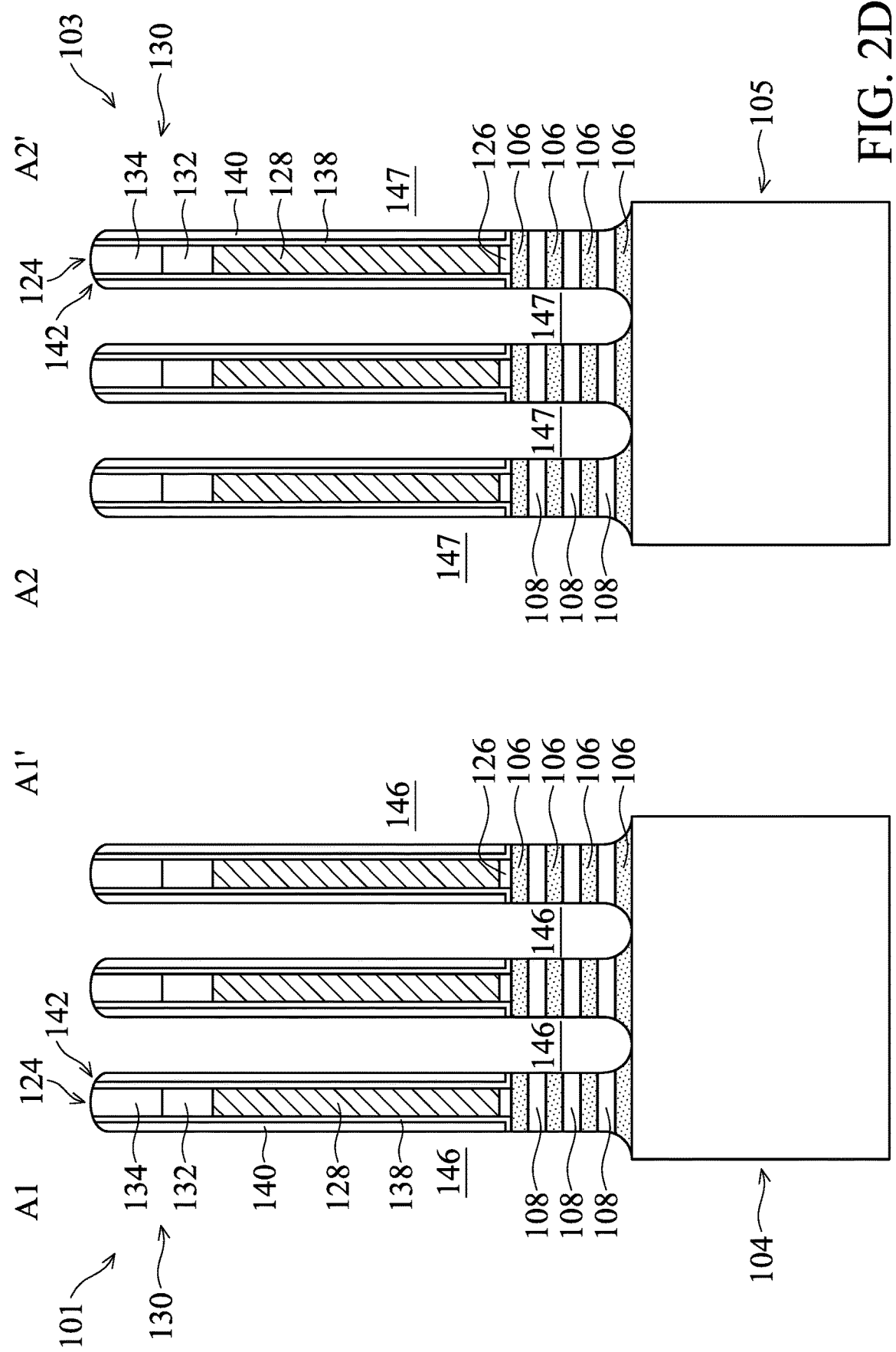
Figure 3D:
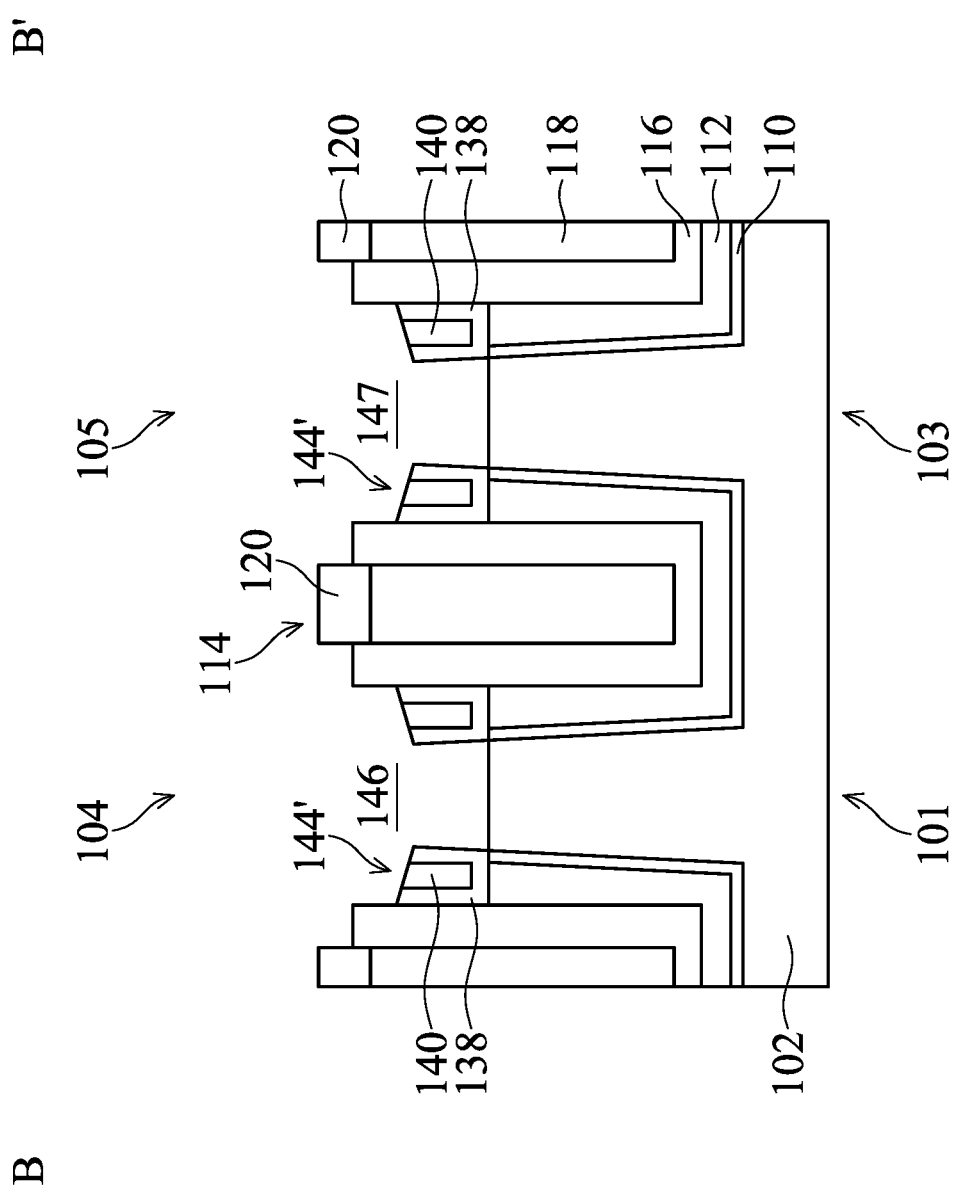

Afterwards, the first fin structure 104 and the second fin structure 105 not covered by the dummy gate structures 124 and the gate spacers 142 are recessed to form a first trench 146 over the first fin structure 104 and a second trench 147 over the second fin structure 105, as shown in FIGS. 2D and 3D in accordance with some embodiments. In some embodiments, the first fin structure 104 and the second fin structure 105 are recessed by performing an etching process. More specifically, the first semiconductor layers 106 and the second semiconductor layers 108 not covered by the dummy gate structures 124 and the gate spacers 142 are etched to form the first trench 146 and the second trench 147 in accordance with some embodiments. In some embodiments, the fin spacers 144 are also etched to form shortened fin spacers 144' and the upper portions of the spacer layer 116 are also slightly etched during the etching process such that the top surface of the high-k mask layer 120 and the spacer layer 116 are not flat, as shown in FIG. 3D in accordance with some embodiments.

Figure 2E:
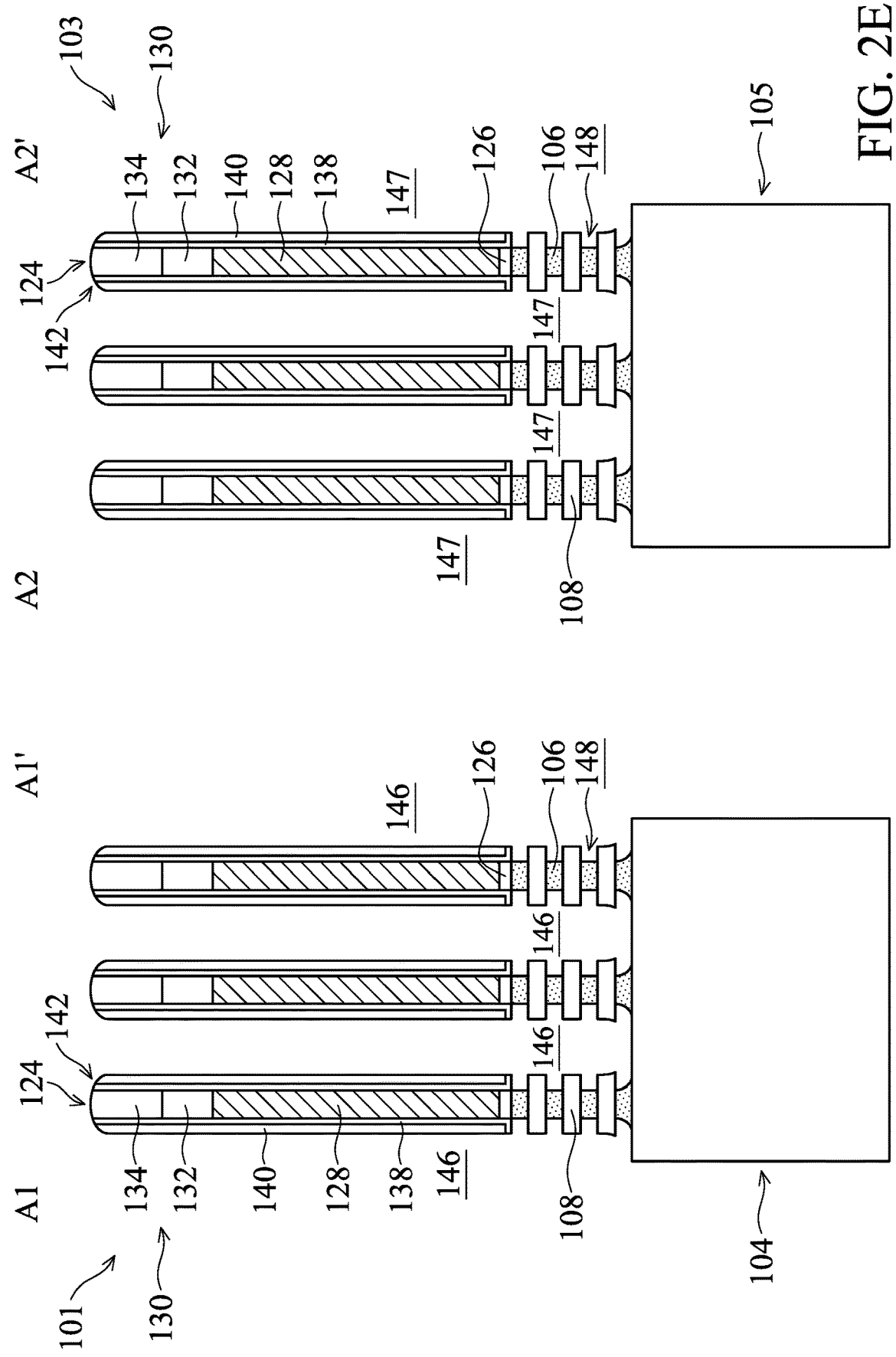
Figure 3E:
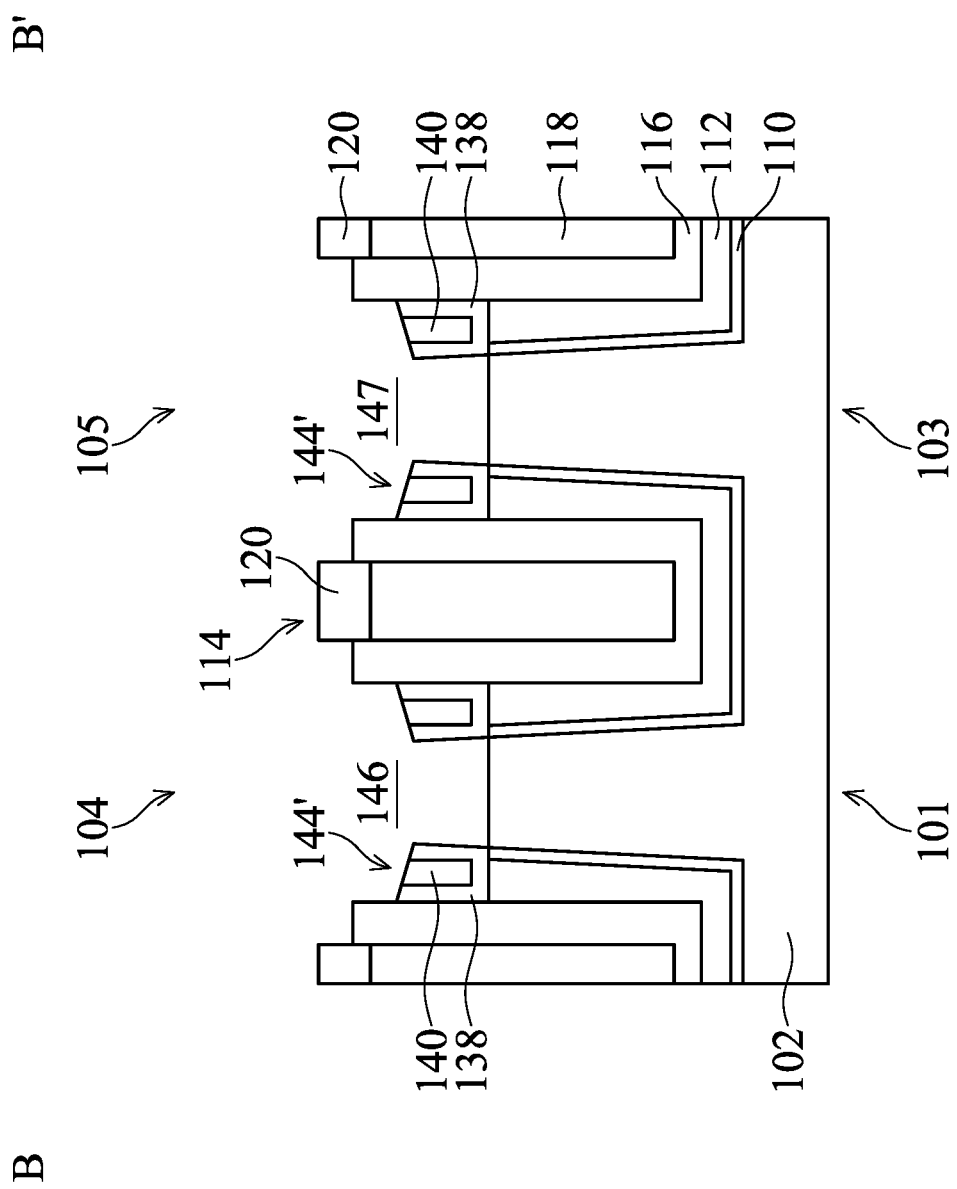

Next, the first semiconductor layers 106 are laterally etched from the trenches 146 to form cavities 148, as shown in FIGS. 2E and 3E in accordance with some embodiments. In some embodiments, the first semiconductor layers 106 are Ge or SiGe and the second semiconductor layers 108 are Si, and the first semiconductor layers 106 are selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions, or the like.

Figure 2F:
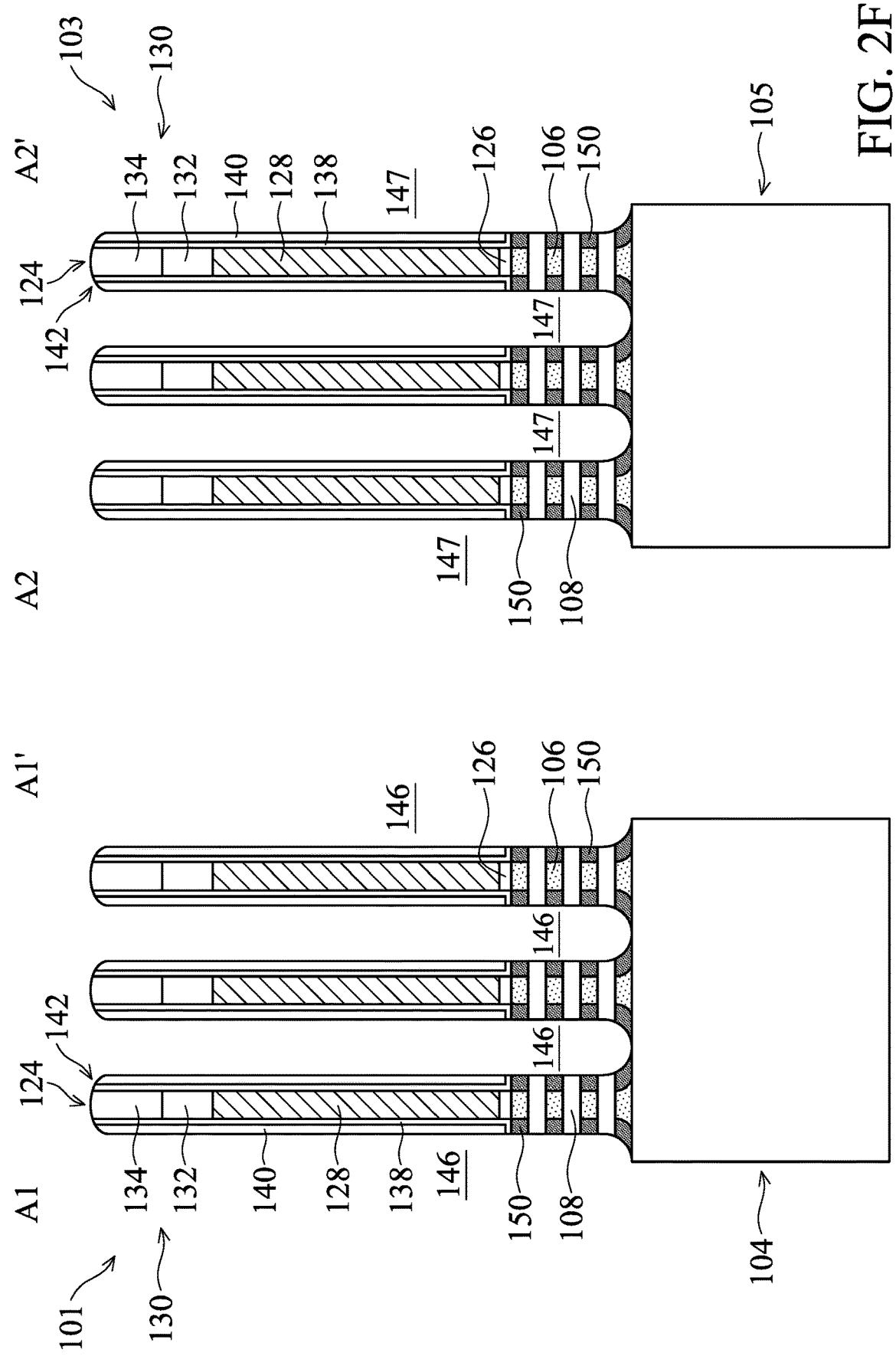
Figure 3F:
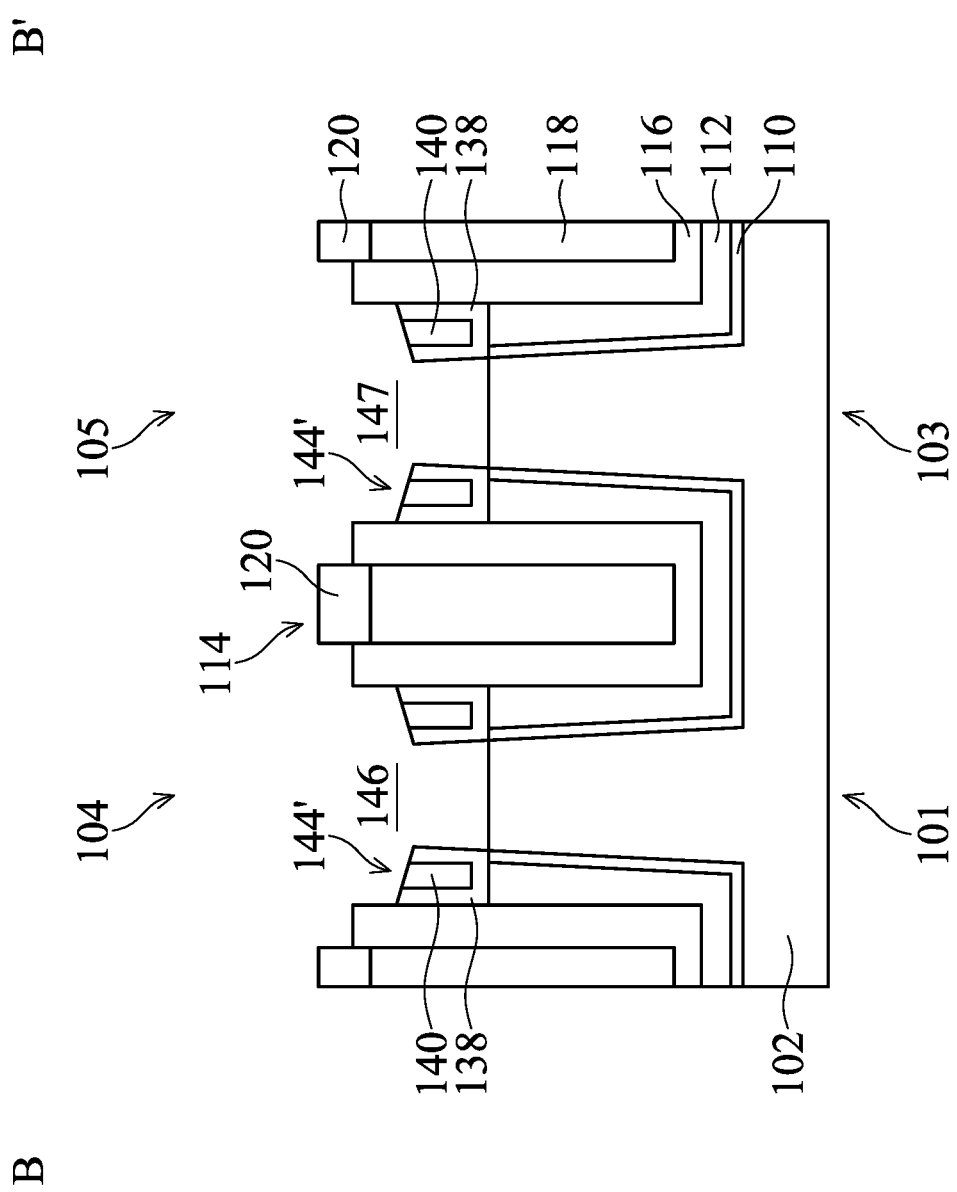

After the cavities 148 are formed, inner spacers 150 are formed in the cavities 148, as shown in FIGS. 2F and 3F in accordance with some embodiments. The inner spacers 150 may be configured to separate the source/drain structures and the gate structures formed in subsequent processes. In some embodiments, the inner spacers 150 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof.

Figure 3G:
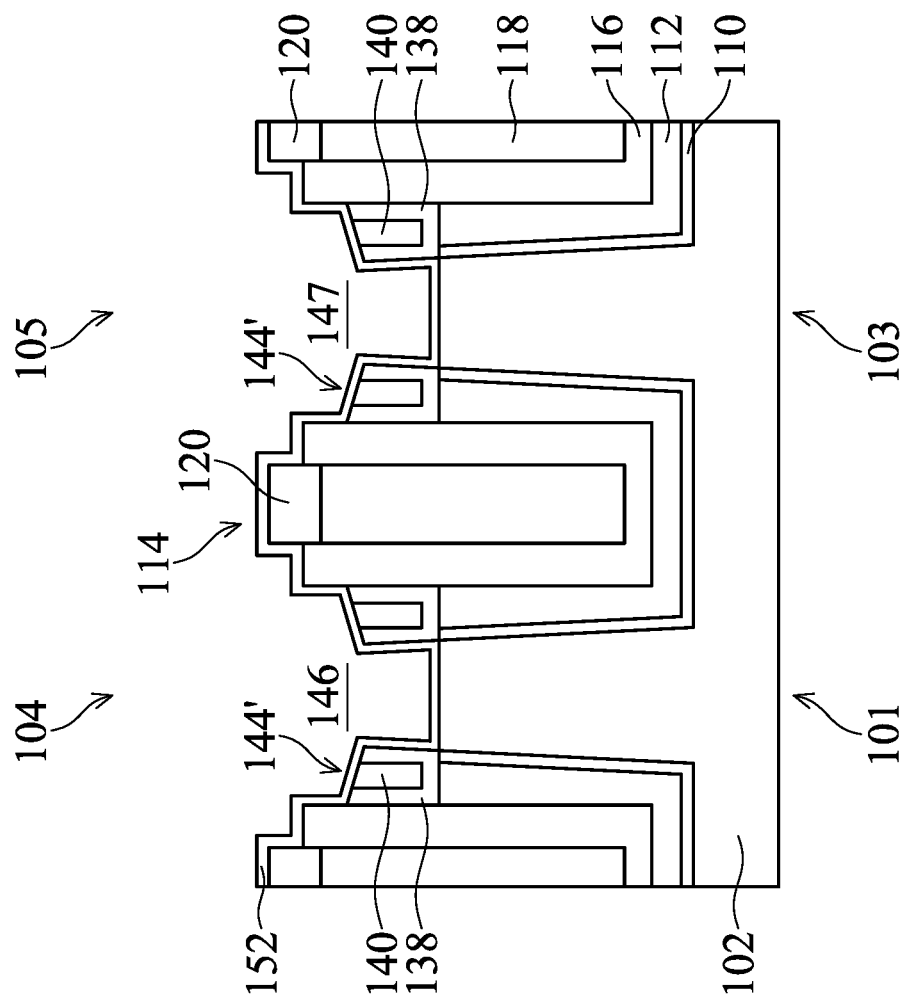

Next, a mask layer 152 is conformally formed to cover both the first region 101 and the second region 103 of the substrate 102, as shown in FIGS. 2G and 3G in accordance with some embodiments. In some embodiments, the mask layer 152 is made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. In some embodiments, the thickness of the mask layer 152 is in a range from about 2 nm to about 5 nm.

Figure 2H:
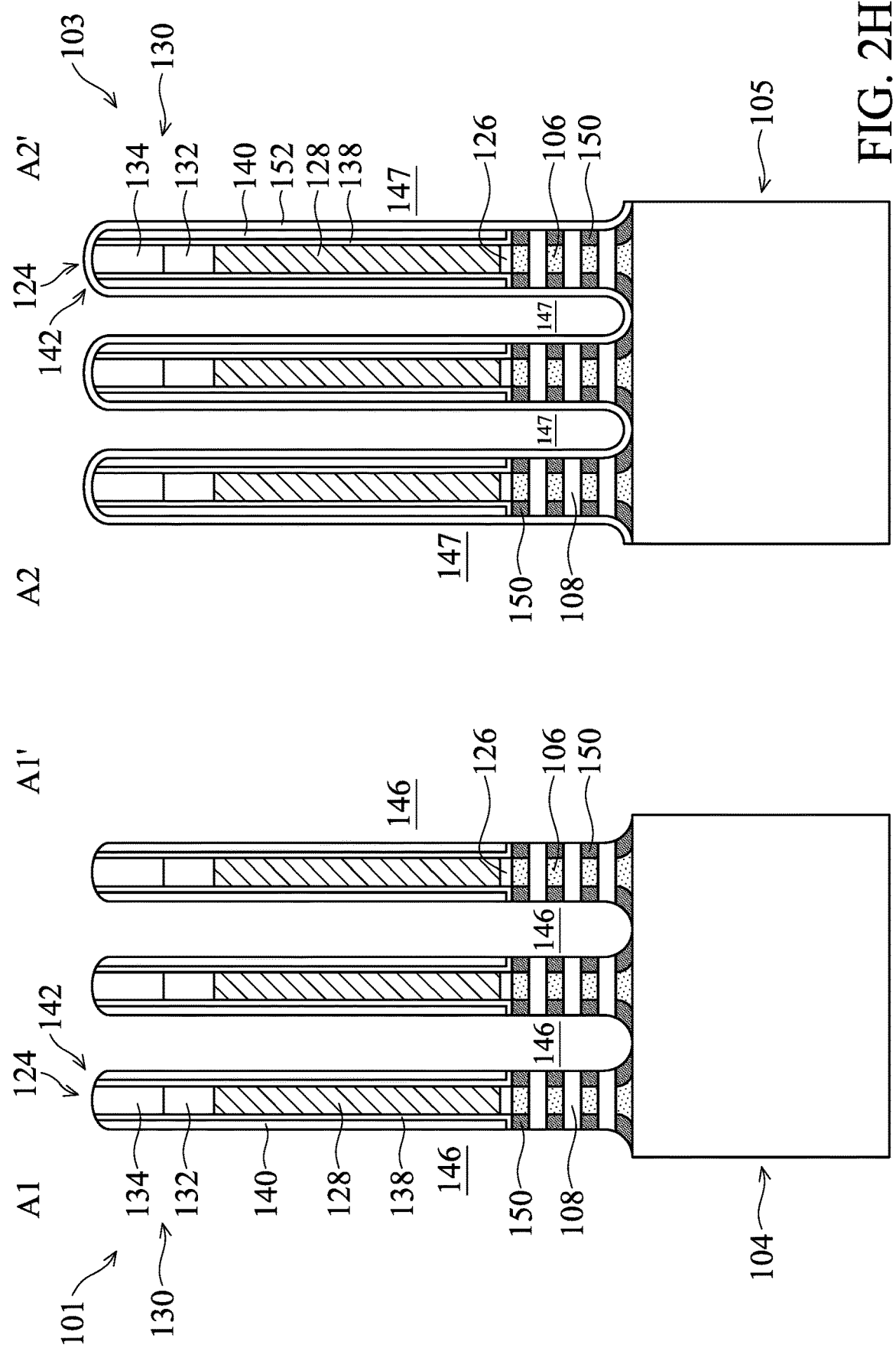
Figure 3H:
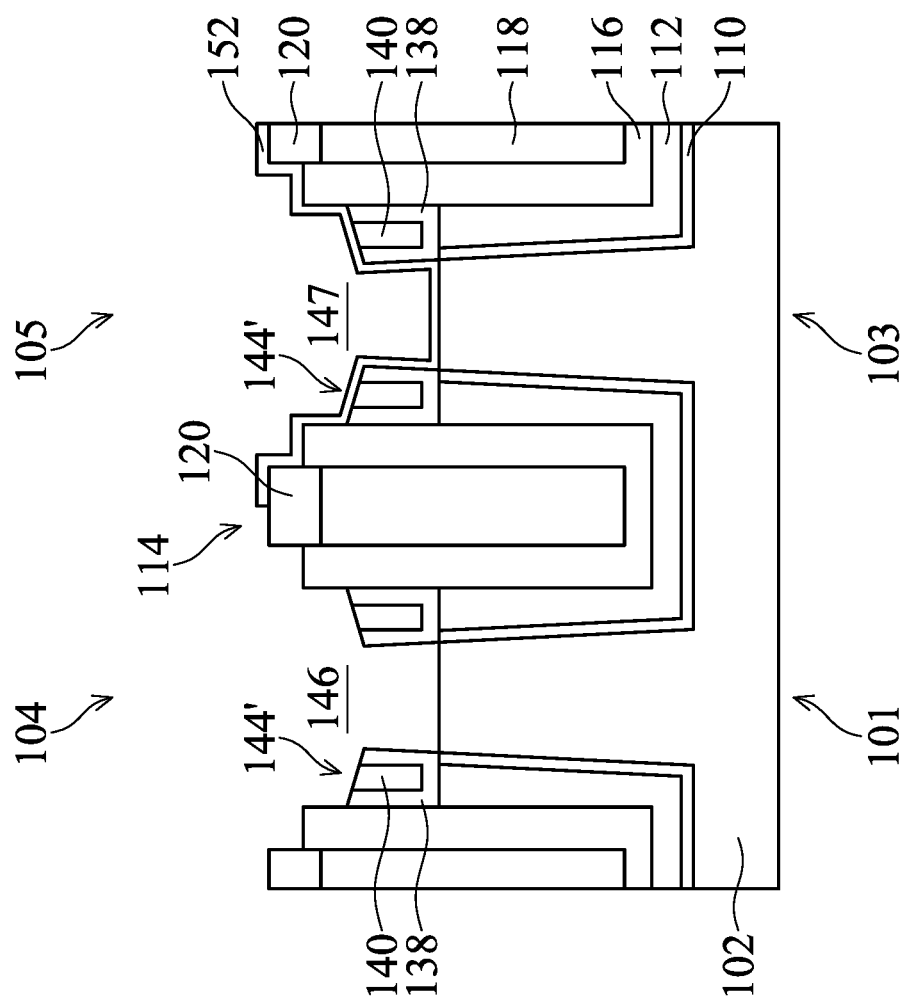

Afterwards, the mask layer 152 over the first region 101 is removed to expose the first trench 146 and the dummy gate structures 124 in the first region 101, as shown in FIGS. 2H and 3H in accordance with some embodiments. The mask layer 152 may be patterned by forming a photoresist layer over the second region 103 of the substrate and etching the mask layer 152 not covered by the photoresist layer.

Figure 2I:
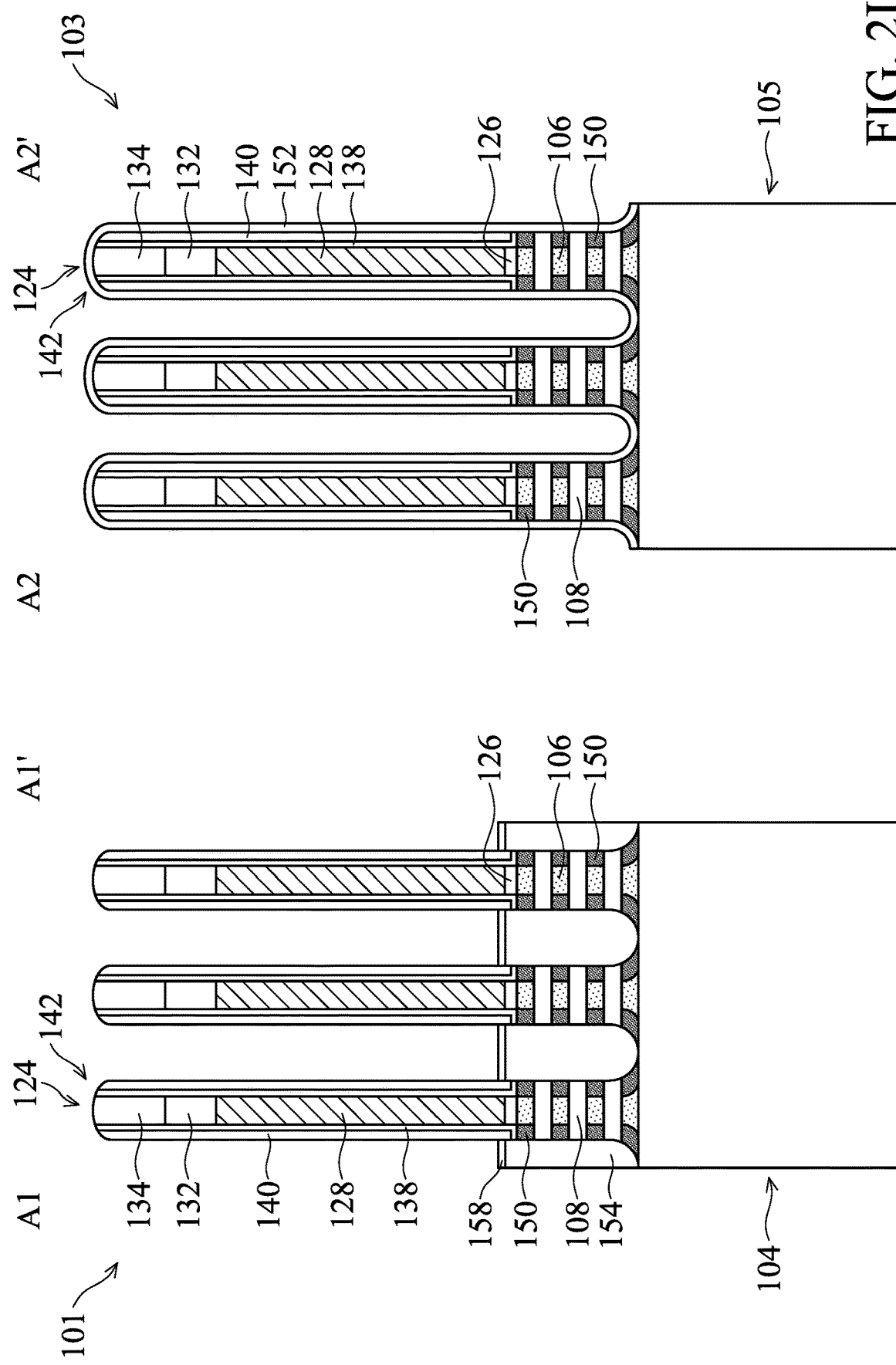
Figure 3I:
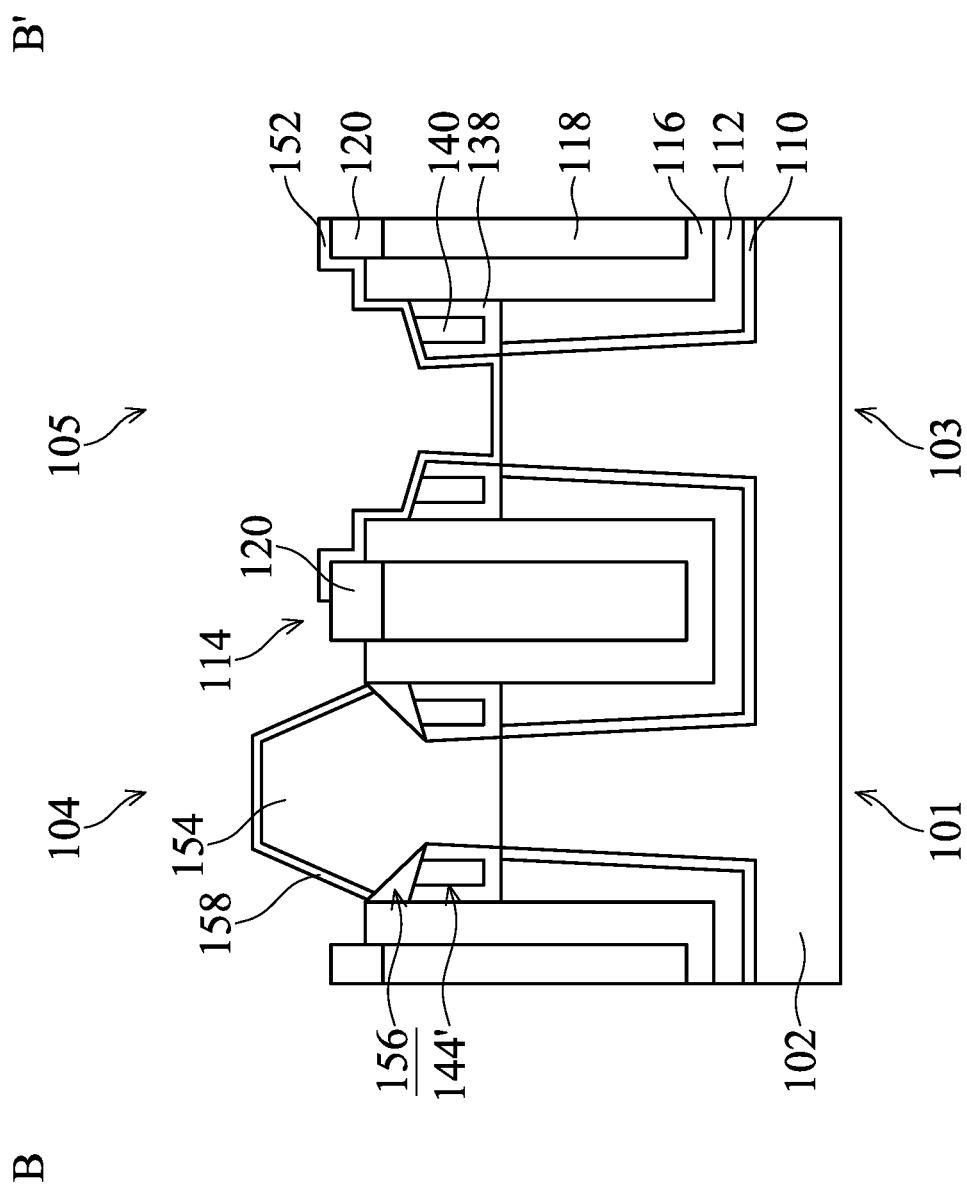

Next, first source/drain structures 154 are formed in the first trenches 146, as shown in FIGS. 2I and 3I in accordance with some embodiments. In some embodiments, the first source/drain structures 154 are formed using an epitaxial growth process, such as MBE, MOCVD, VPE, another suitable epitaxial growth process, or a combination thereof. In addition, since the surfaces of the second trenches 147 are covered by the mask layer 152, the epitaxial material only grows in the first trenches 146 but not in the second trenches 147, as shown in FIGS. 2I and 3I in accordance with some embodiments.

In some embodiments, the first source/drain structures 154 are made of any applicable material for an n-type semiconductor device and a p-type semiconductor device, such as Ge, Si, GaAs, AlGaAs, SiGe, GaAsP, SiP, SiC, SiCP, or a combination thereof.

In some embodiments, the first source/drain structures 154 are in-situ doped during the epitaxial growth process. For example, the first source/drain structures 154 may be the epitaxially grown SiGe doped with boron (B). For example, the first source/drain structures 154 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the first source/drain structures 154 are doped in one or more implantation processes after the epitaxial growth process.

As shown in FIG. 3I, the first source/drain structure 154 is formed between the fin spacers 144' and the dielectric fin structures 114 in accordance with some embodiments. In addition, air gaps 156 may be formed between the first source/drain structure 154 and the fin spacers 144' in accordance with some embodiments.

After the first source/drain structures 154 are formed, Si layers 158 are formed over the first source/drain structures 154, as shown in FIGS. 2I and 3I in accordance with some embodiments. In some embodiments, the Si layers 158 are formed using an epitaxial growth process, such as MBE, MOCVD, VPE, other applicable epitaxial growth processes, or a combination thereof. In addition, since the surfaces of the second trenches 147 are covered by the mask layer 152, the epitaxial material only grows over the first source/drain structures 154, as shown in FIGS. 2I and 3I in accordance with some embodiments. That is, the Si layers 158 are self-aligned to the first source/drain structures 154, and therefore no complicated alignment processes is required.

In some embodiments, the Si layer 158 has a thickness in a range from about 1 nm to about 4 nm. The Si layer should be thick enough so it can be used as a protection layer for the first source/drain structures 154 in subsequent oxidization processes.

Figure 2J:
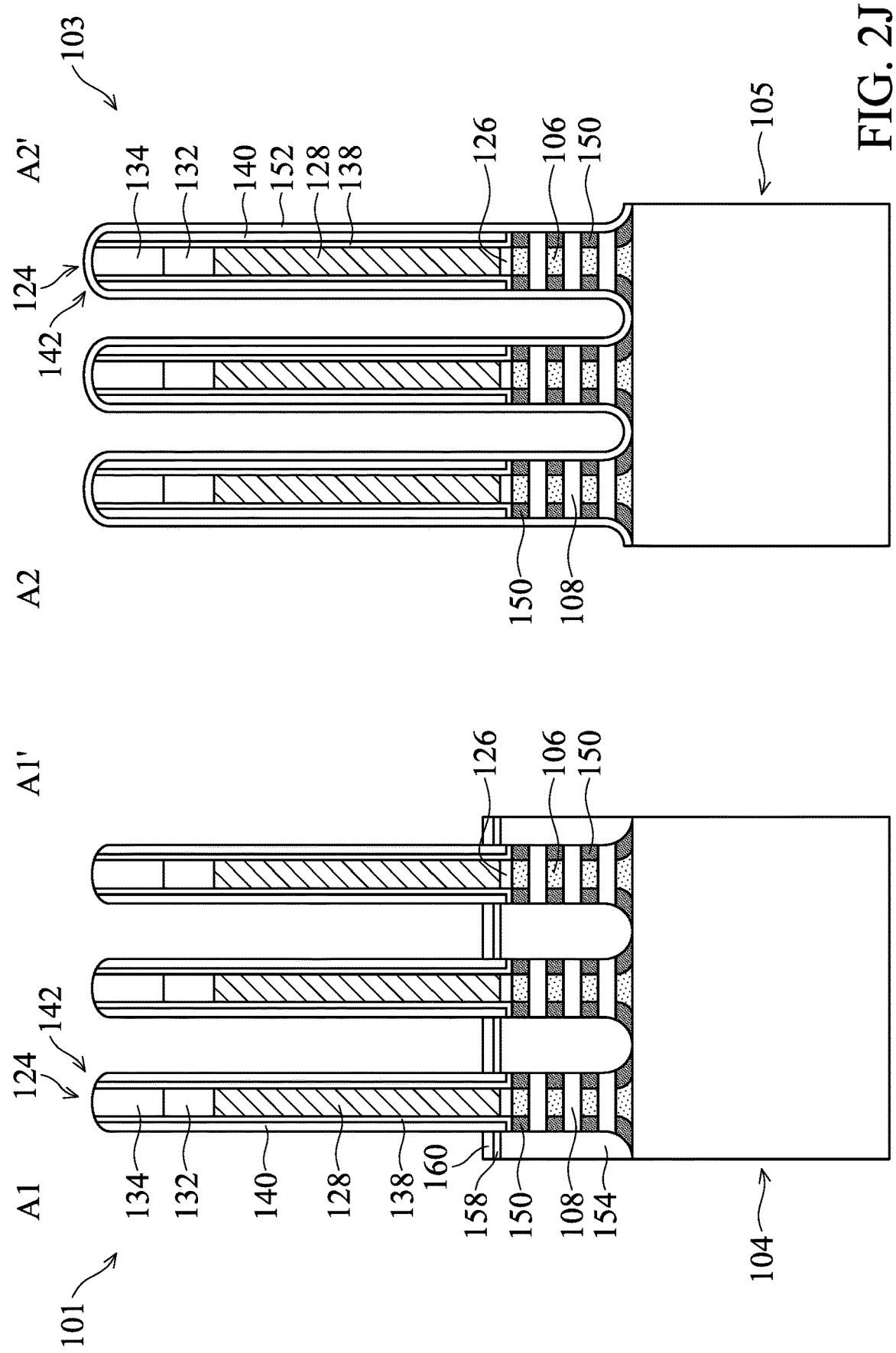
Figure 3J:
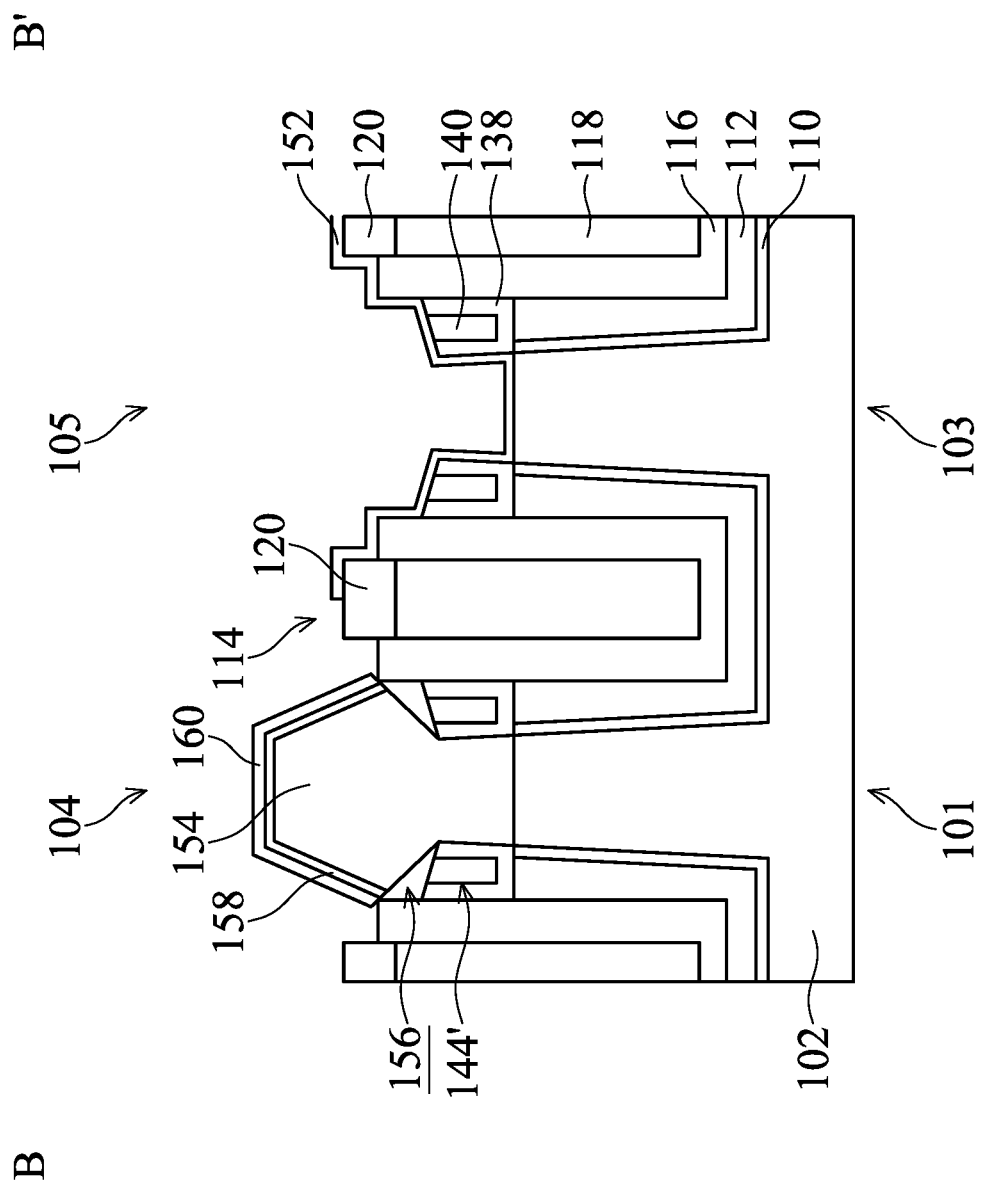

After the Si layers 158 are formed, SiGe layers 160 are formed over the Si layers 158, as shown in FIGS. 2J and 3J in accordance with some embodiments. In some embodiments, the SiGe layers 160 are formed using an epitaxial growth process, such as MBE, MOCVD, VPE, other applicable epitaxial growth processes, or a combination thereof. In addition, since the surfaces of the second trenches 147 are covered by the mask layer 152, the epitaxial material only grows over the Si layers 158, as shown in FIGS. 2J and 3J in accordance with some embodiments. That is, the SiGe layers 160 are self-aligned to the Si layer and the first source/drain structures 154, and therefore no complicated alignment processes is required.

In some embodiments, the SiGe layer 160 has a thickness in a range from about 2 nm to about 5 nm. In some embodiments, the SiGe layer 160 is thicker than the Si layer 158.

In some embodiments, the concentration of Ge in the SiGe layer 160 is in a range from about 20% to about 75%. The concentration of Ge should be high enough so it can be oxidized and used as a mask layer in the subsequent processes (details will be described later.)

Figure 3K:
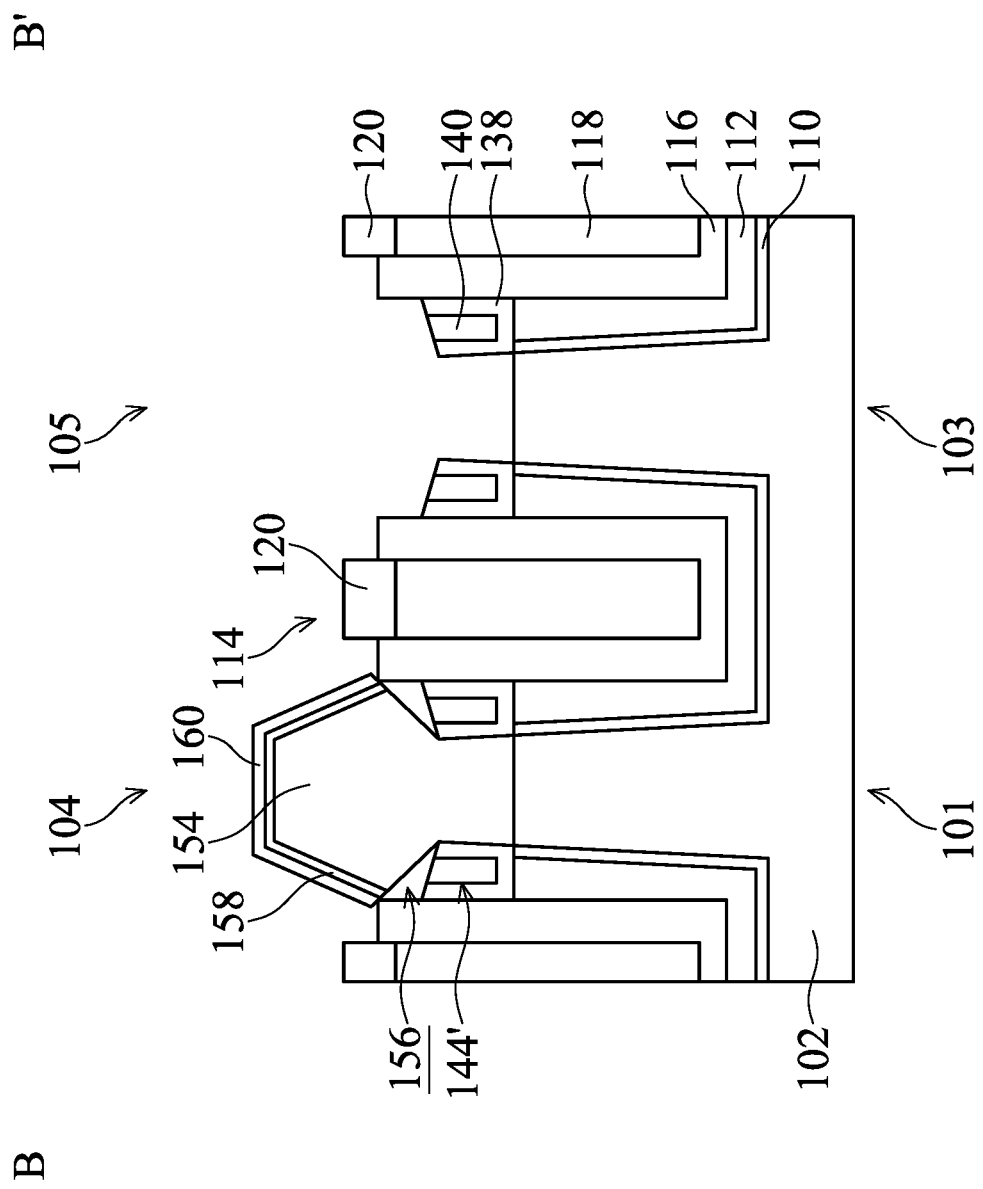

Next, the mask layer 152 is completely removed, as shown in FIGS. 2K and 3K in accordance with some embodiments. The mask layer 152 may be removed by performing an etching process, such as a wet etching process or a dry etching process.

Figure 2L:
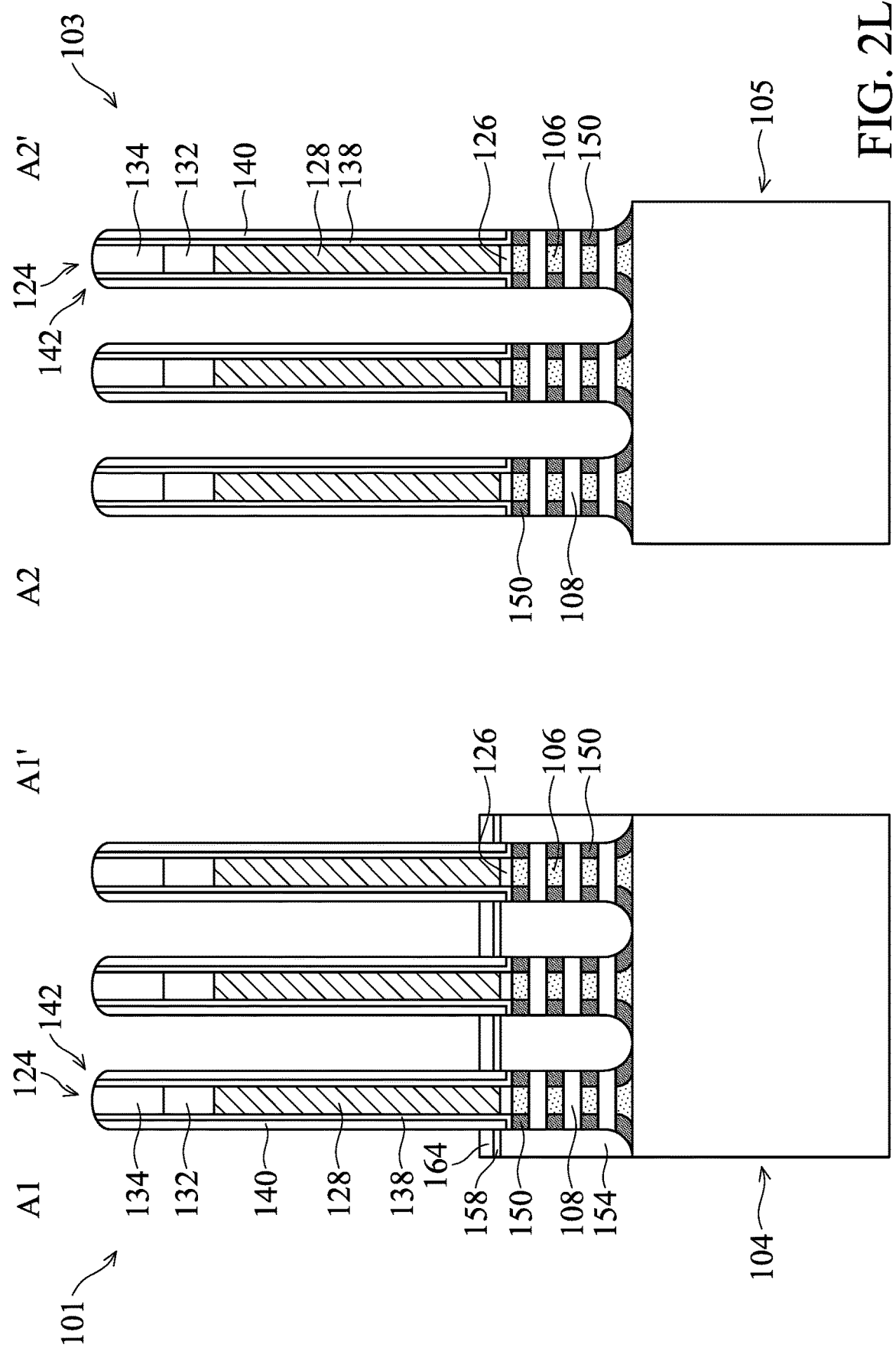
Figure 3L:
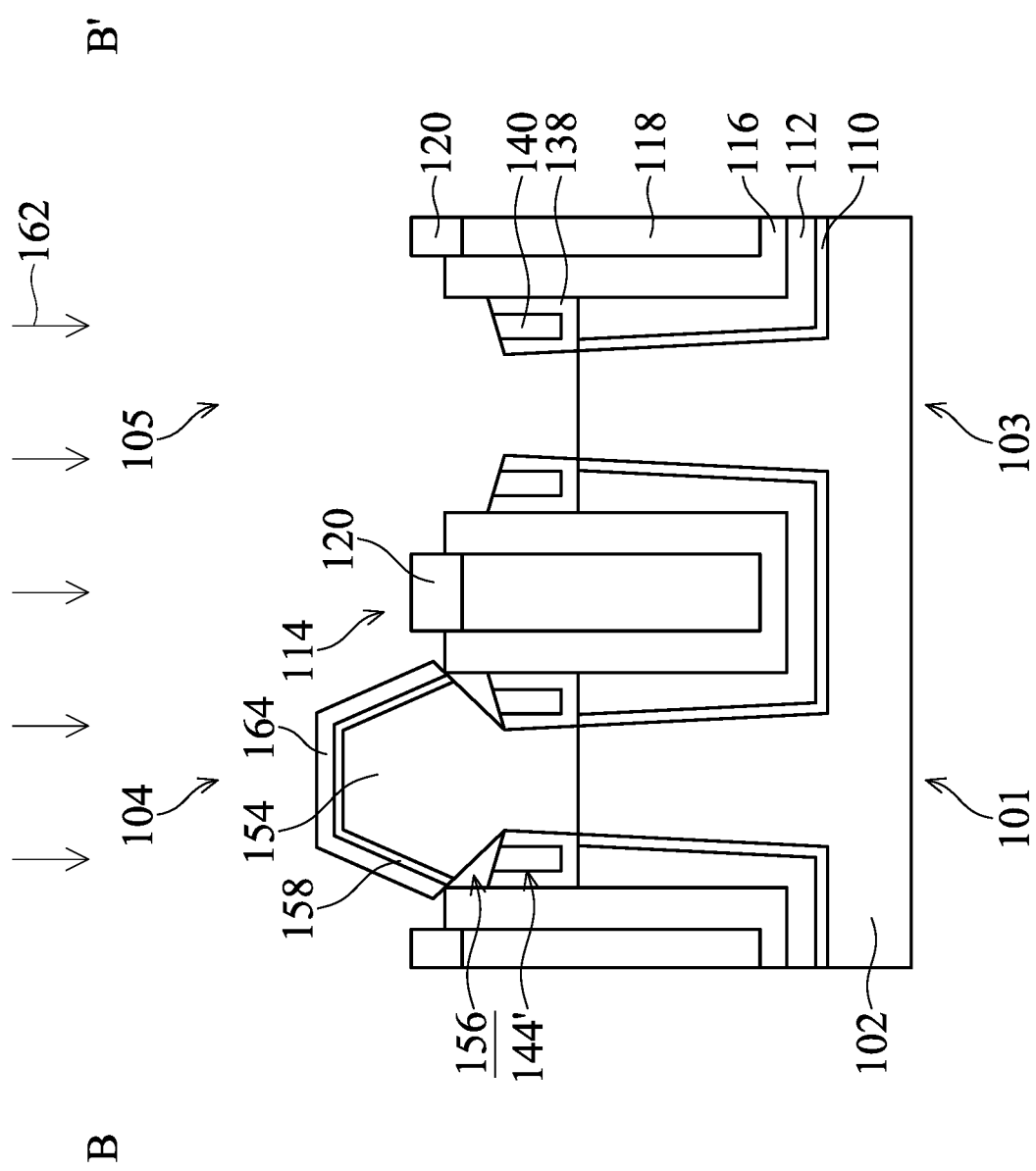

After the mask layer 152 is removed, the SiGe layer 160 is oxidized by performing an oxidization process 162 to form an oxide layer 164, as shown in FIGS. 2L and 3L in accordance with some embodiments. The Si layer 158 under the SiGe layer 160 may be used as a stop layer to prevent the first source/drain structures 154 from oxidizing.

In some embodiments, the oxide layer 164 has a thickness in a range from about 3 nm to about 10 nm. The oxide layer 164 should be thick enough so it can be used as a mask layer in the subsequent process. On the other hand, the oxide layer 164 cannot be too thick or its removal may become difficult in the subsequent processes.

In some embodiments, the oxidization process 162 is a dry or wet oxidization process performed under a temperature in a range of about 300 degrees to about 1000 degrees. In some embodiments, the oxide layer is $SiGeO_x$ layer, and x is a positive integral.

Figure 2M:
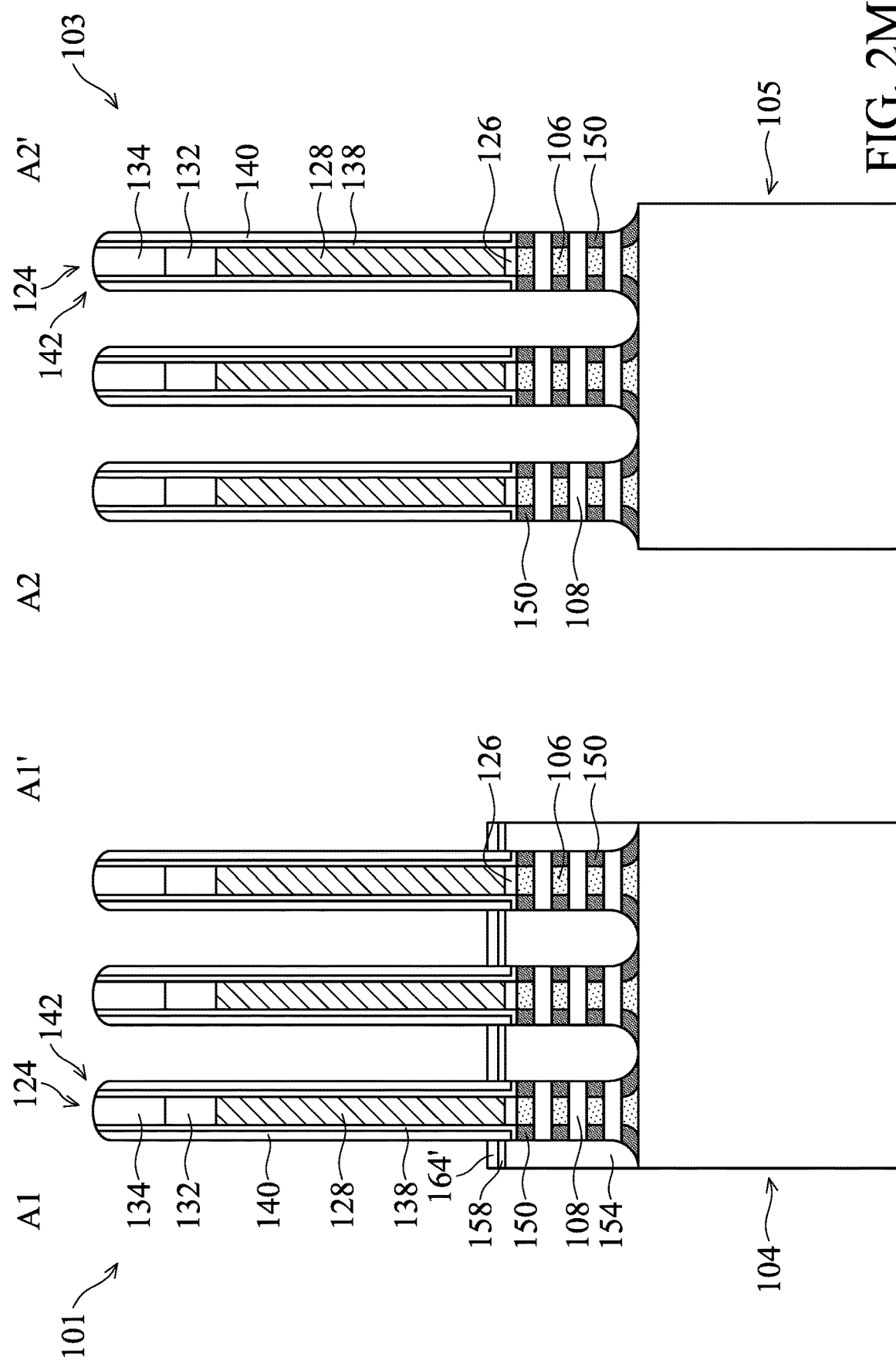
Figure 3M:
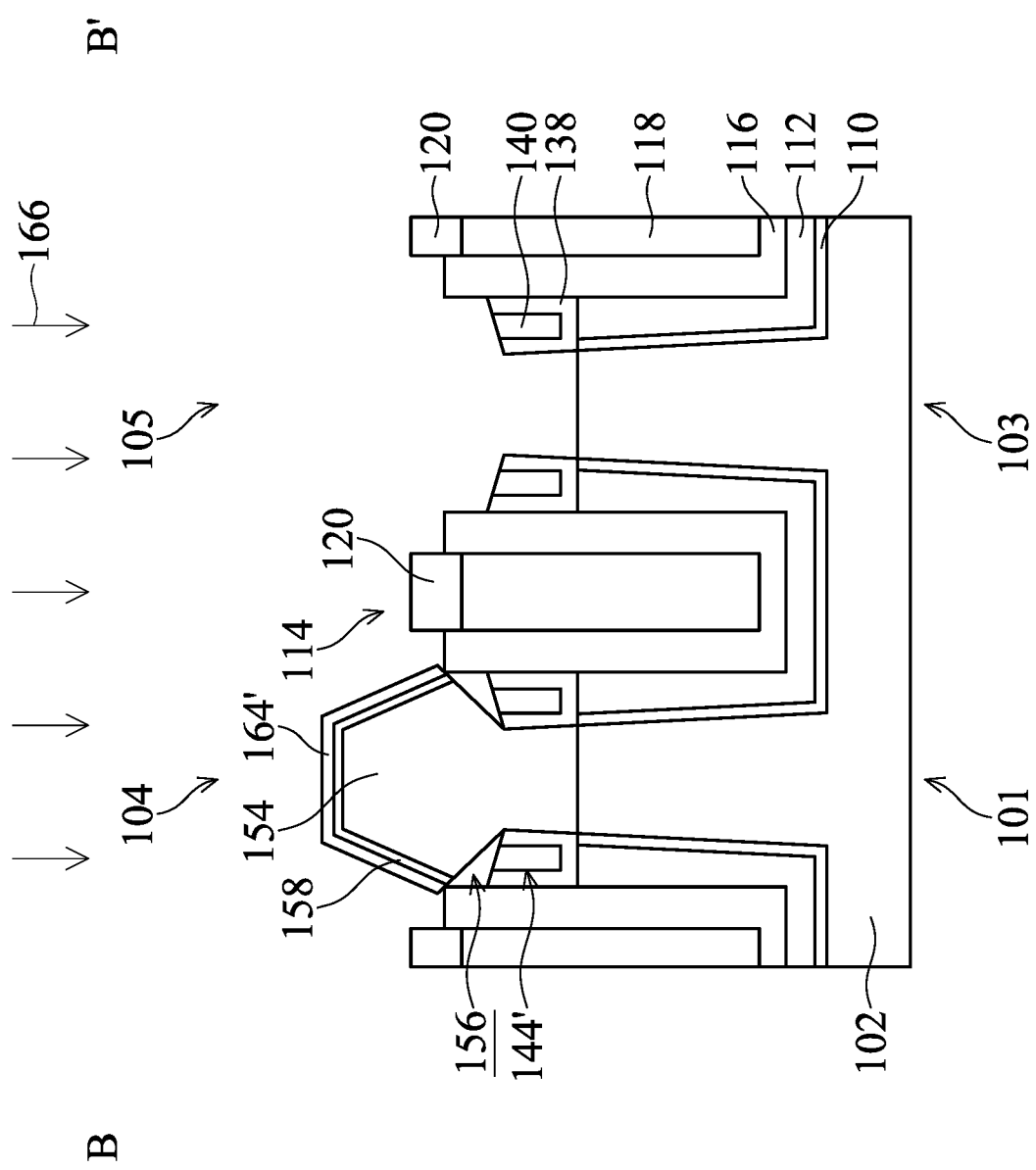

After the oxidation process is performed, a scavenging process 166 is performed, as shown in FIGS. 2M and 3M in accordance with some embodiments. During the scavenging process 166, the oxide layer 164 may be thinned to form the thinned oxide layer. In some embodiments, the thickness of the oxide layer 164' after the scavenging process 166 is in a range from about 4 nm to about 5 nm.

In some embodiments, the scavenging process 166 includes applying a non-reacted gas under a temperature in a range from about 600 degrees to about 1200 degrees. In some embodiments, the non-reacted gas used in the scavenging process 166 includes $N_2$, Ar, or other inert gas. In some embodiments, the scavenging process 166 is performed under a temperature higher than the temperature the oxidization process 162 is performed under. Accordingly, the remaining portion of the SiGe layer 160 which is not completely oxidized in the oxidization process 162 is further oxidized during the scavenging process 166 in accordance with some embodiments.

After the scavenging process 166 is performed, a cleaning process may be performed to remove the native oxide formed over the second trenches 147 in accordance with some embodiments. In addition, the upper portion of the oxide layer 164' may also be removed during the cleaning process. In some embodiments, the thickness of the oxide layer 164' after the cleaning process is performed is in a range from about 2 nm to about 3 nm. In some embodiments, the cleaning process includes using SiCoNi.

Figure 2N:
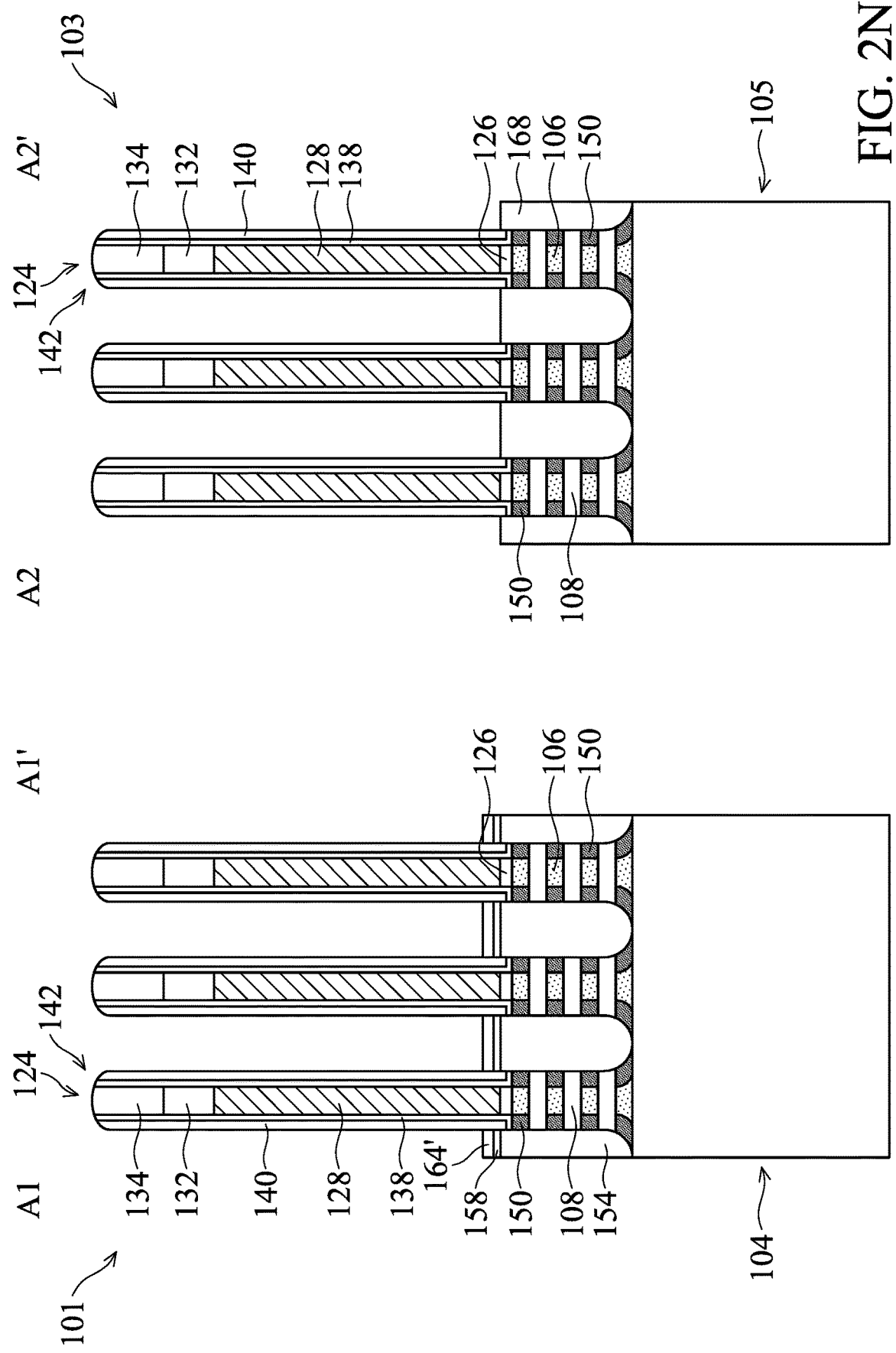
Figure 3N:
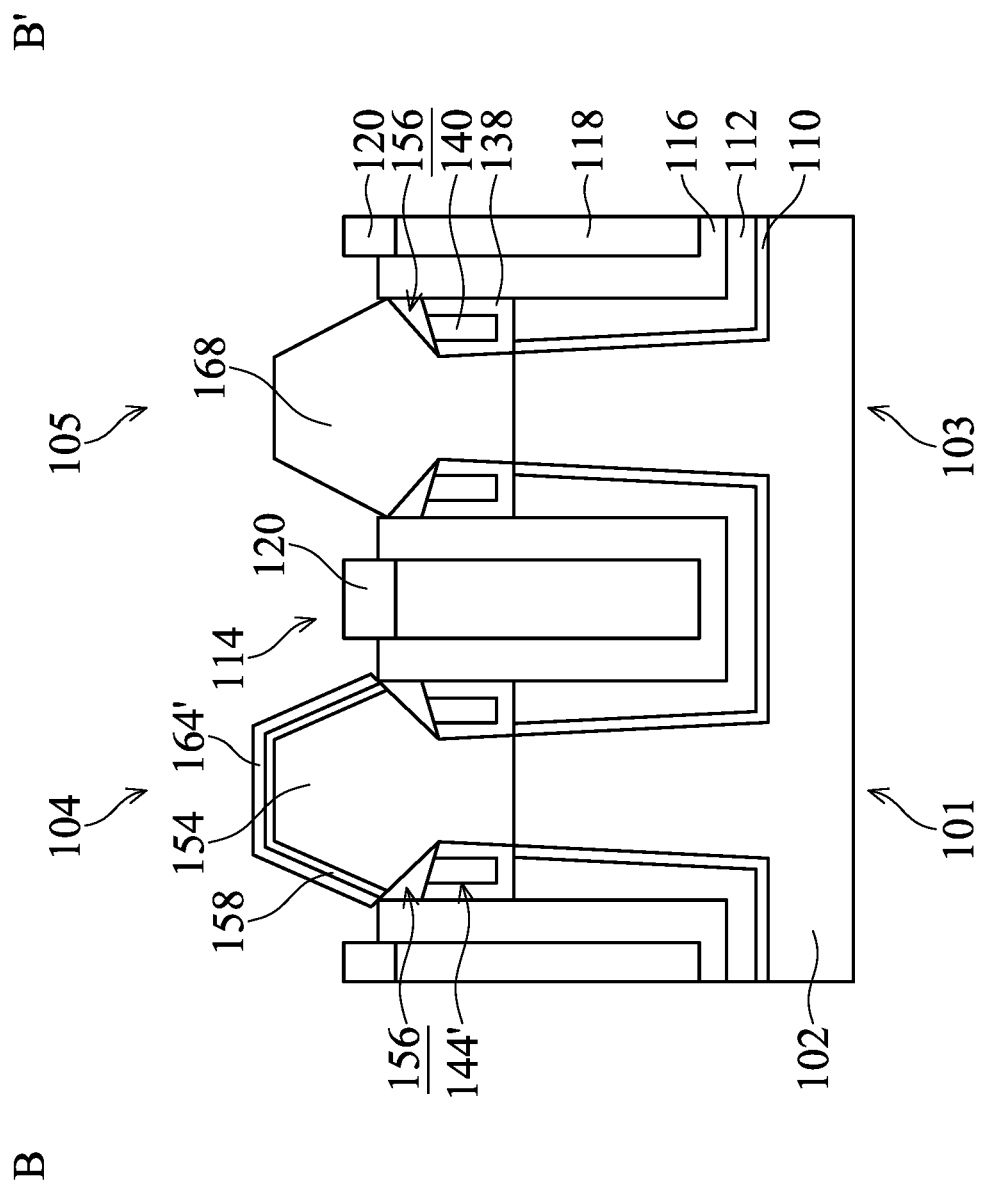

Next, second source/drain structures 168 are formed in the second trenches 147, as shown in FIGS. 2N and 3N in accordance with some embodiments. In some embodiments, the second source/drain structures 168 are formed using an epitaxial growth process, such as MBE, MOCVD, VPE, another suitable epitaxial growth process, or a combination thereof. In addition, since the surfaces of the first source/drain structures 154 are covered by the oxide layer 164', the epitaxial material only grows in the second trenches 147 but not over the first source/drain structures 154, as shown in FIGS. 2N and 3N in accordance with some embodiments.

In some embodiments, the second source/drain structures 168 are made of any applicable material for an n-type semiconductor device and a p-type semiconductor device, such as Ge, Si, GaAs, AlGaAs, SiGe, GaAsP, SiP, SiC, SiCP, or a combination thereof.

In some embodiments, the second source/drain structures 168 are in-situ doped during the epitaxial growth process. For example, the second source/drain structures 168 may be the epitaxially grown SiGe doped with boron (B). For example, the second source/drain structures 168 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the second source/drain structures 168 are doped in one or more implantation processes after the epitaxial growth process.

Figure 2O:
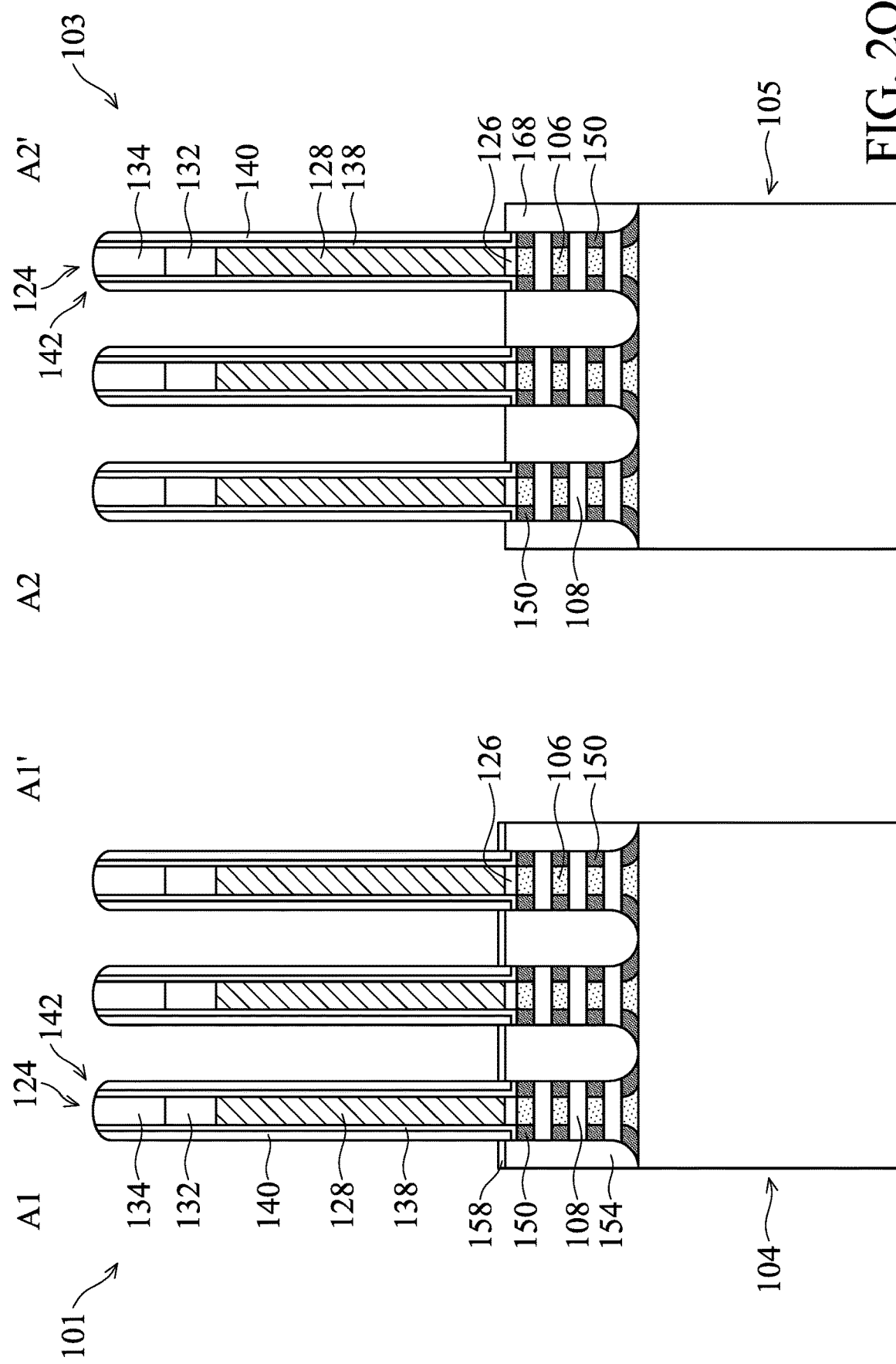
Figure 3O:
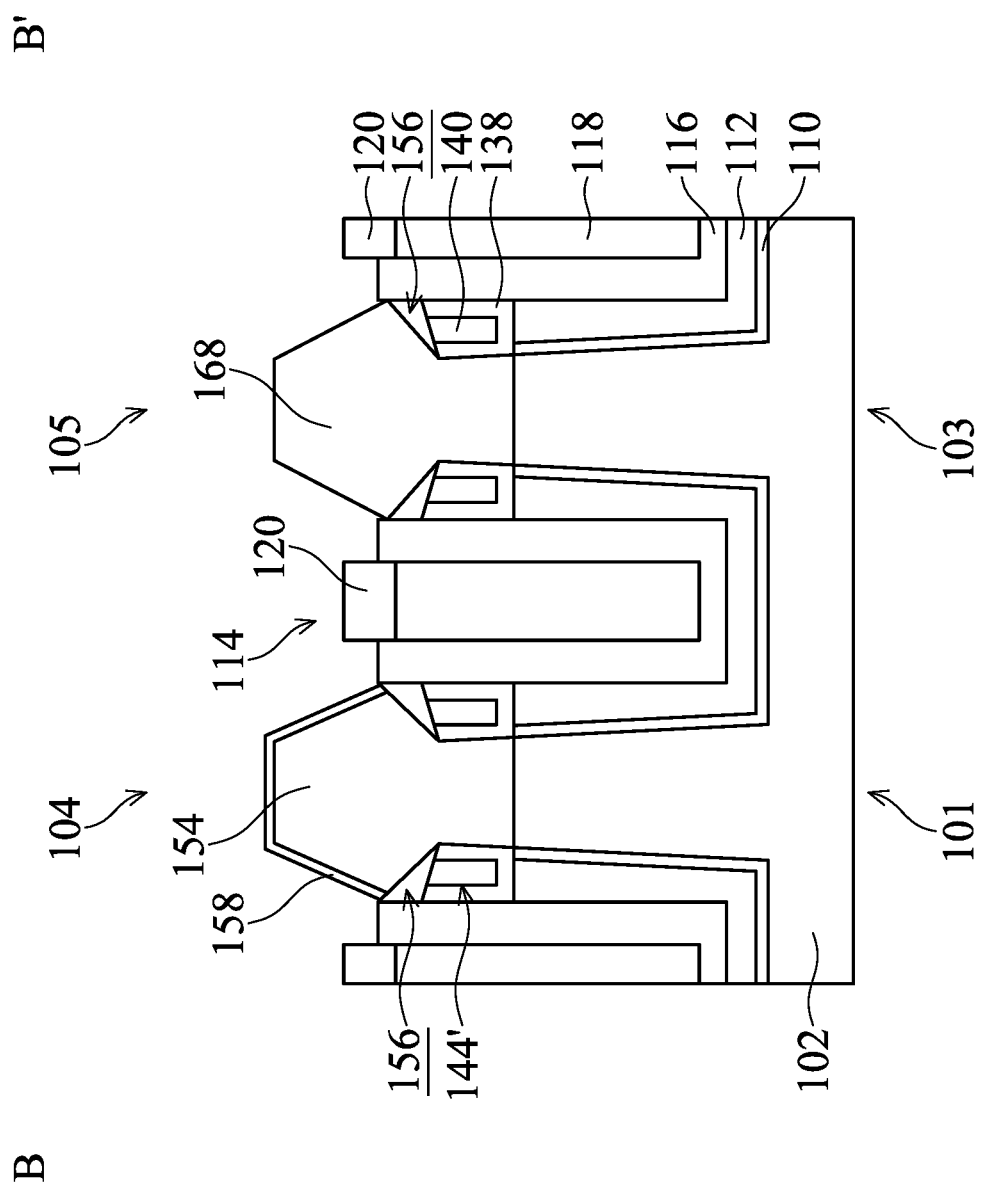

After the second source/drain structures 168 are grown in the second trenches 147, the oxide layers 164' are removed, as shown in FIGS. 2O and 3O in accordance with some embodiments. The oxide layers 164' may be removed by performing an etching process, such as a wet etching process or a dry etching process. As shown in FIGS. 2O and 3O, the Si layer 158 is exposed after the oxide layers 164' in accordance with some embodiments.

Figure 2P:
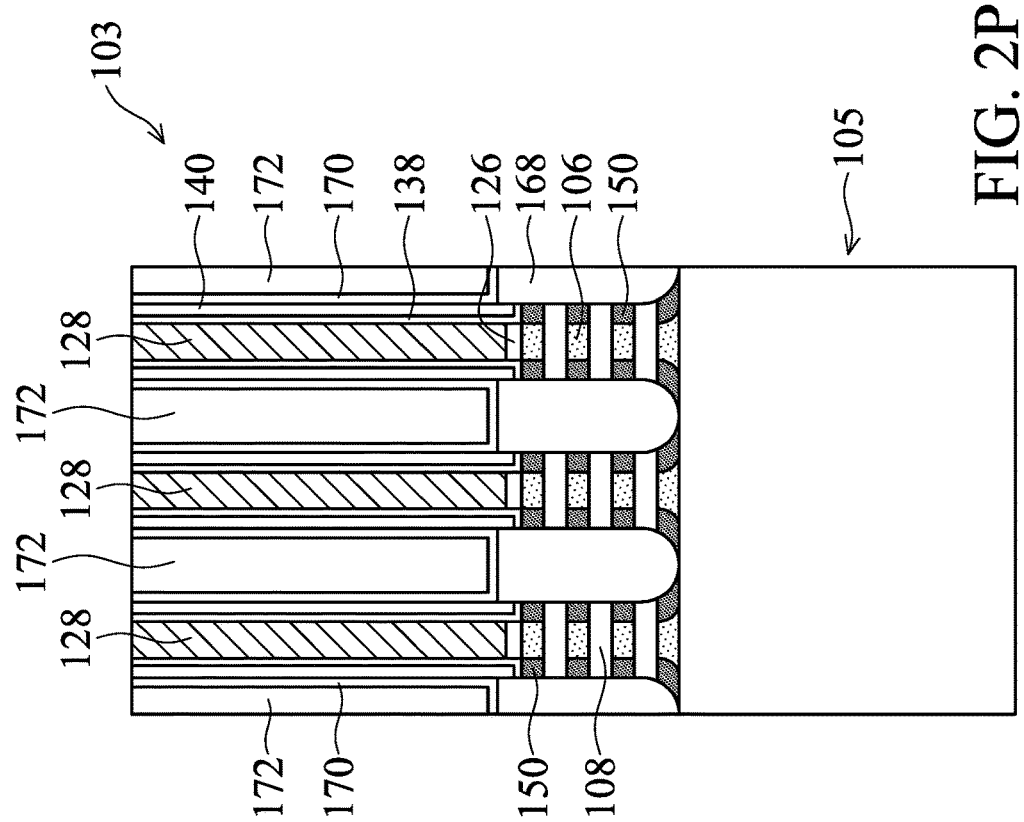
Figure 2P:
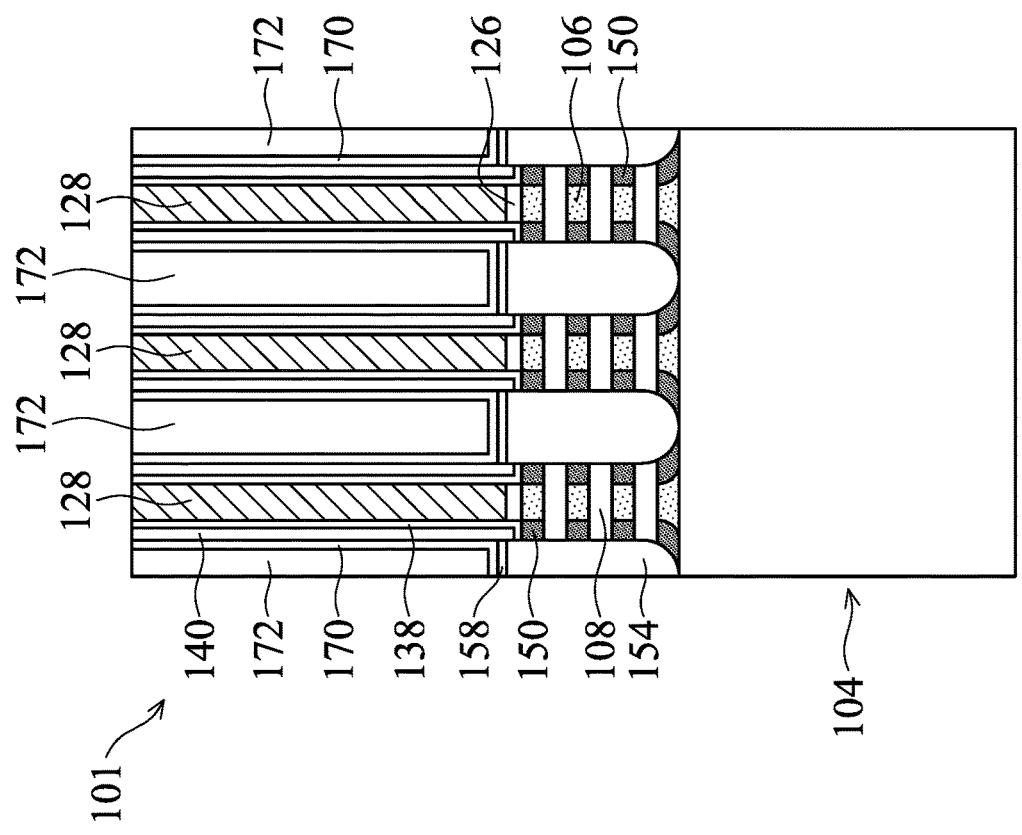
Figure 3P:
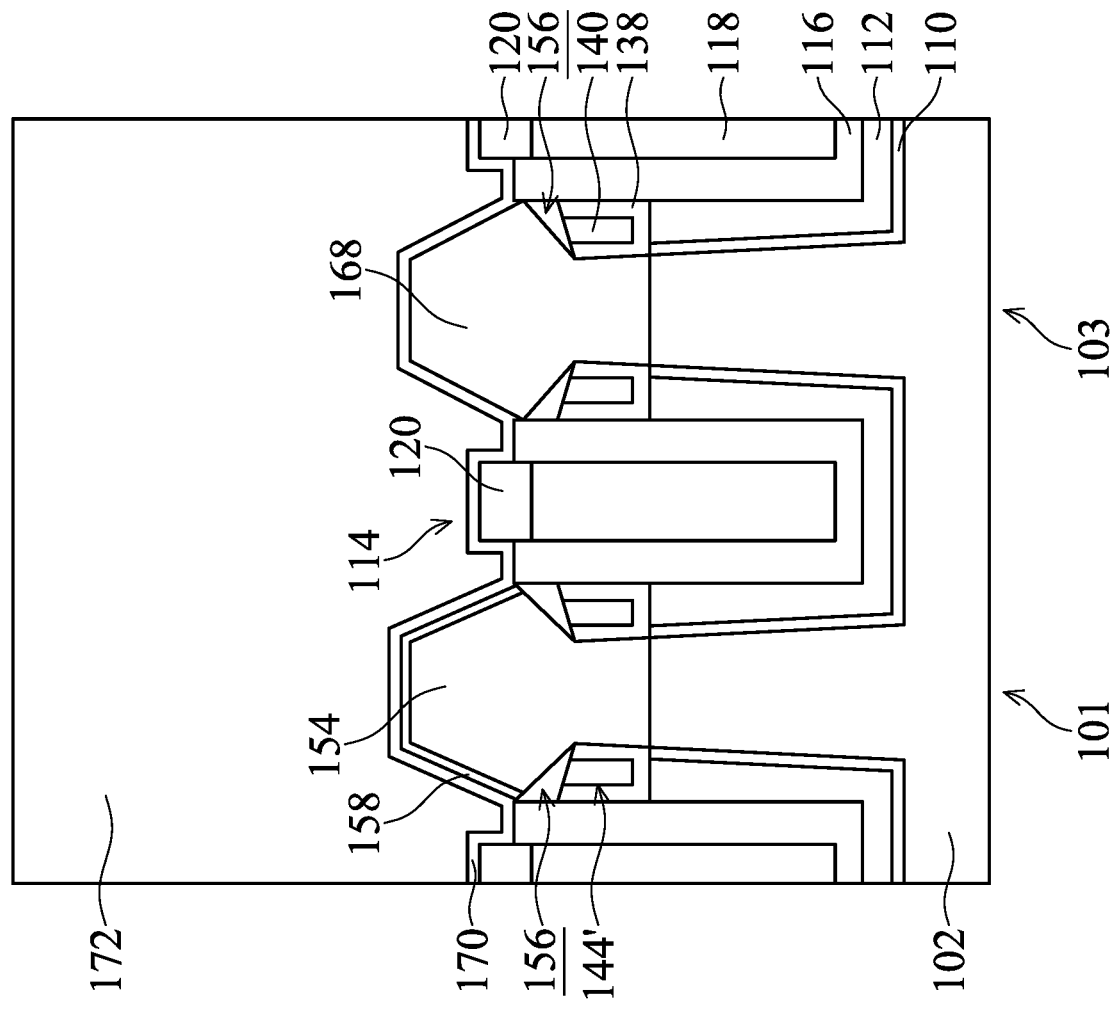

Next, a contact etch stop layer (CESL) 170 is formed over both the first region 101 and the second region 103 of the semiconductor structure, as shown in FIGS. 2P and 3P in accordance with some embodiments. More specifically, the contact etch stop layer 170 covers the top surfaces of the second source/drain structures 168 in the second region 103 but is separated from the top surfaces of the first source/drain structures 154 by the Si layer 158 in the first region 101 in accordance with some embodiments.

In some embodiments, the contact etch stop layer 170 is made of a dielectric material, such as silicon nitride, silicon oxide, silicon oxynitride, another suitable dielectric material, or a combination thereof. The dielectric material for the contact etch stop layer 170 may be conformally deposited over the semiconductor structure by performing CVD (such as PECVD, HARP, or a combination thereof), ALD, other application methods, or a combination thereof.

Afterwards, an interlayer dielectric (ILD) layer 172 is formed over the contact etch stop layer 170, as shown in FIGS. 2P and 3P in accordance with some embodiments. The interlayer dielectric layer 172 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The interlayer dielectric layer 172 may be formed by chemical vapor deposition (CVD), physical vapor deposition, (PVD), atomic layer deposition (ALD), or other applicable processes.

After the contact etch stop layer 170 and the interlayer dielectric layer 172 are deposited, a planarization process such as CMP or an etch-back process is performed until the dummy gate electrode layers 128 are exposed, as shown in FIGS. 2P and 3P in accordance with some embodiments.

Figure 2Q:
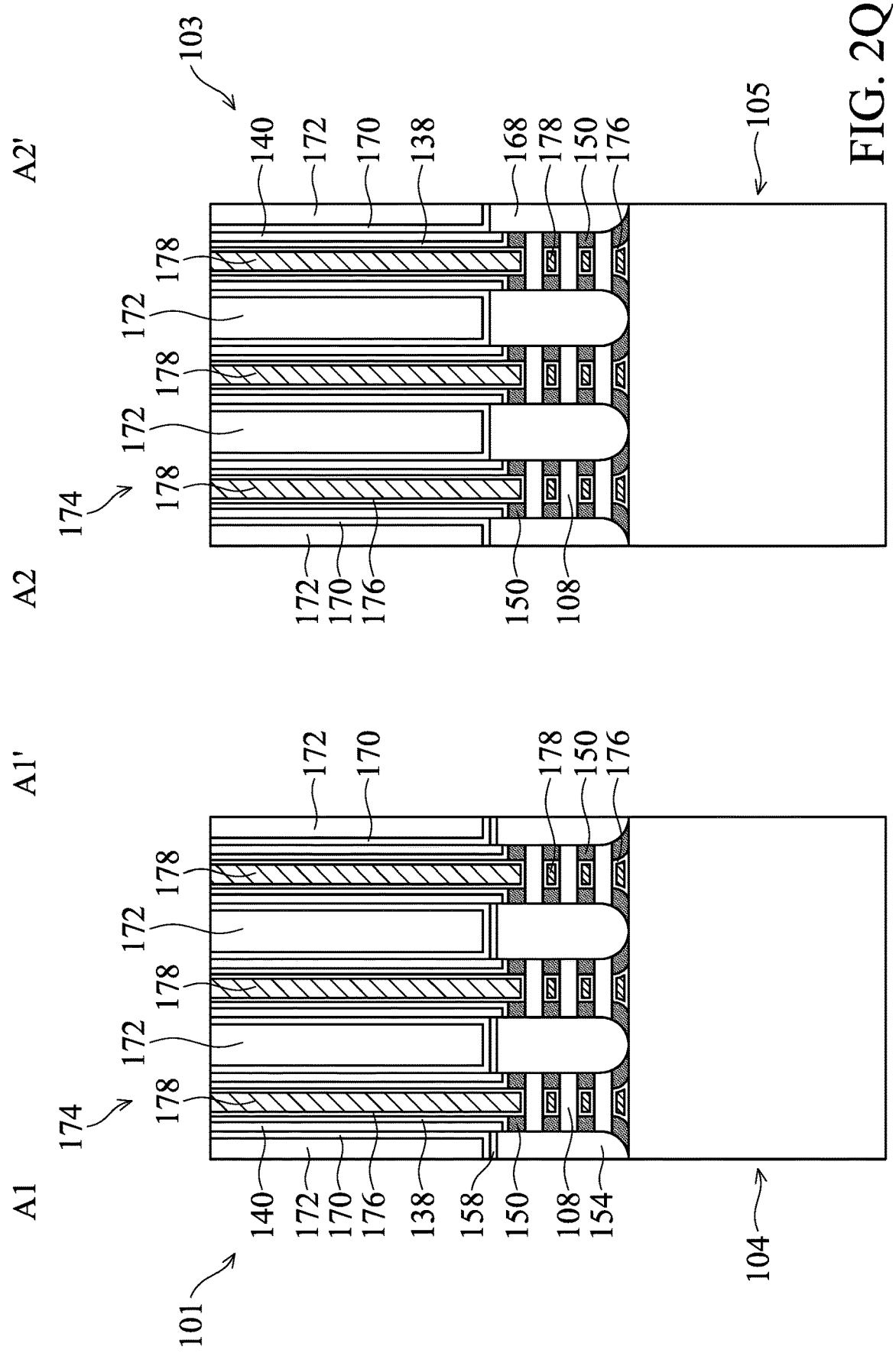
Figure 3Q:
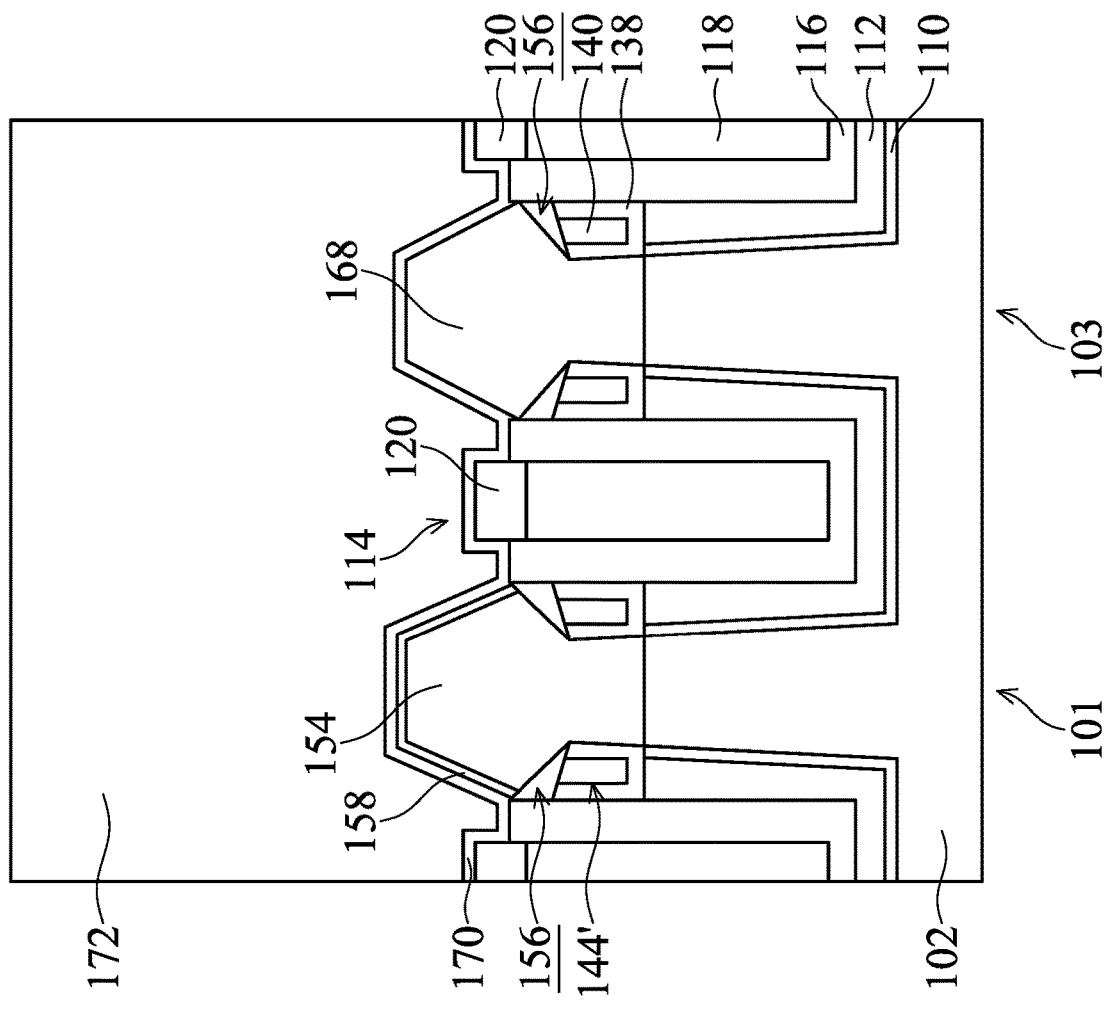

Next, the dummy gate electrode layers 128 and the dummy dielectric layers 126 are removed, as shown in FIGS. 2Q and 3Q in accordance with some embodiments. In some embodiments, the dummy gate electrode layers 128 and the dummy dielectric layers 126 are removed to form trenches (not shown) between the gate spacers 142. The removal process includes one or more etching processes. For example, when the dummy gate electrode layers 128 are polysilicon, a wet etchant such as a tetramethylammonium hydroxide (TMAH) solution may be used to selectively remove the dummy gate electrode layers 128. Afterwards, the dummy gate dielectric layers 126 may be thereafter removed using a plasma dry etching, a dry chemical etching, and/or a wet etching.

After the dummy gate electrode layers 128 and the dummy dielectric layers 126 are removed, the first semiconductor layers 106 of the first fin structure 104 and the second fin structure 105 are removed to form gaps (not shown) between the second semiconductor layers 108 in accordance with some embodiments. The exposed second semiconductor layers 108 form nanowire structures, which function as channel regions of the resulting semiconductor device and are surrounded by the metal gate structures formed afterwards in accordance with some embodiments.

The first semiconductor layers 106 may be removed by performing an etching process. The etching process may include a selective wet etching process, such as APM (e.g., ammonia hydroxide-hydrogen peroxide-water mixture) etching process. In some embodiments, the wet etching process uses etchants such as ammonium hydroxide (NH$_4$OH), TMAH, ethylenediamine pyrocatechol (EDP), and/or potassium hydroxide (KOH) solutions.

After the first semiconductor layers 106 are removed to form the nanowire structures (e.g. the second semiconductor layers 108), metal gate structures 174 are formed in the trenches and gaps formed by removing the dummy gate dielectric layer 126, the dummy gate electrode layers 128, and the first semiconductor layers 106, as shown in FIGS. 2Q and 3Q in accordance with some embodiments.

The metal gate structures 174 surround the second semiconductor layers 108 to form gate-all-around transistor structures in accordance with some embodiments. In some embodiments, the metal gate structure 174 includes a gate dielectric layer 176 and a gate electrode layer 178.

As shown in FIG. 2Q, the gate dielectric layer 176 is conformally formed along the main surfaces of the second semiconductor layers 108 to surround the second semiconductor layers 108 and is also formed along the sidewalls of gate spacers 142 in accordance with some embodiments.

In some embodiments, the gate dielectric layer 176 is made of one or more layers of a dielectric material, such as HfO$_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, another suitable high-k dielectric material, or a combination thereof. In some embodiments, the gate dielectric layer 176 is formed using CVD, ALD, another suitable method, or a combination thereof.

The gate electrode layer 178 is formed on the gate dielectric layer 176 and filled in the trenches and gaps between the gate spacers 142 and the inner spacers 150 in accordance with some embodiments. In some embodiments, the gate electrode layer 178 is made of one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the gate electrode layer 178 is formed using CVD, ALD, electroplating, another suitable method, or a combination thereof.

Afterward, a planarization process such as CMP or an etch-back process is performed on the metal gate structures 174 to the upper surface of the interlayer dielectric layer 172, as shown in FIG. 2Q in accordance with some embodiments. More specifically, the gate dielectric layers 176 and the gate electrode layers 178 formed over the interlayer dielectric layer 172 are removed by the planarization process in accordance with some embodiments.

Figure 2R:
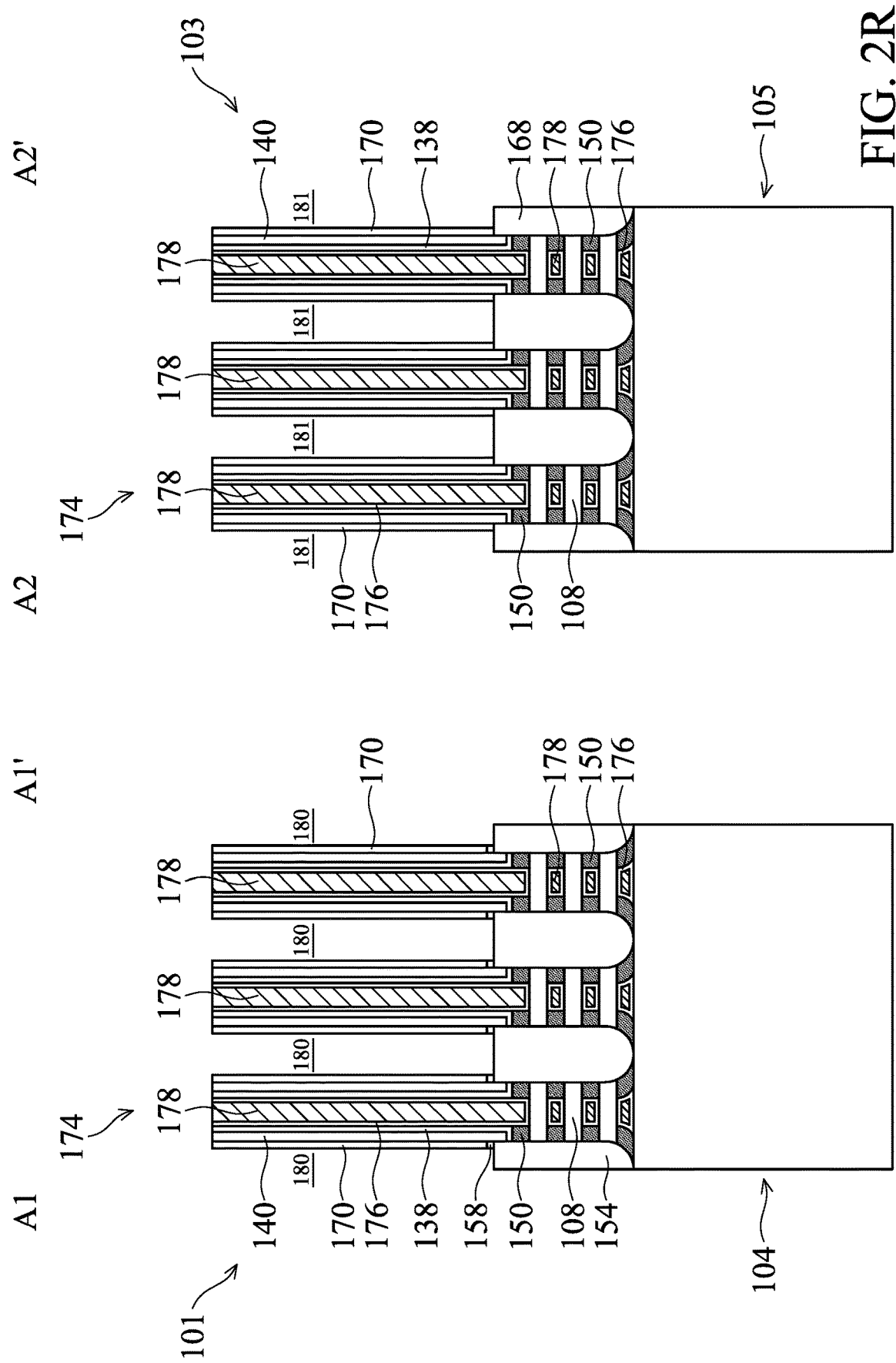
Figure 3R:
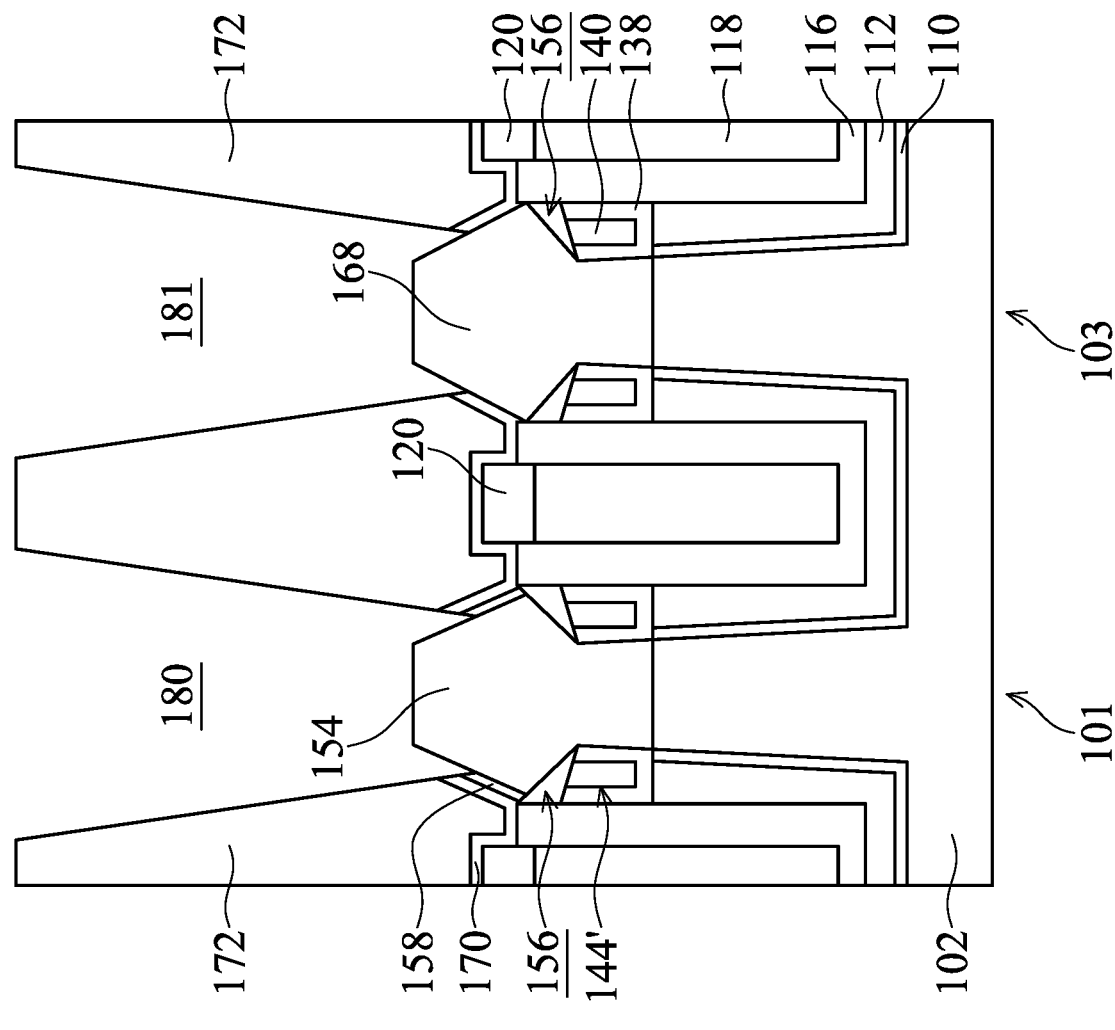
Figure 3S:
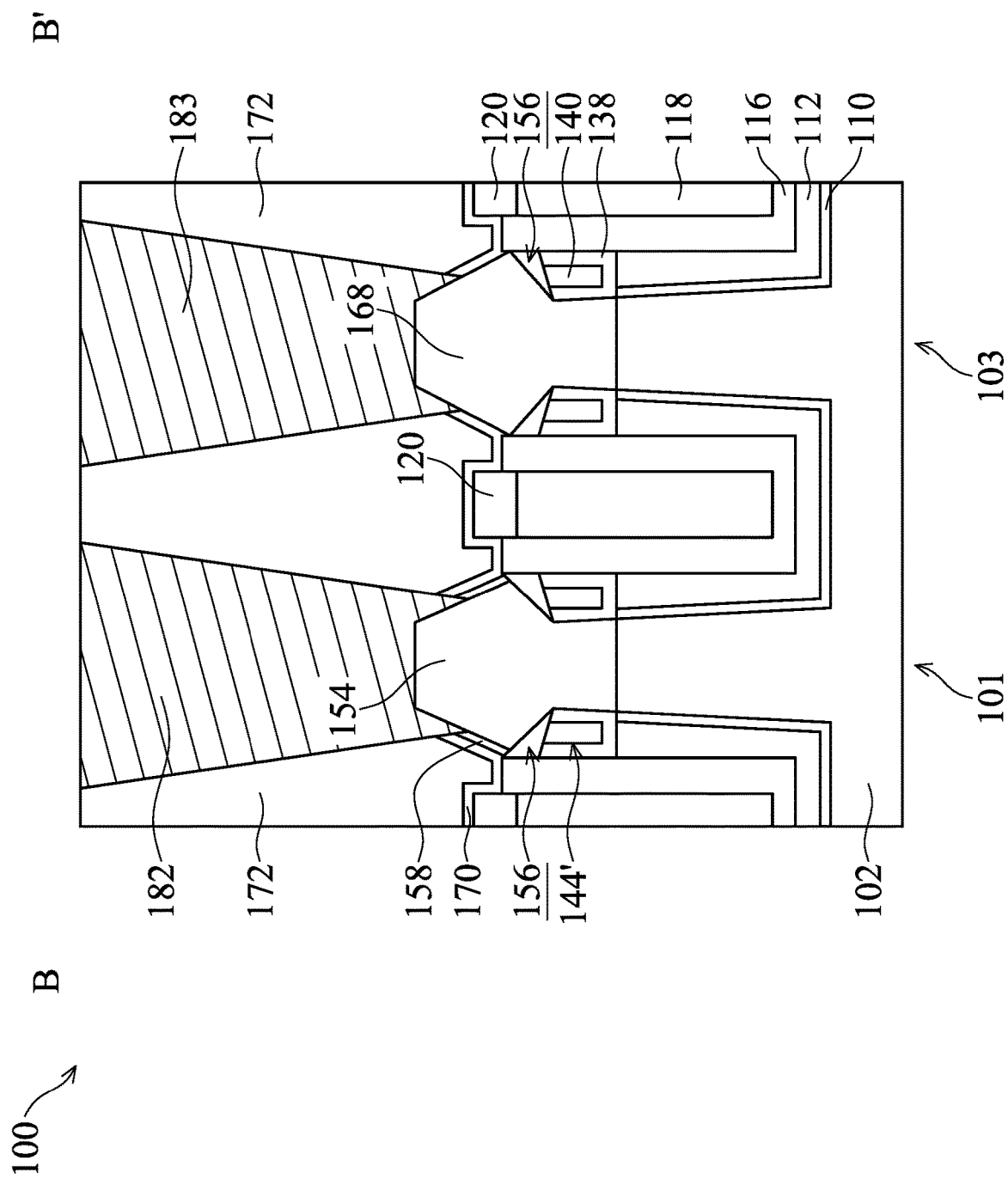

Next, first contact openings 180 and second contact opening 181 are formed through the interlayer dielectric layer 172, as shown in FIGS. 2R and 3R in accordance with some embodiments. More specifically, the first contact openings 180 are formed through the interlayer dielectric layer 172, the contact etch stop layer 170, and the Si layer 158, and the second contact opening 181 are formed through the interlayer dielectric layer 172 and the contact etch stop layer 170 in accordance with some embodiments.

The first contact openings 180 and the second contact opening 181 may be formed using a photolithography process and an etching process. The first contact openings 180 and the second contact opening 181 expose the upper surfaces of the first source/drain structures 154 and the second source/drain structures 168 in accordance with some embodiments. In addition, some portions of the first source/drain structures 154 and the second source/drain structures 168 exposed by the first contact openings 180 and the second contact opening 181 may also be etched during the etching process.

After the first contact openings 180 and the second contact opening 181 are formed to expose the first source/drain structures 154 and the second source/drain structures 168, first contacts 182 and second contacts 183 are formed in the first contact openings 180 and the second contact opening 181 respectively, as shown in FIGS. 2S and 3S in accordance with some embodiments.

More specifically, the first contacts 182 are formed through and in direct contact with the interlayer dielectric layer 172, the contact etch stop layer 170, and the Si layer 158, as shown in FIG. 2S in accordance with some embodiments. In addition, the contact etch stop layer 170 and the Si layer 158 are sandwiched between the gate spacers 142 and the first contacts 182 in accordance with some embodiments. Furthermore, since the Si layer 158 is only formed in the first region 101 but not in the second region 103, the bottommost part of the contact etch stop layer 170 at the first region 101 is higher than the bottommost part of the contact etch stop layer 170 at the second region 103 in accordance with some embodiments.

In some embodiments, the first contacts 182 and the second contacts 183 are made of a conductive material including aluminum (Al), copper (Cu), tungsten (W), titanium (Ti), tantalum (Ta), titanium nitride (TiN), cobalt, tantalum nitride (TaN), nickel silicide (NiS), cobalt silicide (CoSi), copper silicide, tantulum carbide (TaC), tantulum silicide nitride (TaSiN), tantalum carbide nitride (TaCN), titanium aluminide (TiAl), titanium aluminum nitride (TiAlN), other applicable conductive materials, or a combination thereof.

The first contacts 182 and the second contacts 183 may further include a liner and/or a barrier layer. For example, a liner (not shown) may be formed on the sidewalls and bottom of the contact trench. The liner may be made of silicon nitride, although any other applicable dielectric may be used as an alternative. The liner may be formed using a plasma enhanced chemical vapor deposition (PECVD) process, although other applicable processes, such as physical vapor deposition or a thermal process, may be used as an alternative. The barrier layer (not shown) may be formed over the liner (if present) and may cover the sidewalls and bottom of the opening. The barrier layer may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. The barrier layer may be made of tantalum nitride, although other materials, such as tantalum, titanium, titanium nitride, or the like, may also be used.

As described above, during the manufacturing processes of the semiconductor structure 100, the Si layer 158 and the SiGe layer 160 are formed over the first source/drain structures 154 in the first region 101, so that the oxide layers 164 can be self-aligned to the first source/drain structures 154 as masks when the second source/drain structures 168 are grown in the second trenches 147 in accordance with some embodiments. Accordingly, addition mask layers using complicated alignment procedures for forming the second source/drain structures 168 are not required. In addition, risks for mis-alignment may be reduced. Therefore, the yield and the performance of the manufacturing processes of the semiconductor structure 100 may be improved.

Figure 4A:
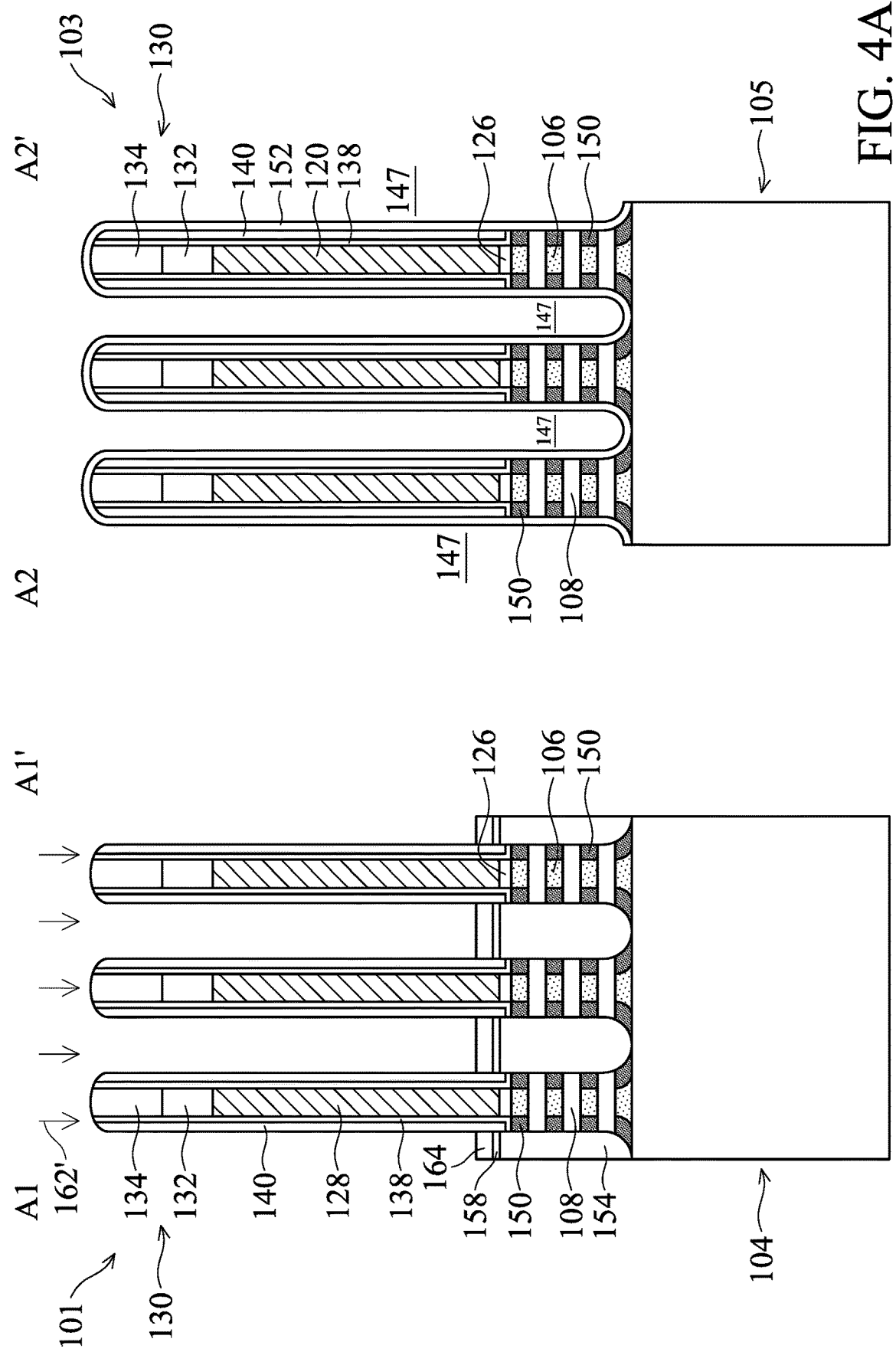
FIGS. 4A and 4B illustrate cross-sectional representations of various stages of manufacturing the semiconductor structure in accordance with some embodiments.
Figure 4B:
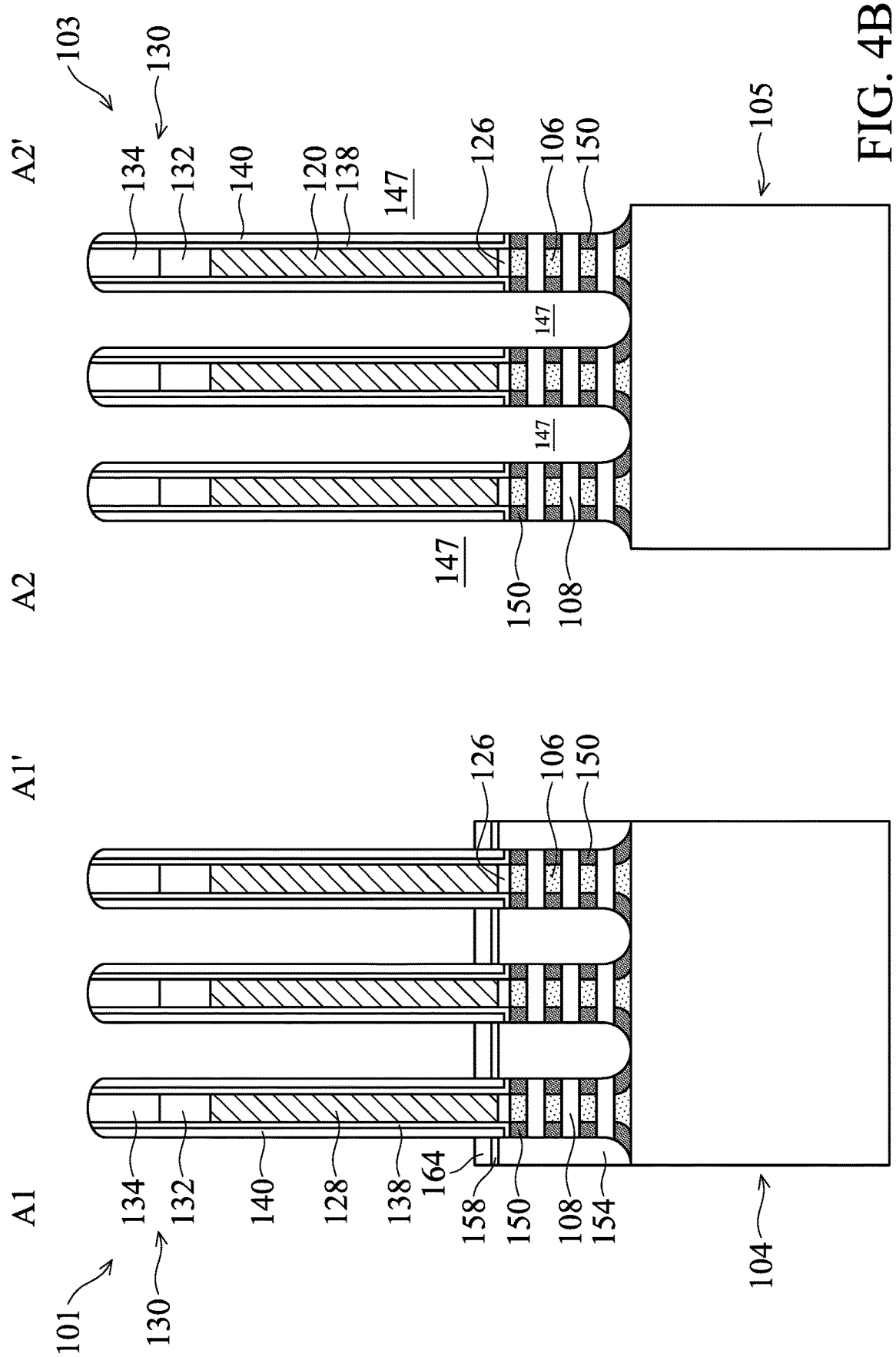
Figure 5A:
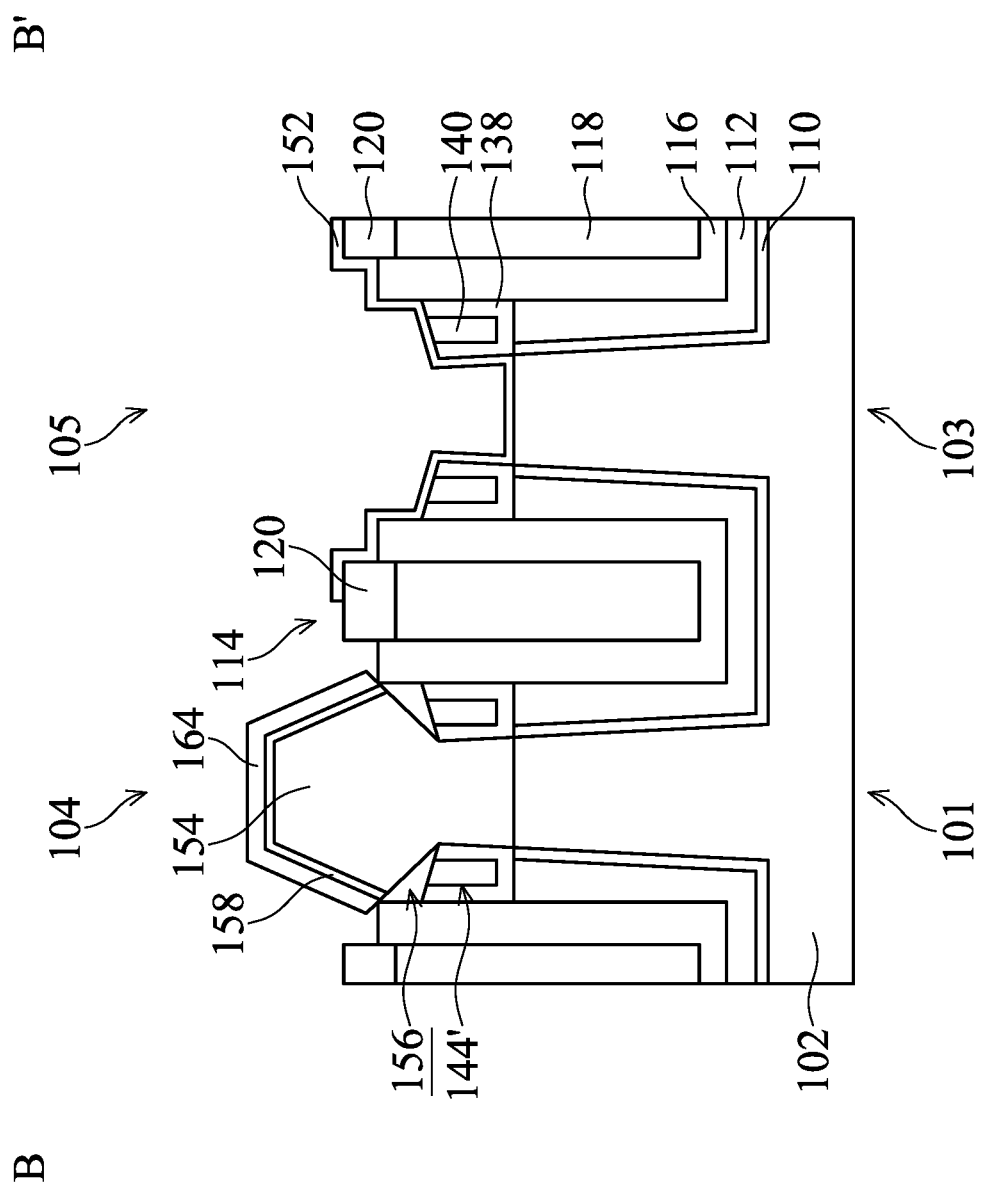
FIGS. 5A and 5B illustrate cross-sectional representations of various stages of manufacturing the semiconductor structure in accordance with some embodiments.
Figure 5B:
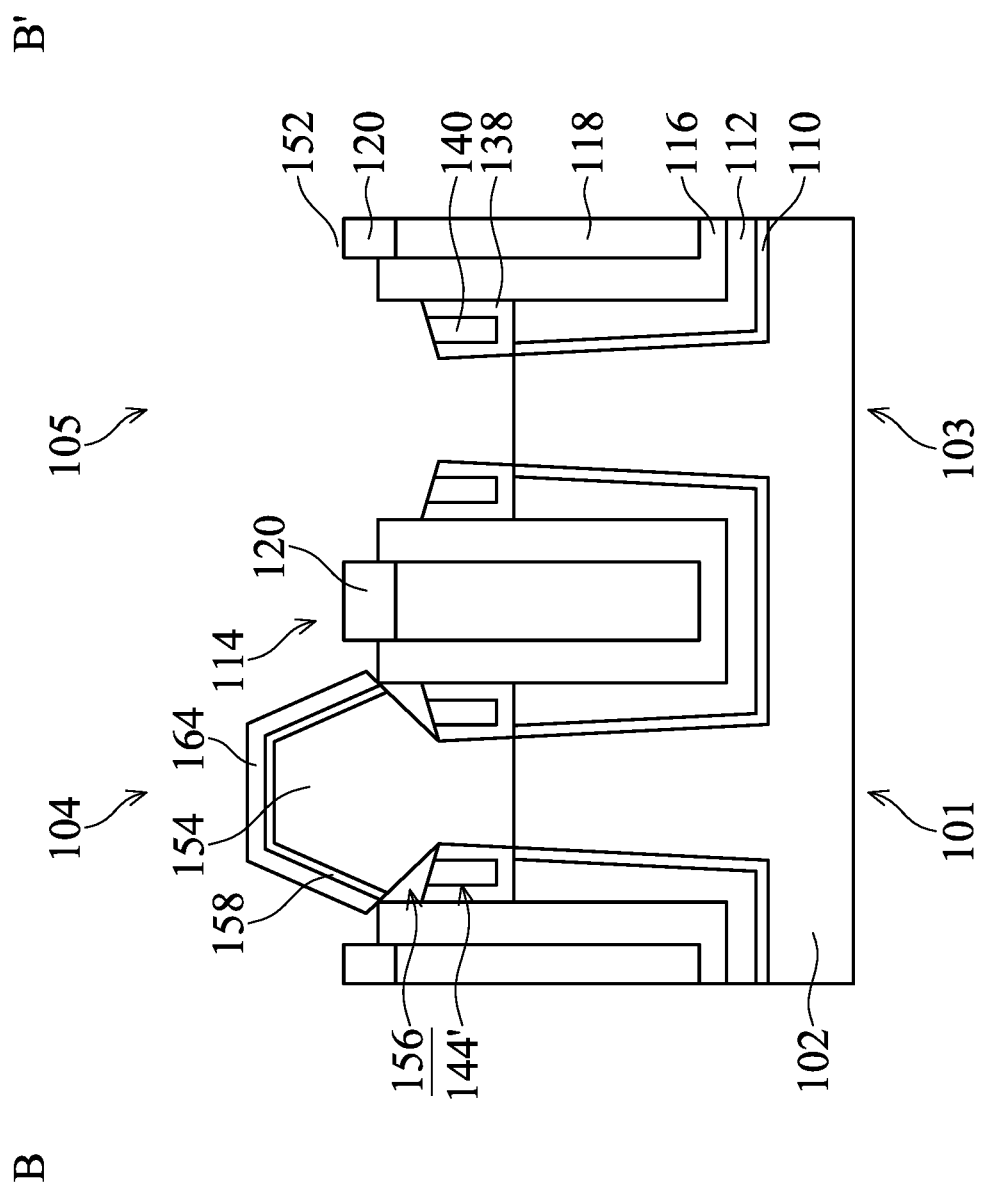

Although the oxidization process 162 is performed after the mask layer 152 is completely removed, as shown in FIGS. 2K and 2L, it may be performed before the mask layer 152 is removed. More specifically, after the processes shown in FIGS. 2A to 2J and 3A to 3J are performed, the oxidization process 162 may be performed to form the oxide layer 164, as shown in FIGS. 4A and 5A in accordance with some embodiments. Afterwards, the mask layer 152 is completely removed, as shown in FIGS. 4B and 5B in accordance with some embodiments.

In addition, since the mask layer 152 is removed after the oxide layer 164 is formed, the etching selectivity toward the mask layer 152 and the oxide layer 164 should be relatively high. For example, the mask layer 152 is not made of oxide but is made of nitride. After the mask layer 152 is removed, processes shown in FIGS. 2M to 2S and 3M to 3S described above may be performed to manufacture the semiconductor structure 100. Processes and materials for performing the processes shown in FIGS. 4A, 4B, 5A, and 5B may be similar to, or the same as, those shown in FIGS. 1A to 1C, 2A to 2S, and 3A to 3S and are not repeated herein.

Figure 6A:
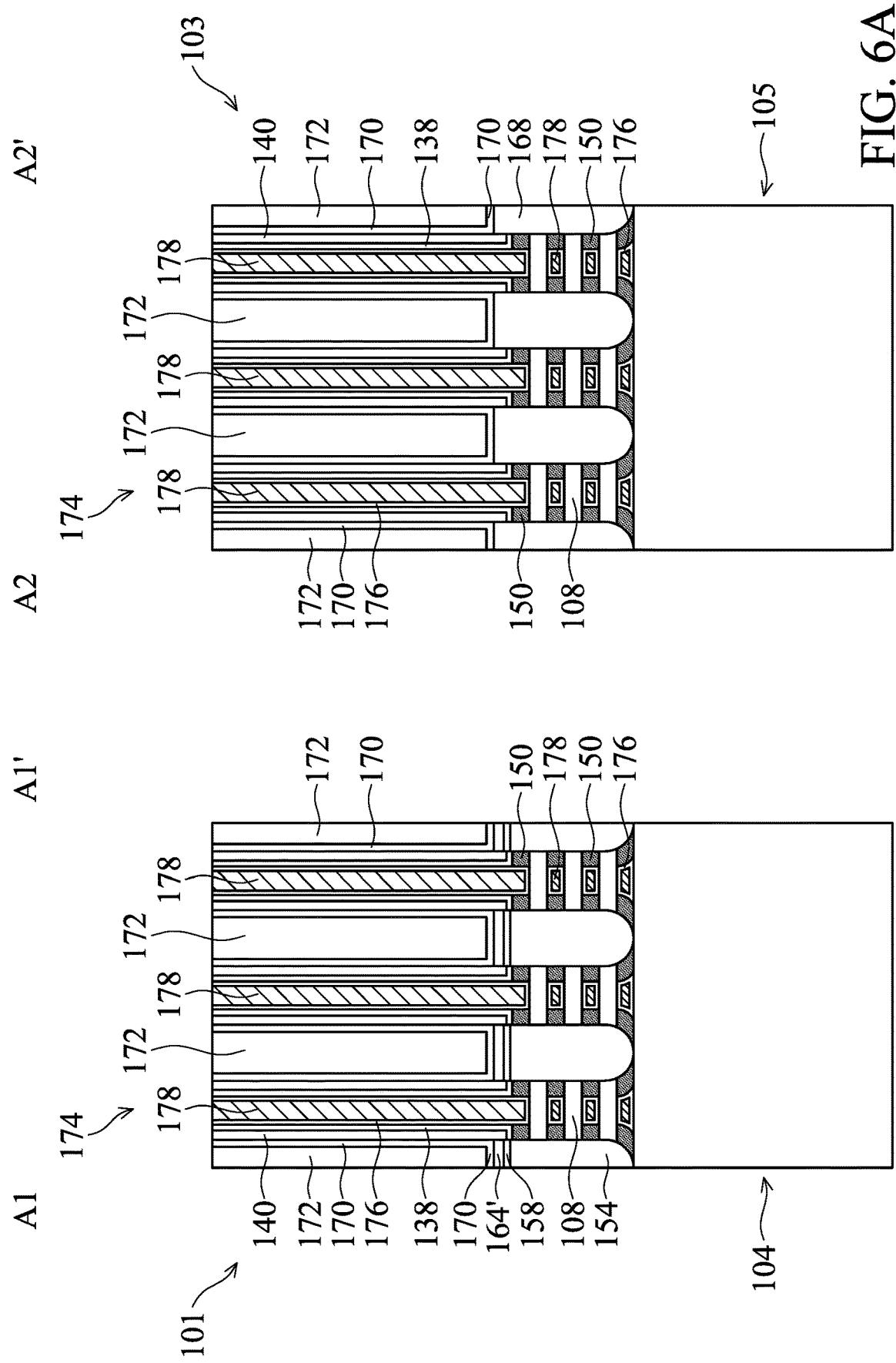
FIGS. 6A and 6B illustrate cross-sectional representations of various stages of manufacturing the semiconductor structure in accordance with some embodiments.
Figure 6B:
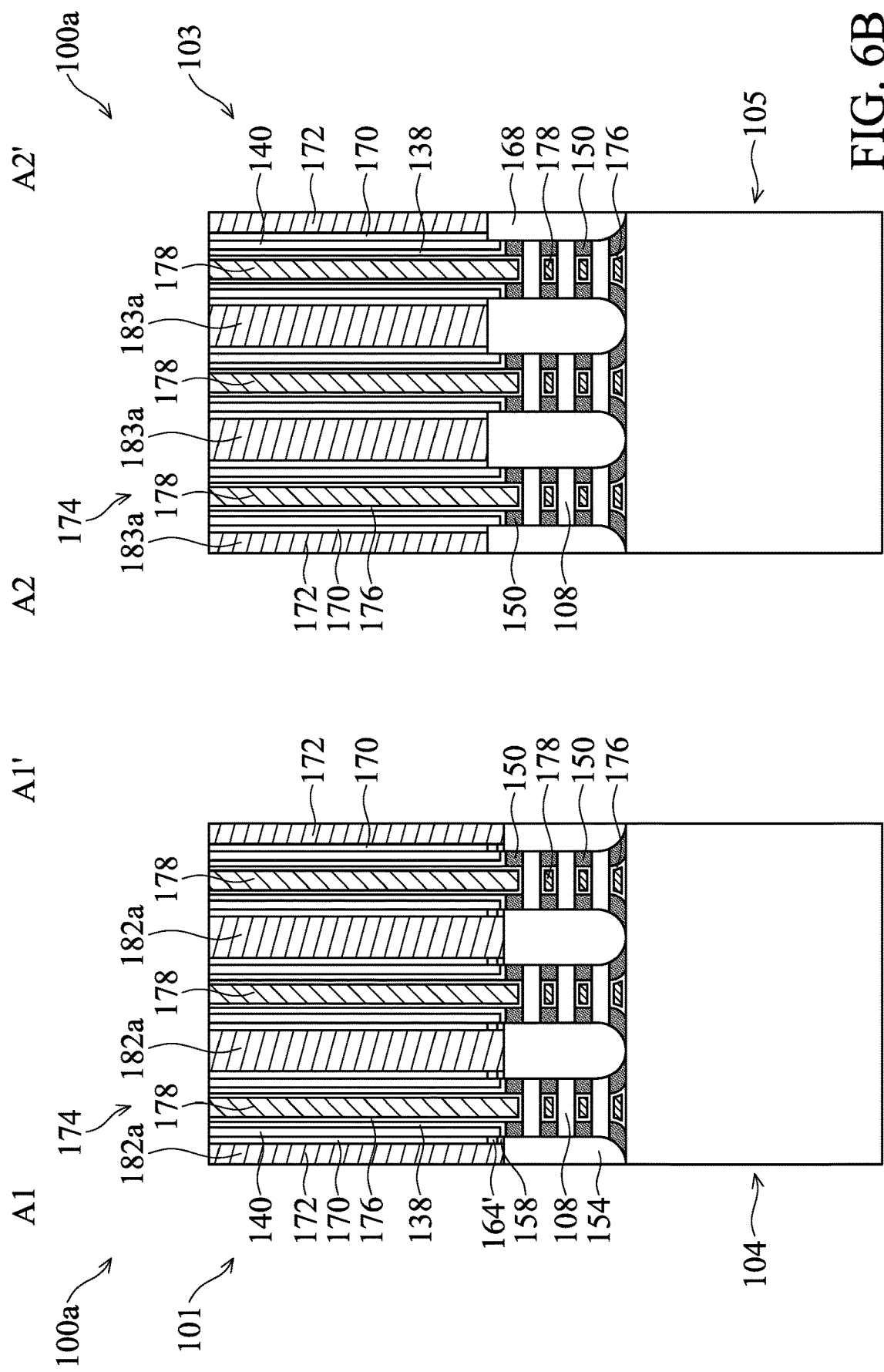
Figure 7A:
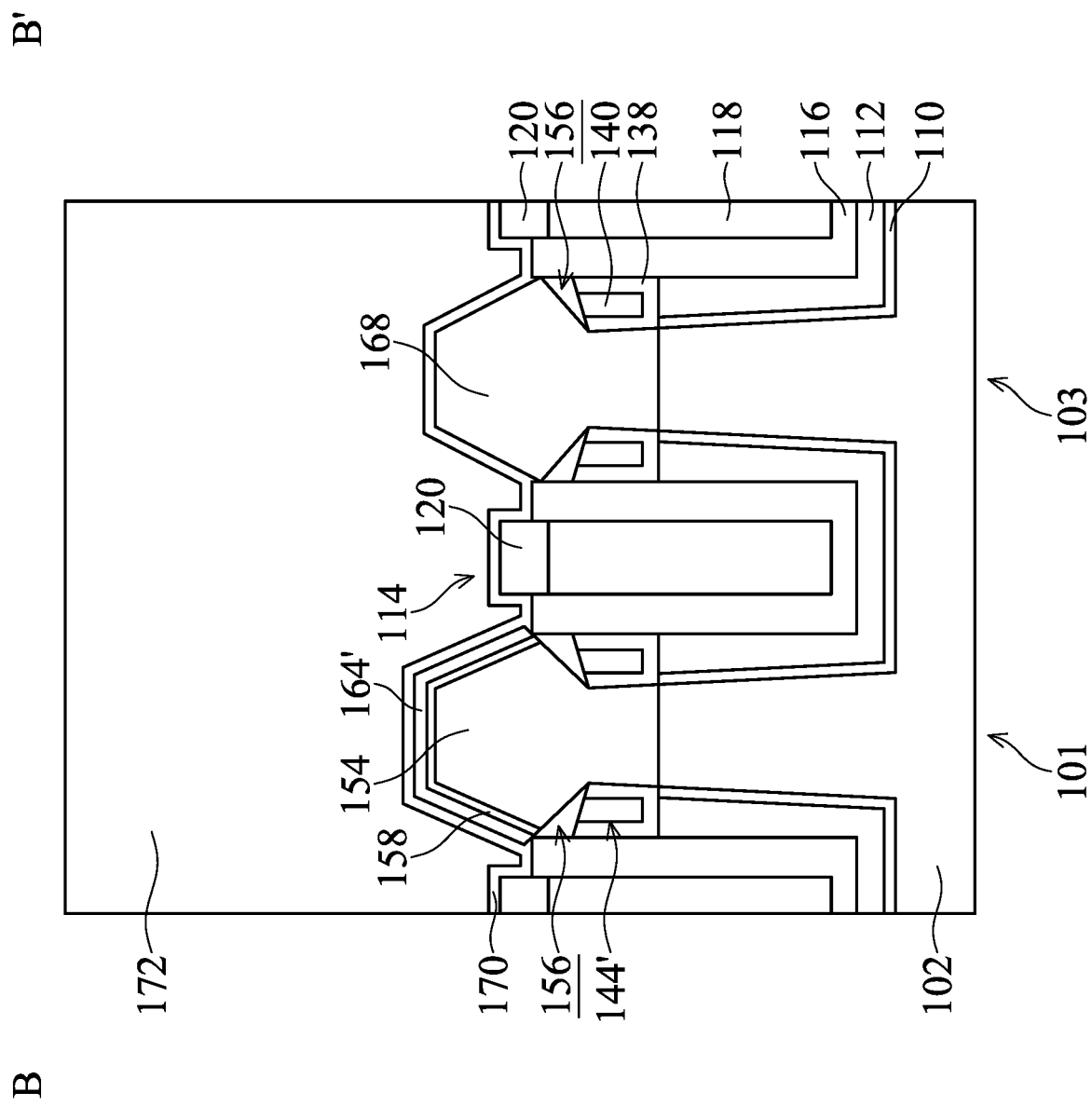
FIGS. 7A and 7B illustrate cross-sectional representations of various stages of manufacturing the semiconductor structure in accordance with some embodiments.
Figure 7B:
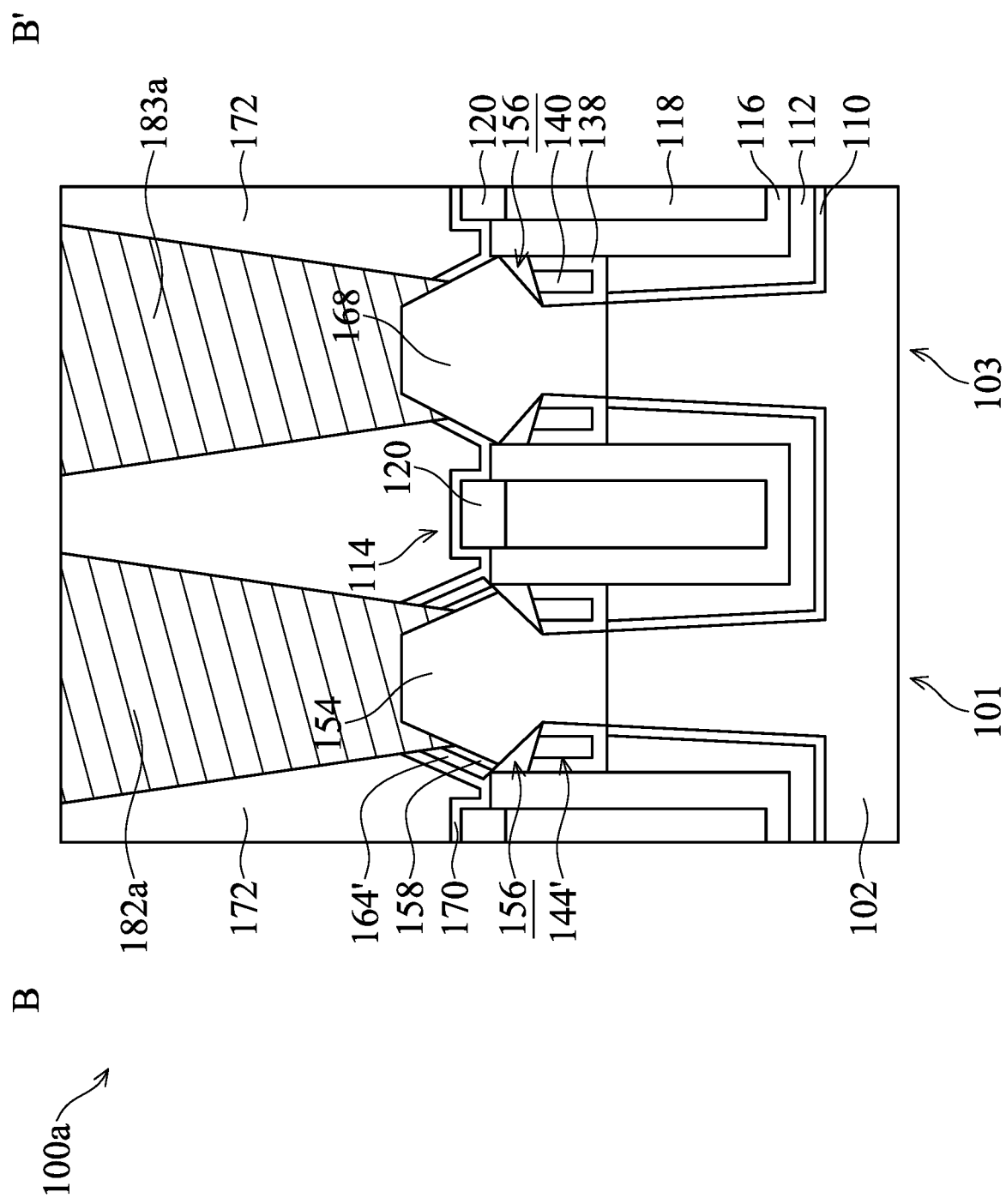

FIGS. 6A and 6B illustrate cross-sectional representations of various stages of manufacturing the semiconductor structure 100a in accordance with some embodiments. FIGS. 7A and 7B illustrate cross-sectional representations of various stages of manufacturing the semiconductor structure 100a in accordance with some embodiments. Processes and materials for forming the semiconductor structure 100a are substantially similar to, or the same as, those shown in FIGS. 2A to 2S and 3A to 3S, except that the oxide layers 164 are not removed before the contact etch stop layer 170 is formed in accordance with some embodiments. Processes and materials similar to, or the same as, those shown in FIGS. 2A to 2S and 3A to 3S and described previously are not repeated herein.

More specifically, after the processes shown in FIGS. 2A to 2N and 3A to 3N are performed, the contact etch stop layer 170 and the interlayer dielectric layer 172 are formed without removing the oxide layer 164' first, as shown in FIGS. 6A and 7A in accordance with some embodiments. That is, in the first region, the contact etch stop layer 170 is formed directly over the oxide layer 164' in accordance with some embodiments.

Afterwards, processes shown in FIGS. 2P to 2S and 3P to 3S described above may be performed to form first contacts 182a and second contacts 183a in the semiconductor structure 100a, as shown in FIGS. 6B and 7B in accordance with some embodiments. As shown in FIGS. 6B and 7B, the first contacts 182a are formed through and in direct contact with the interlayer dielectric layer 172, the contact etch stop layer 170, the oxide layer 164', and the Si layer 158 in accordance with some embodiments. In addition, the contact etch stop layer 170, the oxide layer 164', and the Si layer 158 are sandwiched between the gate spacers 142 and the first contacts 182a in accordance with some embodiments. Furthermore, since the Si layer 158 and the oxide layer 164' are only formed in the first region 101 but not in the second region 103, the bottommost part of the contact etch stop layer 170 at the first region 101 is higher than the bottommost part of the contact etch stop layer 170 at the second region 103 in accordance with some embodiments.

Figure 8A:
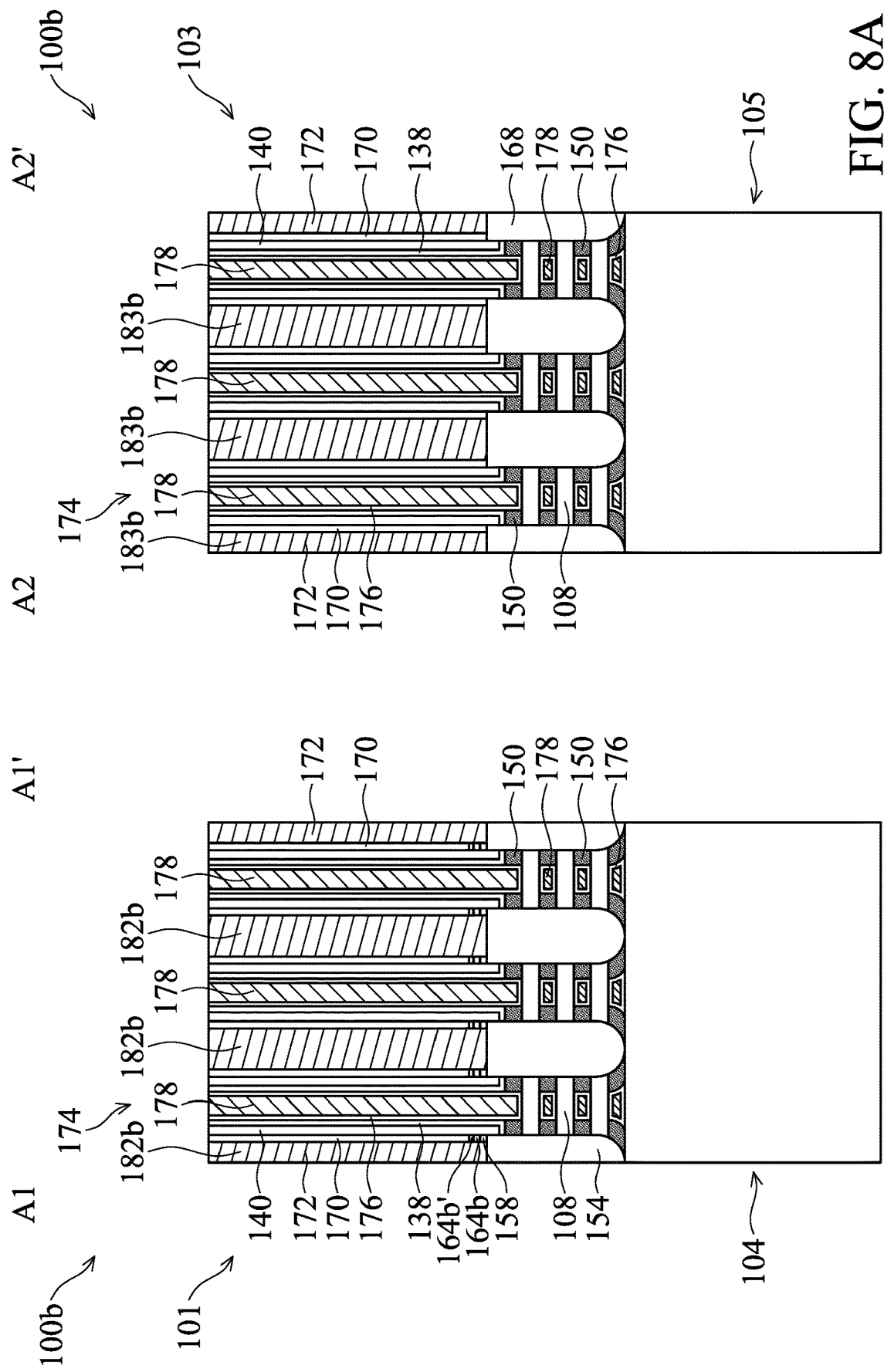
FIGS. 8A and 8B illustrate two cross-sectional representations of a semiconductor structure in accordance with some embodiments.
Figure 8B:
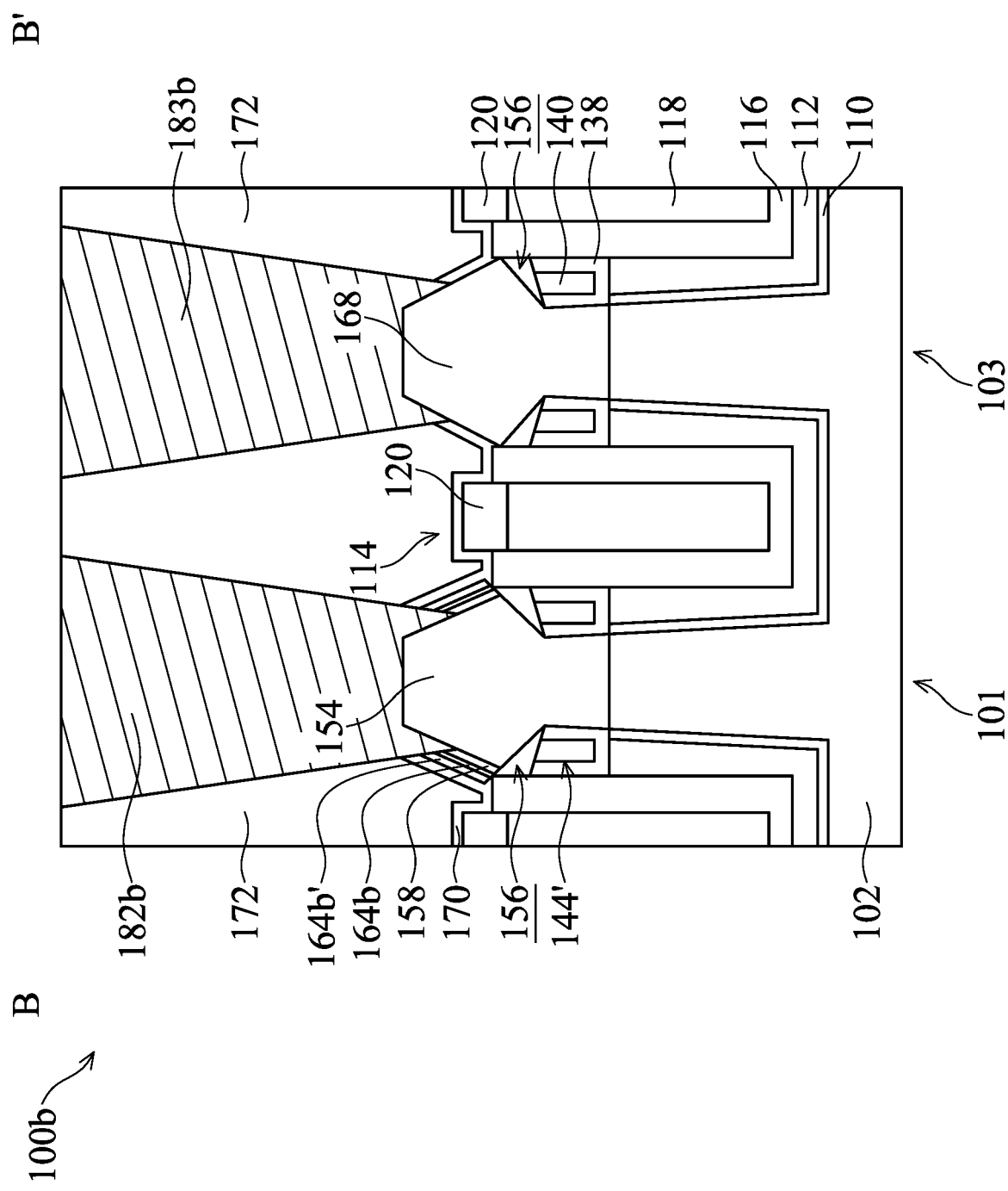

FIGS. 8A and 8B illustrate two cross-sectional representations of a semiconductor structure 100b in accordance with some embodiments. Processes and materials for forming the semiconductor structure 100b are substantially similar to, or the same as, those for forming the semiconductor structure 100a, except that a high Ge layer 164b is formed between an oxide layer 164b' and the Si layer 158 in accordance with some embodiments. Processes and materials similar to, or the same as, those shown in FIGS. 2A to 2S, 3A to 3S, 6A, 6B, 7A, and 7B and described previously are not repeated herein.

More specifically, the processes shown in FIGS. 2A to 2L and 3A to 3L may be performed, and the scavenging process 166 may be performed. During the scavenging process 166, the Ge atoms in the oxide layer 164 may be diffused to a region near an interface between the oxide layer 164 and the Si layer 158, such that the high Ge layer 164b and the fully oxidized oxide layer 164b' are formed in accordance with some embodiments. In some embodiments, the oxide layer 164b' is thicker than the high Ge layer.

Next, the processes shown in FIGS. 2N to 2S and 3N to 3S described above may be performed to form first contacts 182b and second contacts 183b in the semiconductor structure 100b except that the oxide layer 164b' and the high Ge layer 164b are not removed, as shown in FIGS. 8A and 8B in accordance with some embodiments.

As shown in FIGS. 8A and 8B, the first contacts 182b are formed through and in direct contact with the interlayer dielectric layer 172, the contact etch stop layer 170, the oxide layer 164b', the high Ge layer 164b, and the Si layer 158 in accordance with some embodiments. In addition, the contact etch stop layer 170, the oxide layer 164b', the high Ge layer 164, and the Si layer 158 are sandwiched between the gate spacers 142 and the first contacts 182b in accordance with some embodiments. Furthermore, since the Si layer 158, the high Ge layer 164, and the oxide layer 164b' are only formed in the first region 101 but not in the second region 103, the bottommost part of the contact etch stop layer 170 at the first region 101 is higher than the bottommost part of the contact etch stop layer 170 at the second region 103 in accordance with some embodiments.

Figure 9A:
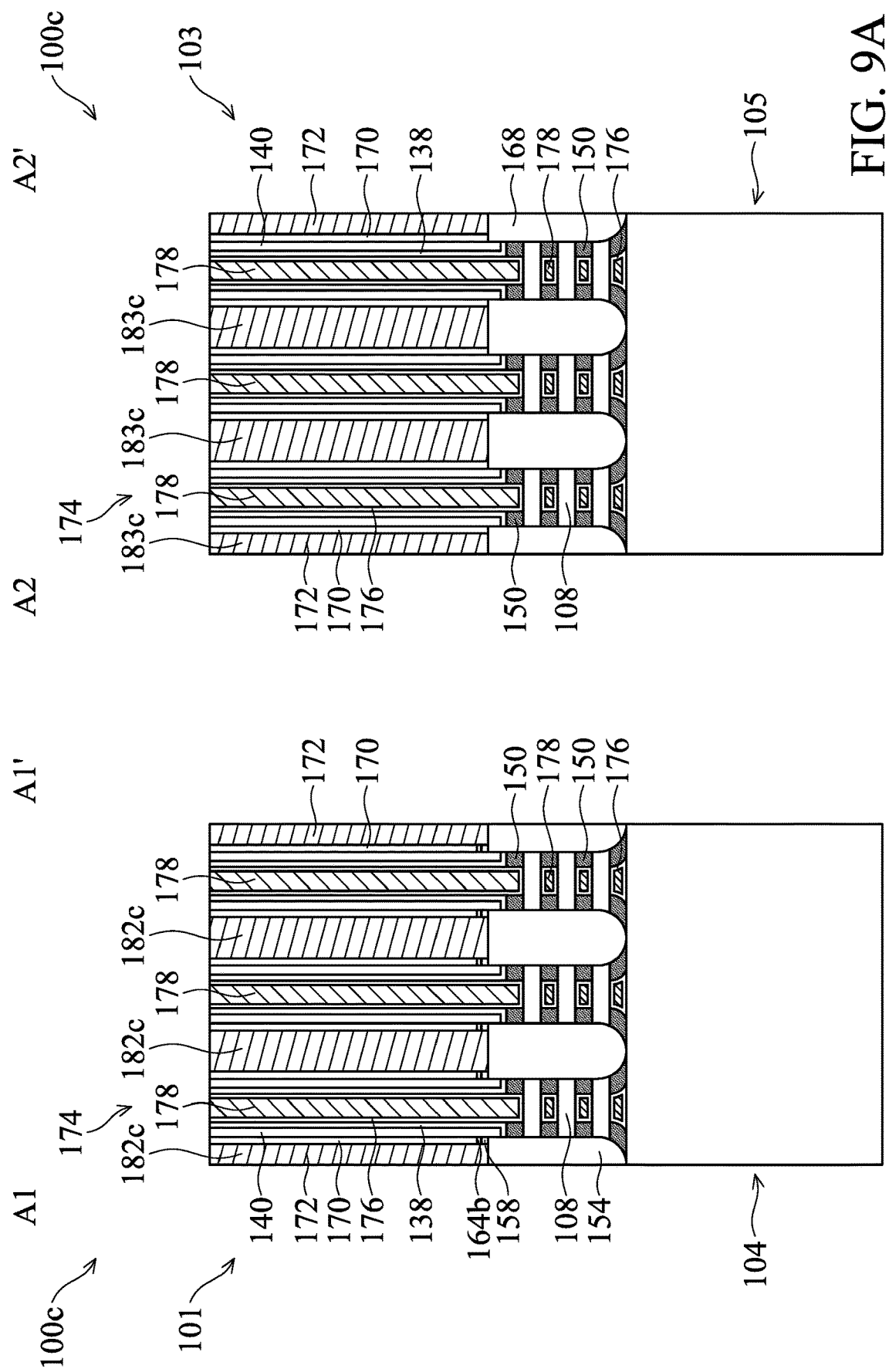
FIGS. 9A and 9B illustrate two cross-sectional representations of a semiconductor structure in accordance with some embodiments.
Figure 9B:
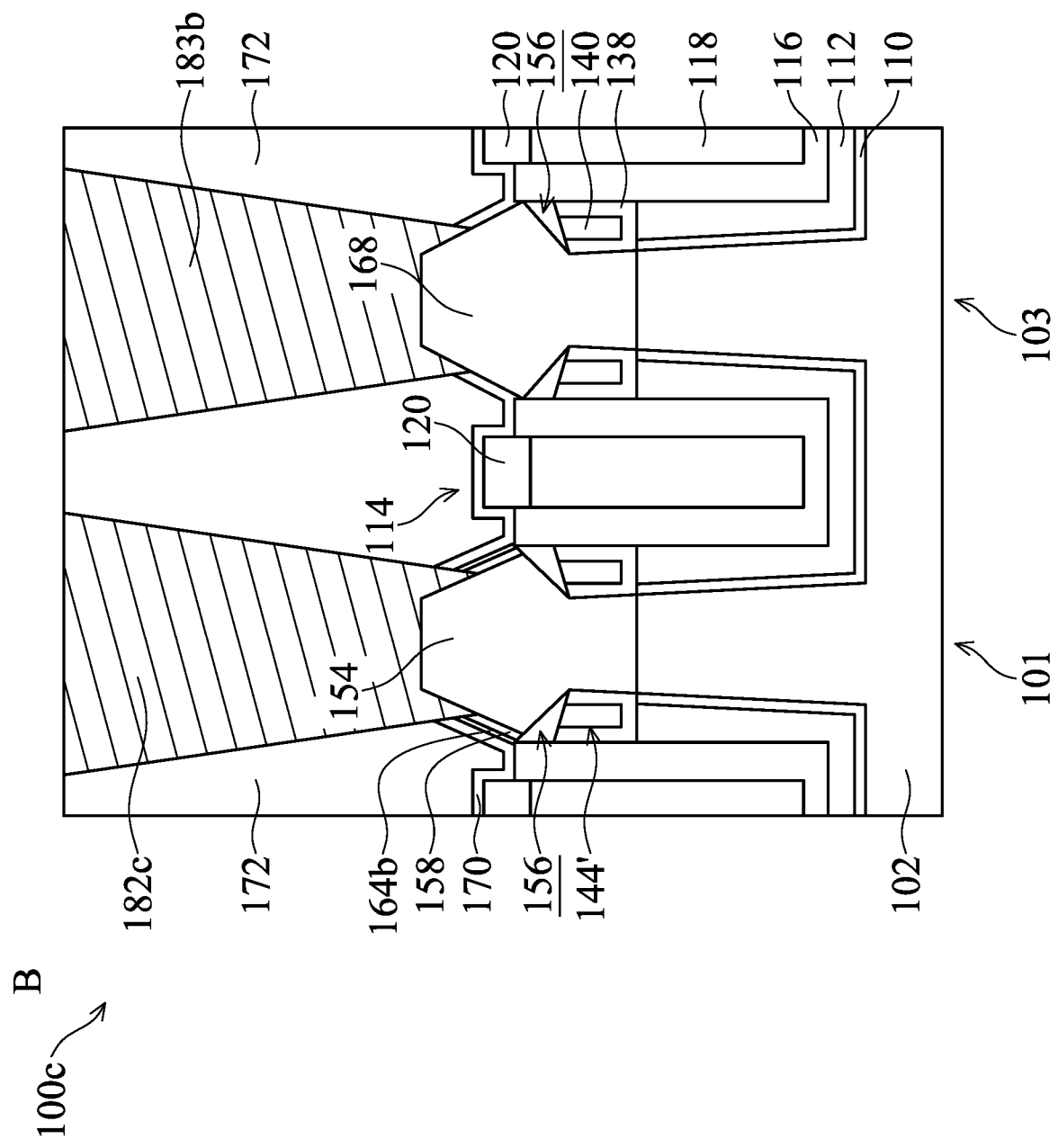

FIGS. 9A and 9B illustrate two cross-sectional representations of a semiconductor structure 100c in accordance with some embodiments. Processes and materials for forming the semiconductor structure 100c are substantially similar to, or the same as, those for forming the semiconductor structure 100b, except the oxide layer 164b' is removed in accordance with some embodiments. Processes and materials similar to, or the same as, those shown in FIGS. 2A to 2S, 3A to 3S, 8A, and 8B and described previously are not repeated herein.

More specifically, the oxide layer 164b', the high Ge layer 164b, and the Si layer 158 are formed as described previously. Afterwards, the processes shown in FIGS. 2N to 2S and 3N to 3S described above may be performed to form first contacts 182c and second contacts 183c in the semiconductor structure 100c while the high Ge layer 164b is not removed, as shown in FIGS. 9A and 9B in accordance with some embodiments.

As shown in FIGS. 9A and 9B, the first contacts 182c are formed through and in direct contact with the interlayer dielectric layer 172, the contact etch stop layer 170, the high Ge layer 164b, and the Si layer 158 in accordance with some embodiments. In addition, the contact etch stop layer 170, the high Ge layer 164, and the Si layer 158 are sandwiched between the gate spacers 142 and the first contacts 182c in accordance with some embodiments. Furthermore, since the Si layer 158 and the high Ge layer 164 are only formed in the first region 101 but not in the second region 103, the bottommost part of the contact etch stop layer 170 at the first region 101 is higher than the bottommost part of the contact etch stop layer 170 at the second region 103 in accordance with some embodiments.

Figure 10A:
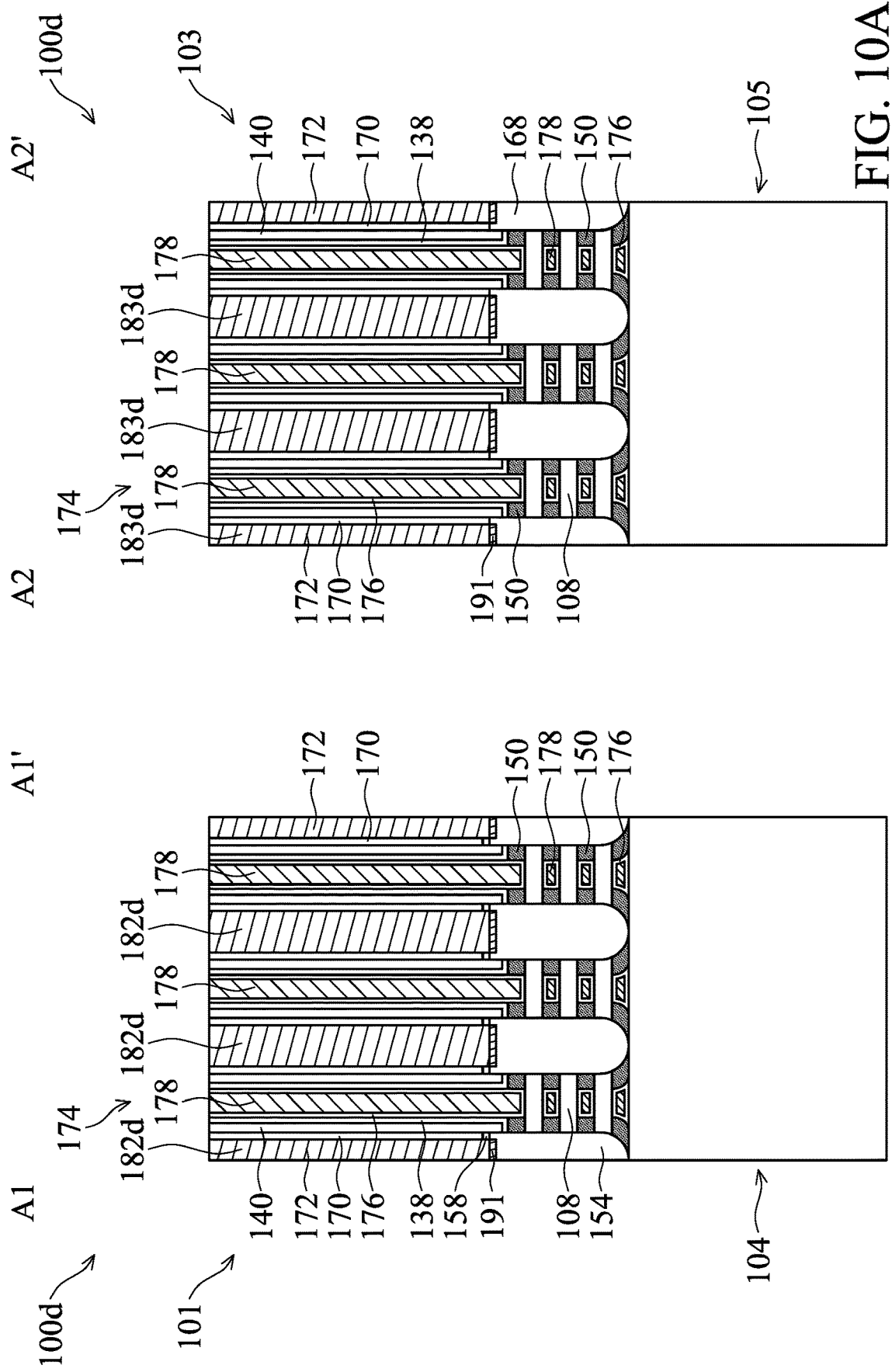
FIGS. 10A and 10B illustrate two cross-sectional representations of a semiconductor structure in accordance with some embodiments.
Figure 10B:
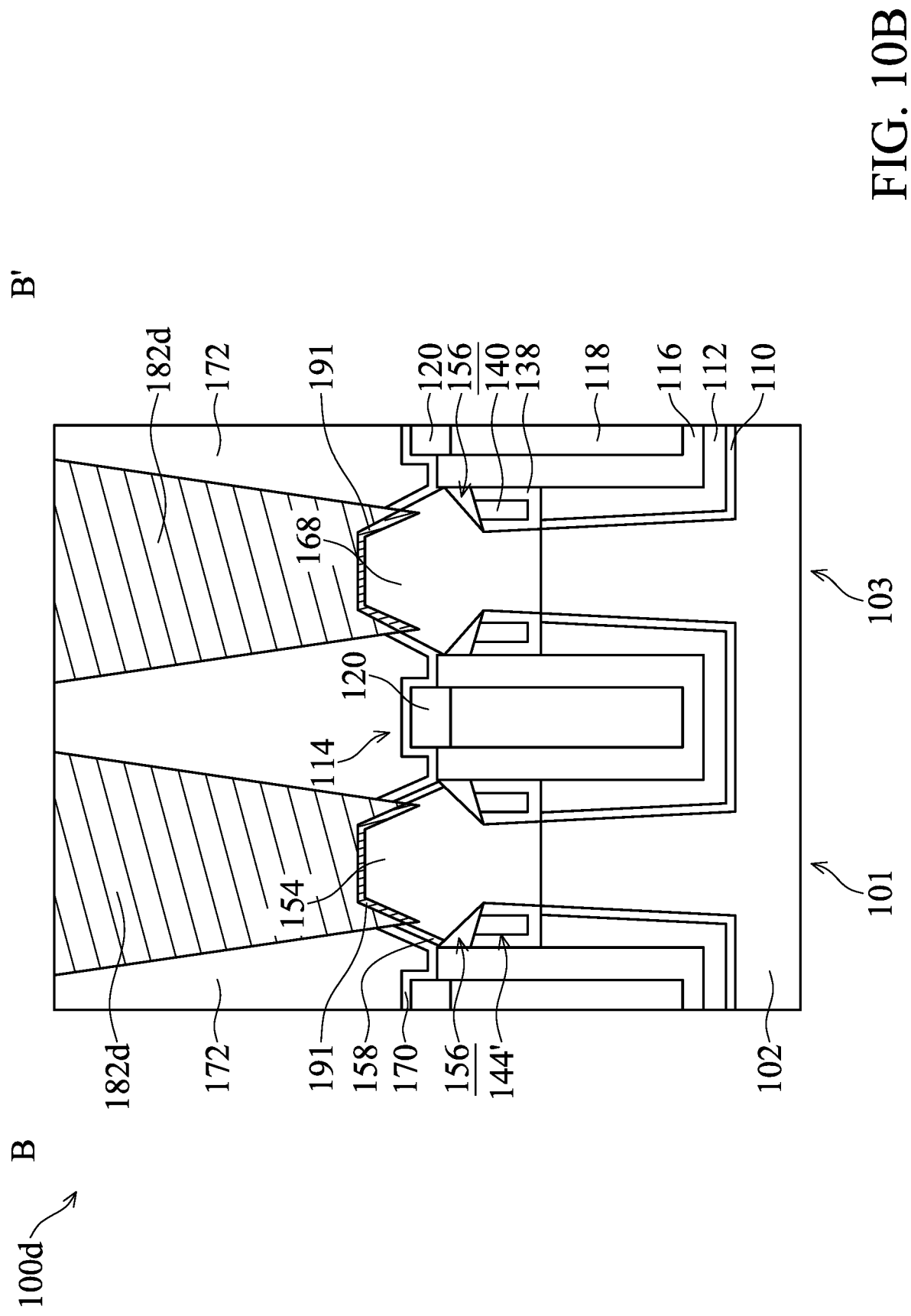

FIGS. 10A and 10B illustrate two cross-sectional representations of a semiconductor structure 100d in accordance with some embodiments. Processes and materials for forming the semiconductor structure 100d are substantially similar to, or the same as, those for forming the semiconductor structure 100a, except that silicide layers 191 are formed before first contacts 182c and second contacts 183c are formed in accordance with some embodiments. Processes and materials similar to, or the same as, those shown in FIGS. 2A to 2S and 3A to 3S and described previously are not repeated herein.

More specifically, the processes shown in FIGS. 2A to 2R and 3A to 3R may be performed. Next, the silicide layers 191 are formed over the first source/drain structures 154 and the second source/drain structures 168 before first contacts 182d and second contacts 183d are formed, as shown in FIGS. 10A and 10B in accordance with some embodiments.

The silicide layers 191 may be formed by forming a metal layer over the top surface of the first source/drain structures 154 and the second source/drain structures 168 and annealing the metal layer so the metal layer reacts with the source/drain structures 118 to form the silicide layers 191. The unreacted metal layer may be removed after the silicide layers 191 are formed. Afterwards, the processes shown in FIGS. 2S and 3S may be performed to form the semiconductor structure 100d.

Figure 11:
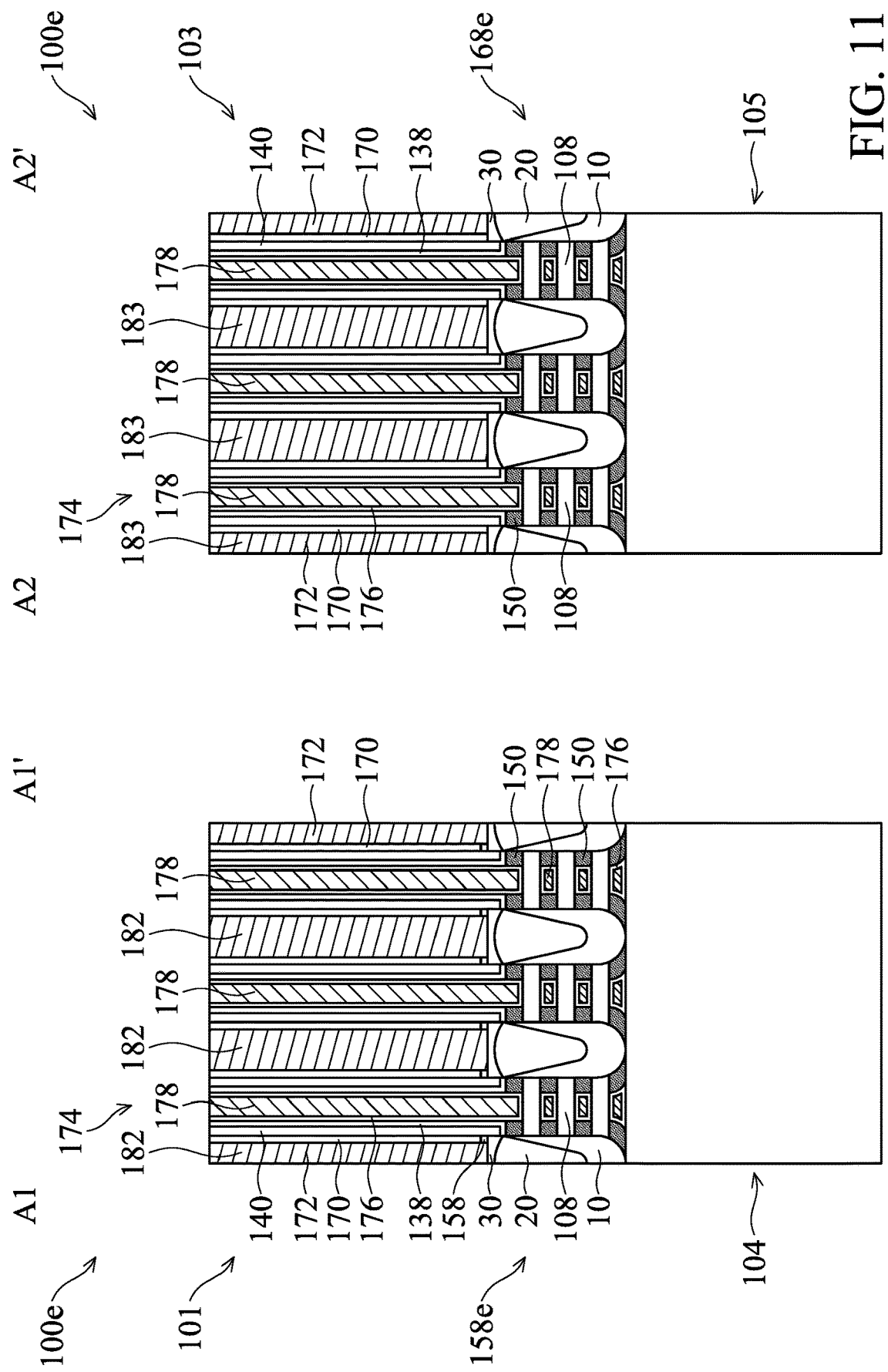
FIG. 11 illustrates a cross-sectional representation of a semiconductor structure in accordance with some embodiments.

FIG. 11 illustrates a cross-sectional representation of a semiconductor structure 100e in accordance with some embodiments. Processes and materials for forming the semiconductor structure 100e are substantially similar to, or the same as, those for forming the semiconductor structure 100a, except that first source/drain structures 154e and second source/drain structures 168e include multiple layers in accordance with some embodiments.

More specifically, the first source/drain structures 154e and second source/drain structures 168e individually includes a first epi layer 10, a second epi layer 20, and a third epi layer 30 in accordance with some embodiments. In some embodiments, the first epi layer 10, the second epi layer 20, and the third epi layer 30 are all SiGe layer but the concentration of Ge in each layer are different. In some embodiments, the concentration of Ge in the second epi layer 20 is greater than the concentration of Ge in the first epi layer 10 and is also greater than the concentration of Ge in the third epi layer 30.

Generally, when source/drain structures are formed in different regions, multiple alignment processes may be required to protect the source/drain structures formed in one region when the source/drain structures in the other region are formed. As described above, since the Si layer (e.g. the Si layer 158) is grown only on the first source/drain structures (e.g. the first source/drain structures 154), the Si layer is self-aligned to the first source/drain structures, and therefore additional alignment process is not required in accordance with some embodiments. Similarly, the SiGe layer (e.g. the SiGe layer 160) will only be grown in the Si layer, and therefore, it is also self-aligned to the first source/drain structures in accordance with some embodiments. Furthermore, the oxide layer (e.g. the oxide layer 164) is formed by oxidized the SiGe layer, and therefore the oxide layer is also self-aligned to the first source/drain structures in accordance with some embodiments. That is, the oxide layer used as the mask for forming the second source/drain structures (e.g. the second source/drain structures 168) are formed without using complicated alignment processes. Accordingly, the manufacturing processes for forming the semiconductor structures (e.g. the semiconductor structures 100 and 100a to 100e) may be simplified and the yield of the manufacturing processes may be improved.

As described above, during the manufacturing processes of the semiconductor structure 100, the Si layer 158 and the SiGe layer 160 are formed over the first source/drain structures 154 in the first region 101, so that the oxide layers 164 can be self-aligned to the first source/drain structures 154 as masks when the second source/drain structures 168 are grown in the second trenches 147 in accordance with some embodiments. Accordingly, addition mask layers using complicated alignment procedures for forming the second source/drain structures 168 are not required. In addition, risks for mis-alignment may be reduced. Therefore, the yield and the performance of the manufacturing processes of the semiconductor structure 100 may be improved.

Embodiments for forming semiconductor structures may be provided. The semiconductor structure may include nanowire structure, gate structures formed around the nanowire structures, and source/drain structures. Mask layers may be formed and self-aligned to the source/drain structures, so that the source/drain structures may be protected in subsequent manufacturing processes. Since the mask layers are formed by self-aligned processes, complicated alignment processes may not be required and the risks for mis-alignment may be reduced.

In some embodiments, a method for manufacturing a semiconductor structure is provided. The method for manufacturing the semiconductor structure includes alternately stacking first semiconductor material layers and second semiconductor layers in a first direction over a substrate and patterning the first semiconductor material layers and the second semiconductor layers to form a first fin structure longitudinally oriented along a second direction and a second fin structure longitudinally oriented along a second direction. In addition, the first fin structure and the second fin structure are spaced apart from each other in a third direction. The method for manufacturing the semiconductor structure also includes forming an insulating layer around the first fin structure and the second fin structure and forming a dielectric fin structure over the insulating layer and spaced apart from the first fin structure and the second fin structure in the third direction. The method for manufacturing the semiconductor structure also includes forming a first source/drain structure attached to the first fin structure in the second direction and forming a semiconductor layer covering the first source/drain structure in the first direction. The method for manufacturing the semiconductor structure also includes oxidizing the semiconductor layer to form an oxide layer and forming a second source/drain structure attached to the second fin structure in the second direction after the oxide layer is formed.

In some embodiments, a semiconductor structure is provided. The semiconductor structure includes a substrate and channel layers vertically stacked over the substrate in a first direction. The semiconductor structure also includes a first dielectric fin structure formed at a first side of the channel layers and longitudinally oriented along a second direction different from the first direction and a second dielectric fin structure formed at a first side of the channel layers and longitudinally oriented along the second direction. The semiconductor structure also includes a gate structure wrapping around the channel layers and longitudinally oriented along a third direction different from the first direction and the second direction and a source/drain structure attached to the channel layers and sandwiched between the first dielectric fin structure and the second dielectric fin structure. The semiconductor structure also includes a Si layer having a first portion sandwiched between the first dielectric fin structure and the source/drain structure and a second portion sandwiched between the second dielectric fin structure and the source/drain structure.

In some embodiments, a semiconductor structure is provided. The semiconductor structure includes first channel layers stacked along a first direction and second channel layers stacked along the first direction. The semiconductor structure also includes a first source/drain structure attaching to the first channel layers and a second source/drain structure attaching to the second channel layers. The semiconductor structure also includes a dielectric feature formed between the first source/drain structure and the second source/drain structure and extending along a second direction different from the first direction and a Si layer formed over the first source/drain structure. The semiconductor structure also includes a first contact formed over the first source/drain structure and in direct contact with the Si layer.

In some embodiments, a method for manufacturing a semiconductor structure is provided. The method for manufacturing the semiconductor structure includes forming nanowire structures over a substrate and forming a gate structure across nanowire structures. The method for manufacturing the semiconductor structure also includes forming a source/drain structure adjacent to the gate structure and forming a Si layer over the source/drain structure. The method for manufacturing the semiconductor structure also includes forming a SiGe layer over the Si layer and oxidizing the SiGe layer to form an oxide layer. The method for manufacturing the semiconductor structure also includes forming a contact through the Si layer over the source/drain structure.

In some embodiments, a method for manufacturing a semiconductor structure is provided. The method for manufacturing the semiconductor structure includes alternately stacking first semiconductor material layers and second semiconductor layers over a substrate and patterning the first semiconductor material layers and the second semiconductor layers to form a first fin structure in a first region of the substrate and a second fin structure in a second region of the substrate. The method for manufacturing the semiconductor structure also includes forming a gate structure across the first fin structure and the second fin structure and recessing the first fin structure and the second fin structure to form a first recess in the first region and a second recess in the second region. The method for manufacturing the semiconductor structure also includes forming a mask layer covering the second recess and the gate structure in the second region and forming a first source/drain structure in the first recess. The method for manufacturing the semiconductor structure also includes forming a Si layer over the source/drain structure and removing the mask layer. The method for manufacturing the semiconductor structure also includes forming an oxide layer over the Si layer and forming a second source/drain structure in the second recess.

In some embodiments, a semiconductor structure is provided. The semiconductor structure includes a substrate and first nanowire structures formed over the substrate. The semiconductor structure also includes a gate structure formed around the first nanowire structure and a source/drain structure formed adjacent to the gate structure. The semiconductor structure also includes a contact formed over the source/drain structure and a Si layer sandwiched between the gate structure and the contact.

In some embodiments, a semiconductor structure is provided. The semiconductor structure includes a substrate a substrate and channel layers vertically stacked over the substrate. The semiconductor structure also includes a dielectric fin structure formed adjacent to the channel layers and a gate structure abutting the channel layers and the dielectric fin structure. The semiconductor structure also includes a source/drain structure attached to the channel layers and a contact formed over the source/drain structure. The semiconductor structure also includes a Si layer covering a portion of a top surface of the source/drain structure. In addition, the Si layer is sandwiched between the dielectric fin structure and the contact.

In some embodiments, a semiconductor structure is provided. The semiconductor structure includes a channel layer extending along a first direction and a source/drain structure attaching to the channel layer. The semiconductor structure also includes dielectric features formed at opposite sides of the source/drain structure and extending along the first direction and a Si layer formed over the source/drain structure and sandwiched between the dielectric features along a second direction different from the first direction. The semiconductor structure also includes a contact formed though the Si layer and landing over the source/drain structure.

In some embodiments, a method for manufacturing a semiconductor structure is provided. The method for manufacturing the semiconductor structure includes alternately stacking first semiconductor material layers and second semiconductor layers over a substrate and patterning the first semiconductor material layers and the second semiconductor layers to form a first fin structure in a first region of the substrate and a second fin structure in a second region of the substrate. In addition, both of the first fin structure and the second fin structure extend along a first direction. The method for manufacturing the semiconductor structure also includes forming a gate structure across the first fin structure and the second fin structure and extending along a second direction different from the first direction and recessing the first fin structure and the second fin structure to form a first recess in the first region and a second recess in the second region. The method for manufacturing the semiconductor structure also includes forming a first source/drain structure in the first recess and forming a semiconductor layer over the first source/drain structure. The method for manufacturing the semiconductor structure also includes oxidizing the semiconductor layer to form an oxide layer and forming a second source/drain structure in the second recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    alternately stacking first semiconductor material layers and second semiconductor layers in a first direction over a substrate;
    patterning the first semiconductor material layers and the second semiconductor layers to form a first fin structure longitudinally oriented along a second direction and a second fin structure longitudinally oriented along a second direction, wherein the first fin structure and the second fin structure are spaced apart from each other in a third direction;
    forming an insulating layer around the first fin structure and the second fin structure;
    forming a dielectric fin structure over the insulating layer and spaced apart from the first fin structure and the second fin structure in the third direction;
    forming a first source/drain structure attached to the first fin structure in the second direction;
    forming a semiconductor layer covering the first source/drain structure in the first direction;
    oxidizing the semiconductor layer to form an oxide layer; and
    forming a second source/drain structure attached to the second fin structure in the second direction after the oxide layer is formed.

2. The method for manufacturing the semiconductor structure as claimed in claim 1, further comprising:
    recessing the insulating layer after forming the dielectric fin structure, wherein a top surface of the dielectric fin structure, a top surface of the insulating layer, and a top surface of the first fin structure are substantially level with each other before recessing the insulating layer, and the top surface of the insulating layer is lower than the top surface of the dielectric fin structure and the top surface of the first fin structure after recessing the insulating layer.

3. The method for manufacturing the semiconductor structure as claimed in claim 2, further comprising:
  forming a first fin spacer and a second fin spacer over the insulating layer after recessing the insulating layer,
  wherein the first fin spacer is sandwiched between the first fin structure and the dielectric fin structure in the third direction, and the second fin spacer is sandwiched between the second fin structure and the dielectric fin structure in the third direction.

4. The method for manufacturing the semiconductor structure as claimed in claim 1, further comprising:
  removing the oxide layer after forming the second source/drain structure.

5. The method for manufacturing the semiconductor structure as claimed in claim 1, further comprising:
  forming a mask layer covering the second fin structure and a portion of the dielectric fin structure.

6. The method for manufacturing the semiconductor structure as claimed in claim 5, further comprising:
  forming a Si layer over the first source/drain structure before forming the semiconductor layer; and
  removing the mask layer after forming the semiconductor layer.

7. The method for manufacturing the semiconductor structure as claimed in claim 1, further comprising:
  removing the first semiconductor material layers;
  forming a gate structure longitudinally oriented along the third direction and wrapping around the second semiconductor layers; and
  forming a gate spacer over a sidewall of the gate structure, wherein the gate spacer is in direct contact with the oxide layer in the third direction.

8. A semiconductor structure, comprising:
  a substrate;
  channel layers vertically stacked over the substrate in a first direction;
  a first dielectric fin structure formed at a first side of the channel layers and longitudinally oriented along a second direction different from the first direction;
  a second dielectric fin structure formed at a first side of the channel layers and longitudinally oriented along the second direction;
  a gate structure wrapping around the channel layers and longitudinally oriented along a third direction different from the first direction and the second direction;
  a source/drain structure attached to the channel layers and sandwiched between the first dielectric fin structure and the second dielectric fin structure; and
  a Si layer having a first portion sandwiched between the first dielectric fin structure and the source/drain structure and a second portion sandwiched between the second dielectric fin structure and the source/drain structure.

9. The semiconductor structure as claimed in claim 8, further comprising:
  a fin structure protruding from the substrate; and
  an insulating layer formed around the fin structure,
  wherein a bottom portion of the first dielectric fin structure is surrounded by the insulating layer.

10. The semiconductor structure as claimed in claim 9, wherein a top surface of the first dielectric fin structure is higher than a top surface of the insulating layer.

11. The semiconductor structure as claimed in claim 9, further comprising:
  a fin spacer formed over the insulating layer and sandwiched between the first dielectric fin structure and the source/drain structure in the third direction.

12. The semiconductor structure as claimed in claim 11, wherein a top surface of the first dielectric fin structure is higher than a top surface of the fin spacer.

13. The semiconductor structure as claimed in claim 12, wherein an air gap is enclosed by the fin spacer, the first dielectric fin structure, and the source/drain structure.

14. The semiconductor structure as claimed in claim 12, wherein the fin spacer comprises:
  a first spacer layer in direct contact with the fin structure and the first dielectric fin structure; and
  a second spacer layer formed over the first spacer layer and spaced apart from the source/drain structure and the first dielectric fin structure.

15. A semiconductor structure, comprising:
  first channel layers stacked along a first direction;
  second channel layers stacked along the first direction;
  a first source/drain structure attaching to the first channel layers;
  a second source/drain structure attaching to the second channel layers;
  a dielectric feature formed between the first source/drain structure and the second source/drain structure and extending along a second direction different from the first direction;
  a Si layer formed over the first source/drain structure; and
  a first contact formed over the first source/drain structure and in direct contact with the Si layer.

16. The semiconductor structure as claimed in claim 15, further comprising:
  a second contact formed over the second source/drain structure; and
  a contact etch stop layer formed over the first source/drain structure, the dielectric feature, and the second source/drain structure.

17. The semiconductor structure as claimed in claim 16, wherein the contact etch stop layer is in direct contact with the second source/drain structure and is separated from the first source/drain structure by the Si layer.

18. The semiconductor structure as claimed in claim 15, further comprising:
  an oxide layer covering a top surface of the Si layer,
  wherein the first contact has a sidewall in contact with the Si layer and the oxide layer.

19. The semiconductor structure as claimed in claim 18, further comprising:
  a Ge layer vertically sandwiched between the Si layer and the oxide layer.

20. The semiconductor structure as claimed in claim 18, wherein the oxide layer comprises Ge.

* * * * *